United States Patent [19]

Zanders et al.

[11] Patent Number: 5,544,063

[45] Date of Patent: Aug. 6, 1996

[54] DIGITAL CONTROLLER

[75] Inventors: Gary V. Zanders, Dallas; Francis A. Scherpenberg, Carrollton, both of Tex.

[73] Assignee: Dallas Semiconductor Corporation, Dallas, Tex.

[21] Appl. No.: 928,507

[22] Filed: Aug. 11, 1992

Related U.S. Application Data

[63] Continuation-in-part of Ser. No. 502,269, Mar. 30, 1990, Pat. No. 5,243,535, and Ser. No. 502,469, Mar. 30, 1990, Pat. No. 5,297,056, and Ser. No. 502,267, Mar. 30, 1990, Pat. No. 5,218,225.

[51] Int. Cl.$^6$ .................................................. G01R 27/00
[52] U.S. Cl. ........................... 364/482; 364/569; 364/481; 364/490
[58] Field of Search ..................... 364/569, 482, 364/481, 490; 371/16.3; 323/354

[56] References Cited

U.S. PATENT DOCUMENTS 5,233,613  8/1993  Allen et al. ............................. 371/16.3

*Primary Examiner*—Emanuel T. Voeltz
*Assistant Examiner*—Kamini Shah
*Attorney, Agent, or Firm*—Jenkens & Gilchrist

[57] ABSTRACT

A digital controller comprises a register containing control bits and (b) an input node coupled to the register, wherein a first signal at the input node changes a first pattern of the control bits into (i) a second pattern of the control bits when a time interval between the first signal and an immediately preceding second signal is greater than a first time interval or (ii) into a third pattern of the control bits differing from the second pattern when the time interval is less than a second time interval which is less than the first time interval. The register is electrically coupled to a counter, which counts at a variable rate. The control bits controls the variable rate at which the counter counts. A second signal may also selectably change the second pattern of control bits to be changed to a fourth pattern of control bits or the third pattern of control bits to be changed to the fourth pattern of control bits. The fourth pattern of control bits causes the counter to change the direction the counter is counting. The counter preferably varies a resistance of a resistor coupled between a power source and an output to control audio of an audio system and/or to control brightness of light emitted from a light source.

25 Claims, 41 Drawing Sheets

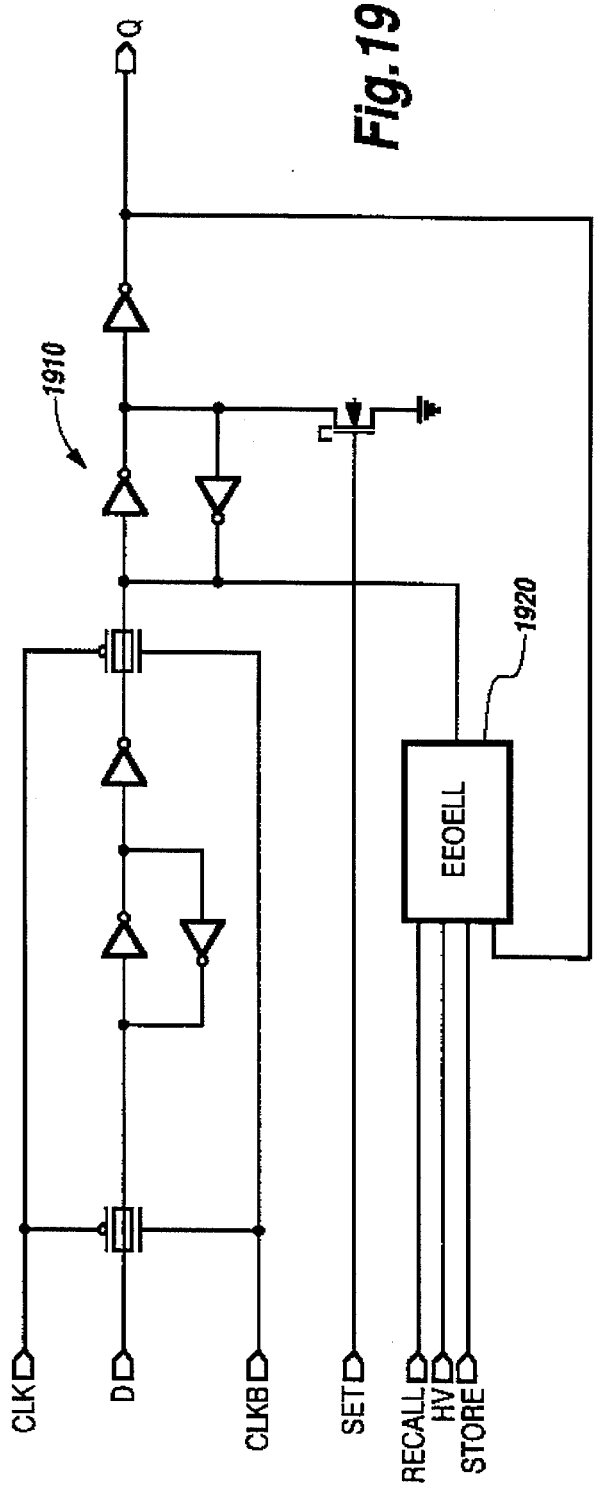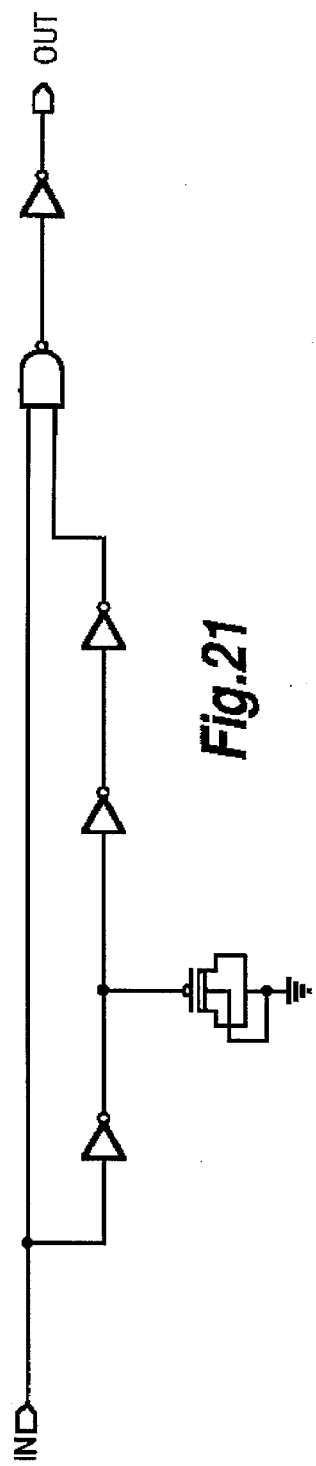

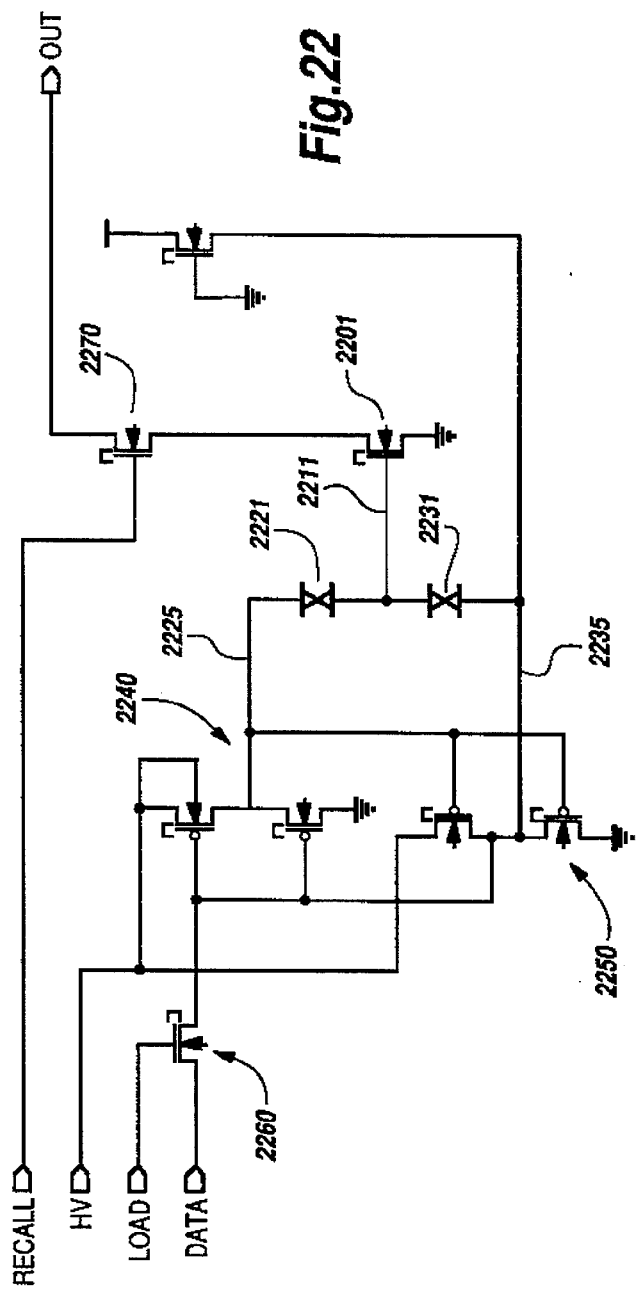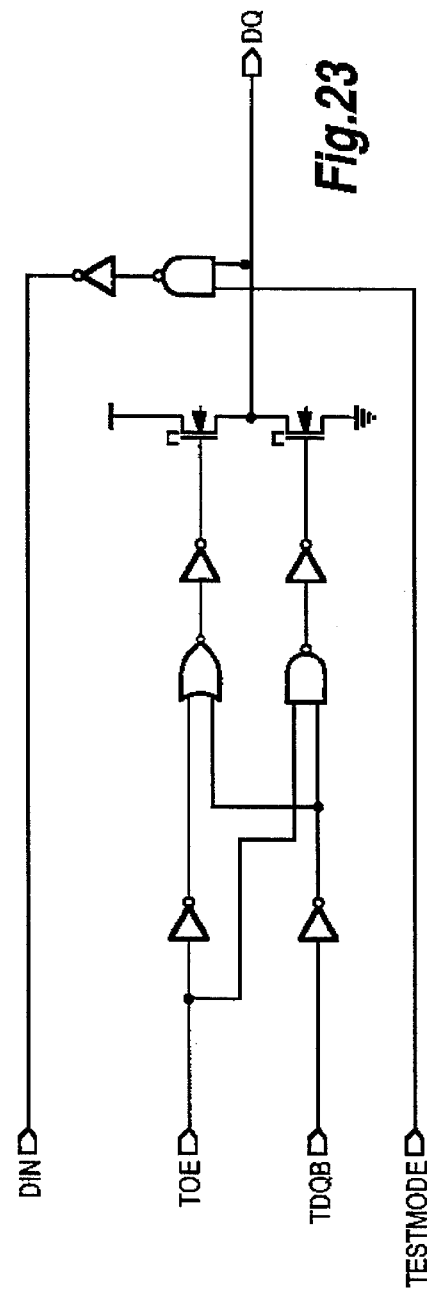

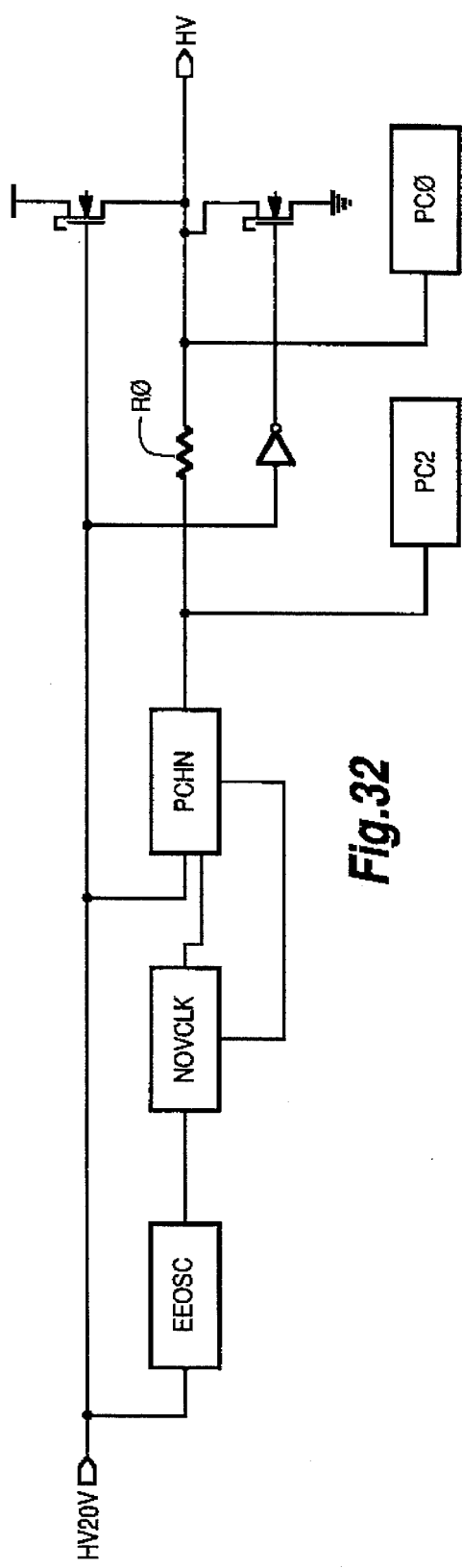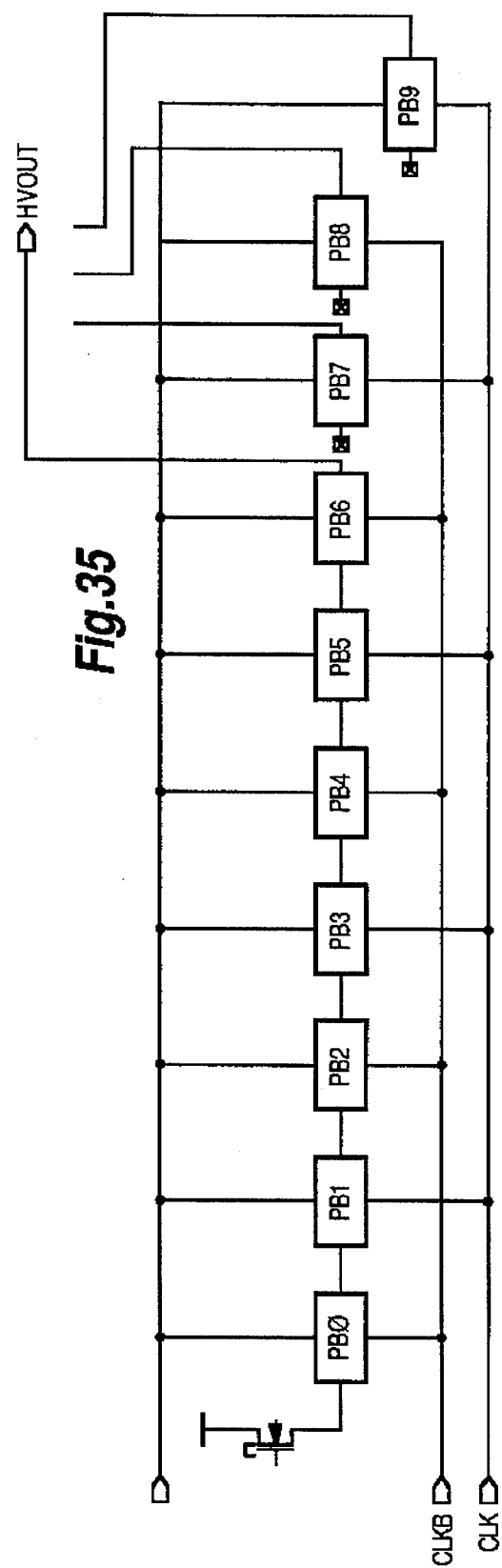

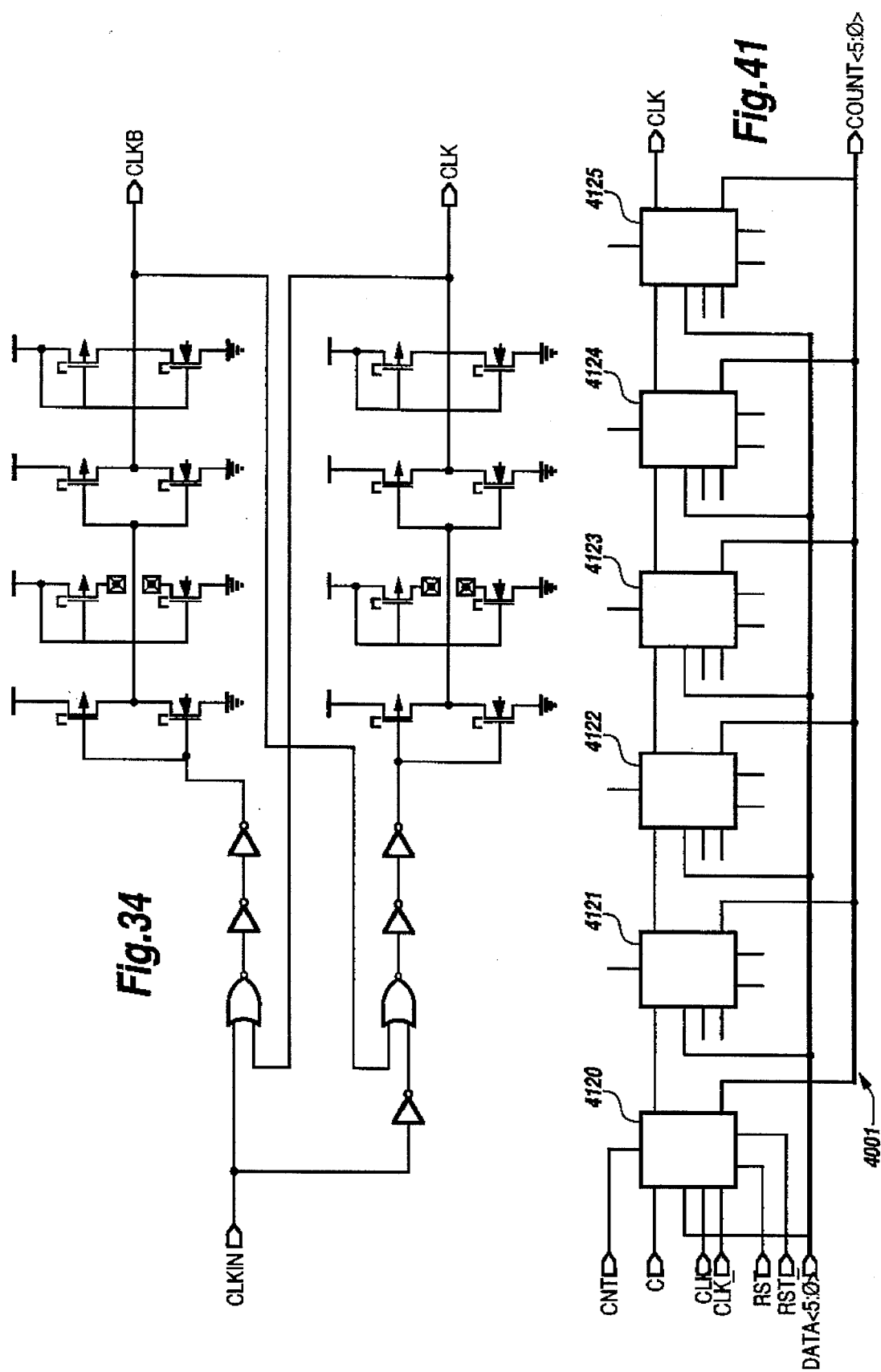

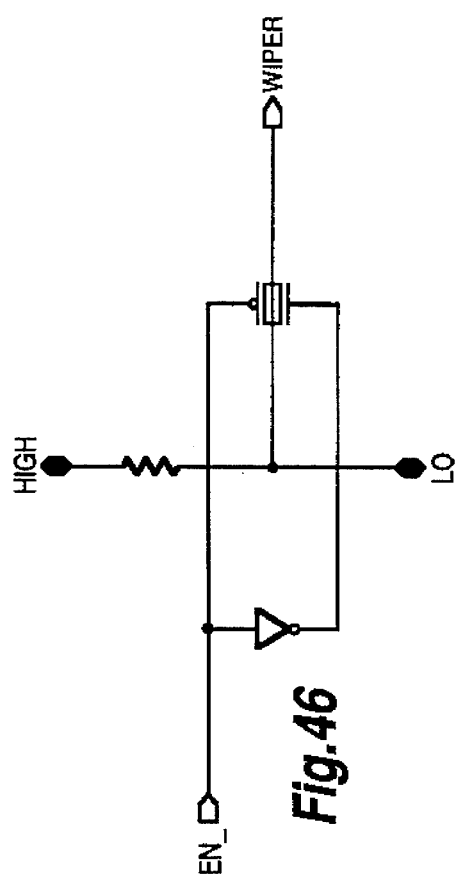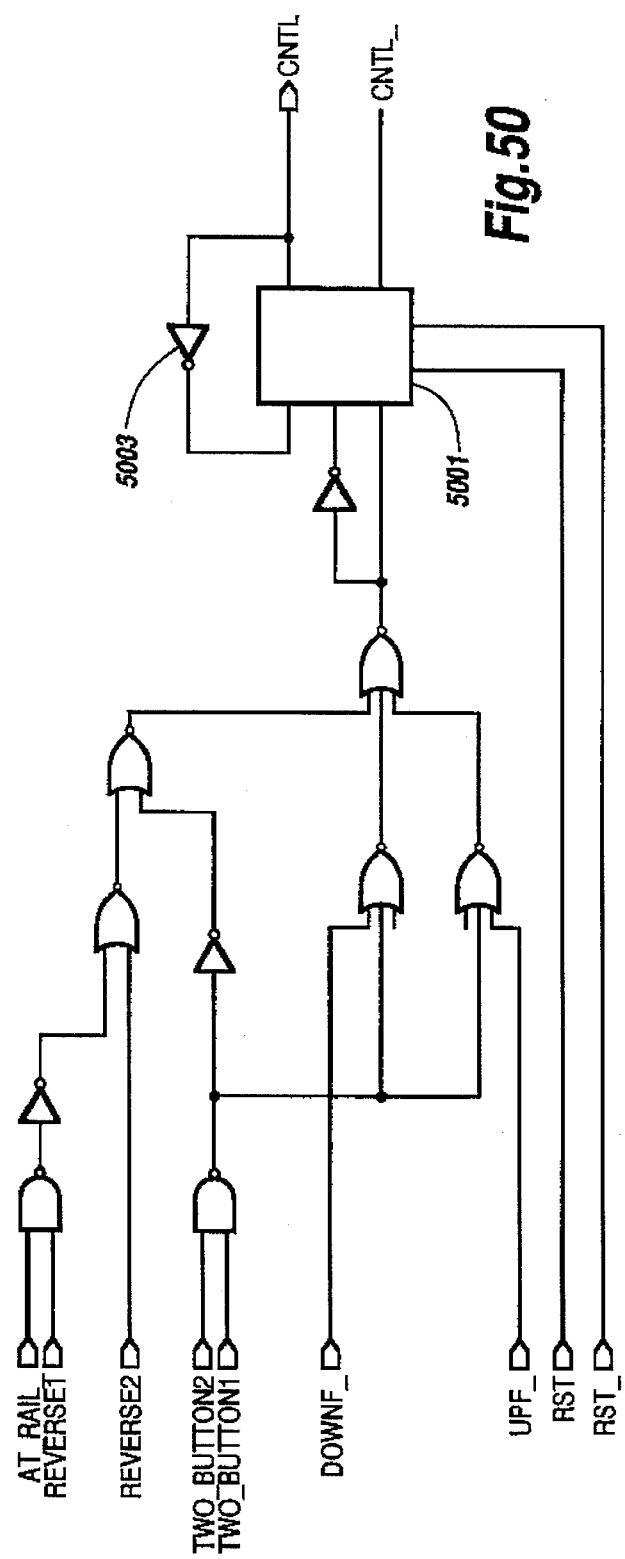
Fig.46
Fig.50

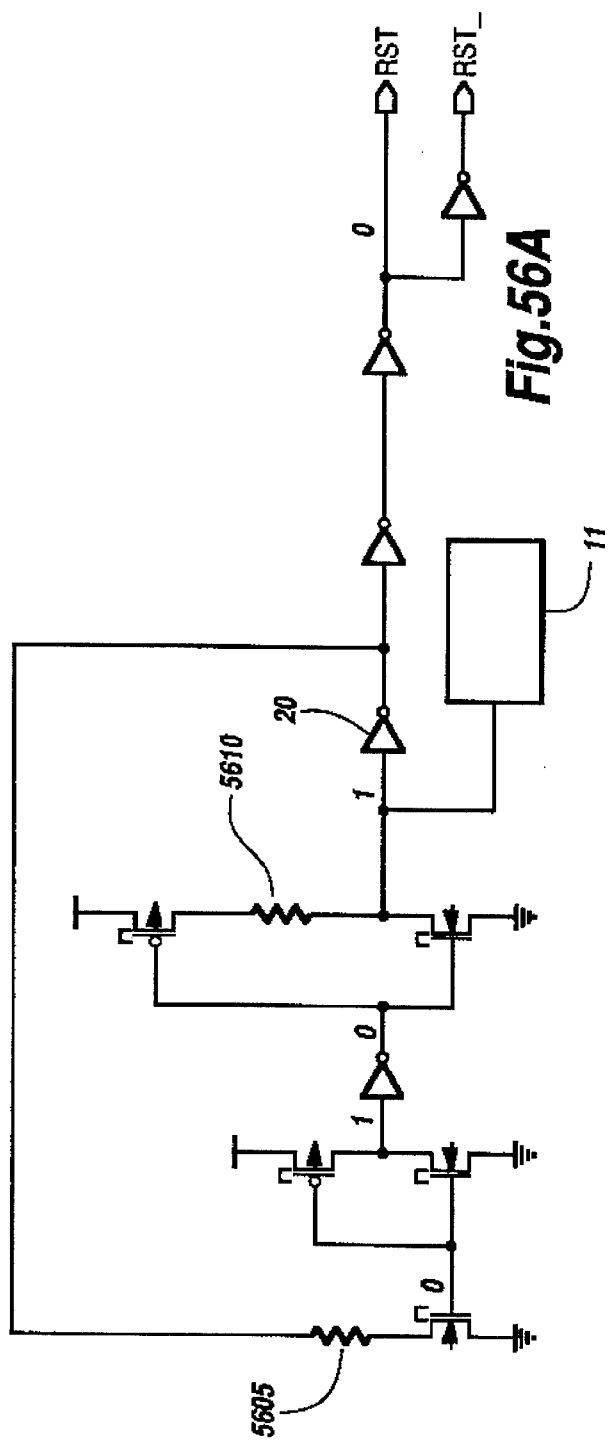
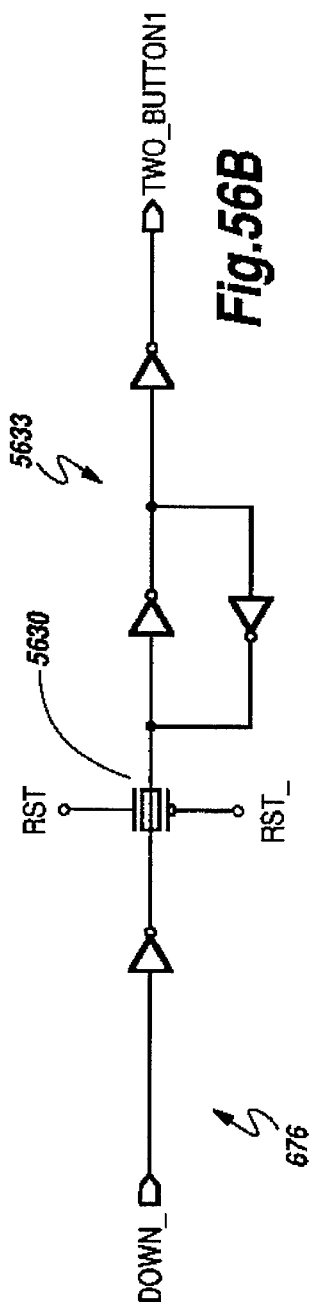
Fig. 56A
Fig. 56B

DIGITAL CONTROLLER

CROSS-REFERENCE TO RELATED APPLICATIONS

The present application is a continuation-in-part, claiming priority from each of the following U.S. applications, all of which are hereby incorporated by reference:

DSC-115: Ser. No. 502,269, Filed Mar. 30, 1990, U.S. Pat. No. 5,243,535, entitled "Digital Potentiometer with Stackable Configuration".

DSC-116: Ser. No. 502,469, Filed Mar. 30, 1990, U.S. Pat. No. 5,297,056, entitled "Directly-writable Digital Potentiometer".

DSC-190: Ser. No. 502,267, Filed Mar. 30, 1990, U.S. Pat. No. 5,218,225, entitled "Thin-film Resistor Layout".

PARTIAL WAIVER OF COPYRIGHT PURSUANT TO 1077 O.G. 22

All of the material in this patent application is subject to copyright protection under the copyright laws of the United States and of other countries. As of the first effective filing date of the present application, this material is protected as unpublished material.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

BACKGROUND AND SUMMARY OF THE INVENTION

The present invention relates to electronic devices, and particularly semiconductor potentiometers and systems incorporating such devices and methods of use.

Digital Potentiometers

Analog potentiometers have long been used to provide variable resistances in applications such as audio volume control and speaker balancing, light dimmer control, and CRT brightness control. Such potentiometers may take the form of a movable wiper which can traverse a wire wound resistor and short out a variable portion of the resistor. However, such mechanical devices are bulky and awkward to combine with integrated circuits on circuit boards.

Semiconductor digital potentiometers, such as the Dallas Semiconductor DS1267, provide a variable resistor with on the order of 100 different resistance levels by the use of a resistor string and selection of a particular tap on the resistor string controlled by a digital input. However, the input of digital words to adjust the resistance makes manual control inconvenient and time consuming as compared to an analog potentiometer.

One-Touch Control Architecture

According to the present invention, there is provided a control input, for effectuating an analog variation, which provides both increment and decrement operations from a single input (e.g., from a single button or a single touch contact plate). A certain pattern of input actuations will cause the direction of change to reverse. For example, when this control input is used as a volume control, a continuous input on the actuator, or a very rapid series of touches on the actuator, can cause the volume to increase; but a touch on the actuator, followed by a certain minimum duration, without actuation (for example, one-half second), followed by a continuous actuation or series of actuations, can cause the volume to decrease.

This control relationship can be advantageously applied to a wide variety of systems contexts, such as volume, tone, fade, and balance controls in audio systems; contrast and brightness controls in video display terminals; hue and tint controls in television receivers, and many others. This control relationship can be particularly useful with remote controls and automotive accessory controls, where space is at a premium and other demands will compete for operator attention.

After an actuation has been detected, a short time-out (e.g. of 10 milliseconds) is preferably imposed to temporarily block further detections. This avoids bounce problems.

Compact Control Module

The present application discloses a new control module architecture. A drop-in electronic replacement component includes both a digitally-controlled potentiometer (or variable resistance to ground. This component includes an integrated circuit variable resistor), and also includes the control logic which will increment or decrement the value of the variable resistance in accordance with touches received on a pushbutton (or other actuator). The control logic is preferably integrated on the same integrated circuit as the digital resistor.

The control logic implements full increment/decrement operation of the variable resistor with one control. The control logic will change from increment mode to decrement mode (and/or from decrement to increment mode) automatically, in accordance with the pattern of touches received by the actuator.

Preferably this part is not fully battery operated, but makes use of a system power supply input. Thus, this component provides a readily useable drop-in replacement, which system designers can use to replace a control knob or slider.

Systems Incorporating the Control Architecture

This control relationship can be advantageously applied to a wide variety of systems contexts, such as volume, tone, fade, and balance controls in audio systems; contrast and brightness controls in video display terminals; hue and tint controls in television receivers, and many others. This control relationship can be particularly useful with remote controls and automotive accessory controls, where space is at a premium and other demands will compete for operator attention.

The disclosed innovations can be particularly advantageous in consumer audio systems, where low-bandwidth user input is used intermittently for functions such as volume adjust, channel selection, equalization, source select, etc.

The disclosed innovations can be particularly advantageous in consumer video systems, where low-bandwidth user input is used intermittently for functions such as channel selection, volume adjust, color adjust, brightness adjust, etc.

The disclosed innovations can be particularly advantageous in dimmer controls for lighting systems. Switch design, for esthetics and durability, is often a constraint in such systems.

The disclosed innovations can be particularly advantageous in volume controls for telephone sets.

The disclosed control module can also be used to supply a control voltage to a voltage-controlled oscillator. This can be used advantageously in channel selection for systems which incorporate any type of tuner. Similarly, the output voltage can also be used for frequency synthesis, or for motor control.

Note that the presently preferred embodiment provides only a one-terminal variable resistance; i.e., a variable resistance with one terminal connected to ground. This is sufficient for the single control parameter which each such knob provides.

An advantage to this arrangement is that it can reduce or eliminate the use of nested control knobs, such as is commonly done in automotive stereos, where a user must select different control functions by pushing a knob inward or pulling it outward while rotating it to achieve the desired adjustment.

Trimming for Precision Applications

In the presently preferred embodiment, the transmission gate which selects the tap point in the resistor string will itself have a significant series resistance. Thus, while the incremental resistance is constant for each increment, the offset resistance means that the total resistance will not be exactly proportional to the tap setting. This is normally not a problem; but for some applications, stricter full-scale linearity may be desirable. Thus, in an alternative embodiment, trimming resistances may be added to equalize the offset resistance value. Alternatively, a user can use two commonly-controlled digital potentiometers with differential sensing circuits.

In a further alternative embodiment, additional EEPROM cells can be added to the design, if desired, and used to store trimming values.

Conventional Shadow RAMs

A technique which has long been familiar in the memory art is the use of shadow RAM. This is a technique where voaltile memory is used for the primary memory, and a nonvolatile memory is used to backup the volatile memory. In some versions of this technique, data will be rapidly copied over from volatile to nonvolatile memory when a power failure occurs. (Some local energy source, such as a battery or a large capacitor, can be used to ensure that sufficient energy for this copying process will be available at such times.) On power restoration, the data can be copied from the nonvolatile RAM back into the volatile RAM.

For example, in a computer memory module using nine 64K SRAMs for fast read and write operations, a bank of nine 64K EEPROMs might be used for shadow memory, and a battery provided for write to shadow RAM on power failure.

Control Memory

The present application discloses a control unit which includes a nonvolatile shadow RAM to locally store the current value of the control parameter when power goes down. To avoid unnecessary writes to the shadow RAM, a write is performed only when the control parameter is changed for the first time after power comes on or, thereafter, only if one or more of the three most significant control bits (MSB) are changed.

An advantage of the disclosed innovations is the combination of nonvolatility and long lifetime in a low-cost electronic control. EEPROM memories typically have a modest lifetime limit (e.g. $10^4$ to $10^5$) on the number of write cycles which can be performed. This would be an unacceptable limit on the total number of control setting changes which could be made during the lifetime of a control.

Use of Power-On Flip-flop

The presently preferred chip embodiment includes a flip-flop which comes up in a particular logic state at power-on. When the flip-flop is in this stage, any change will be stored. However, since even a large change will be received as a series of increments, the chip waits for a quiet period of 2 seconds before transferring the updated value into nonvolatile memory. As soon as such a transfer to nonvolatile memory is made, the state of the flip-flop is changed.

EEPROM Background

An EEPROM is a type of semiconductor memory which has been known for about two decades. The central part of a classic EEPROM cell is typically a floating-gate transistor, i.e. a MOS transistor which has two gates stacked on top of each other, so that the two gates are capacitively coupled to each other and to the channel. The lower gate is called a "floating" gate, because it is electrically isolated. By injecting charges into the floating gate, the effective threshold voltage of the MOS transistor (as seen from the upper gate) can be changed.

Hot Carrier Injection

To get charge into or out of the floating gate, two methods can be used. The most common method is to generate "hot" carriers, that is electrons or holes which have more energy than the minimum for a carrier. A sufficiently energetic hot carrier will pass through a thin dielectric layer. Hot carriers can be generated by flowing a current across a strong electric field. The drain profiles for the device can be shaped to produce such strong electric fields, as is well known to those skilled in the art of the semiconductor device fabrication. Thus, this version of EEPROM has a write mechanism which is closely analogous to that of a conventional FAMOS EEPROM. However, the EEPROM differs in its erase mechanism: the voltage on the floating gate of this type of EEPROM cell can not only be shifted to be more negative (by injecting electrons into it); it can also be shifted to be more positive (by injecting holes into it). This requires not only strong capacitive coupling between the floating gate and the control gate (so that the needed voltages can be developed between the control gate and the substrate), but also requires the ability to withstand the large voltage swings needed to provide a significant hole injection current.

Tunnelling

A slightly different EEPROM device structure uses tunneling rather than hot carrier injection. Tunnelling is a well known quantum-mechanical effect where a particle can travel through a potential barrier, with a probability which not only depends on the potential across the barrier, but also decreases exponentially with the thickness of the barrier.

Thus, for tunnelling-mode injection, the thickness of the dielectric barrier is critical. Such dielectric barriers are typically made thinner than a normal gate oxide, to enhance the tunnelling current. Tunnelling typically produces slower carrier injection to the floating gate, and may require higher applied voltages, but has the advantage that it is not necessary to provide large currents.

Problems

These EEPROM technologies have shared two common difficulties: the write and erase times tend to be slow, and the cells are likely to be worn out after only a relatively small number of write or erase cycles. Recent papers in the literature typically boast of 100,000 cycles or 1,000,000 cycles of endurance; this is an advance on the 10,000 read-write cycle lifetime which used by characteristic of EEPROM cells, but also falls very far short of the durability which would be expected of any modern SRAM or DRAM cell. A further, and more minor, disadvantage of EEPROM cells is their relatively large area.

Redundancy

EEPROMs, like other commodity memories, have increasingly been manufactured with redundancy. Various designs have used row redundancy, column redundancy, or both. In addition, there has even been some study given to the idea of in-service replacement of worn out EEPROM cells. For example, U.S. Pat. No. 4,733,394 to Giebel discusses the use of a microprocessor-controlled system, which would periodically survey the state of cells in an EEPROM memory, and code out the defective cells with redundant cells. However, the present invention, by providing automatic rotation or replacement of EEPROM cells, provides a cheaper and simpler local solution which does not require high level software supervision.

In one embodiment of the present invention, an extra bit at the end of each row is used to indicate whether the row is active. The cell selection logic accesses the row (or the highest-numbered row) having a "one" written into the cell at the end of that row.

In a first class of embodiments of the invention, the active row is periodically rotated among the available rows, to spread the wear over all of the rows evenly.

In a second embodiment of the invention, each write cycle is implemented as a read-write-read operation, to determine when each cell has been fully programmed. (Such operations are commonly used in EPROM and EEPROM cells, because the write times can be relatively long, and highly dependent on variations in temperature and supply voltage.) If a cell is found not to have been written within a certain number of iterations, then that row is declared bad, and the next row is used.

EEPROM Array Architecture

The present invention provides an architecture which facilitates use of EEPROM cells for many applications where they have not hitherto been practical. According to the present invention, EEPROM cell arrays are provided with more than 100% redundancy. In service, a cell which has begun to wear out is replaced with another cell. This is particularly advantageous for applications where only a relatively small number of bits of memory is needed. In many control applications, the availability of even a few dozen or few hundred bits of memory can be very advantageous. For example, even a very small commercial EEPROM memory will typically contain 16K bits or more. This is configured with 4 to 1 redundancy, as in the presently preferred embodiment, this memory space can be used as a 4K memory with a much longer lifetime. Naturally, this use of memory cells means that the cost per bit is higher, but for many applications the lifetime limitations of conventional EEPROM technology are simply unacceptable.

Partial Summary of Disclosed Innovations

Among the inventions disclosed in the present application is: An electronic subsystem, comprising: a voltage input terminal, for receiving a system power supply, and a voltage output terminal, connected to provide a control voltage as output; an integrated circuit potentiometer, comprising a first terminal thereof connected to ground, a second terminal thereof connected to said voltage input terminal, a resistor ladder connected between said first and second terminals, and a wiper terminal connected to said voltage output terminal, and connected to a selectable intermediate point of said resistor ladder; exactly one externally-accessible input receptor, dimensioned to be actuated by contact with a user's fingertip; and control logic, integrated with said resistor string, configured and connected to selectably increment and decrement the position of said intermediate point on said resistor string in accordance with actuations of said input receptor.

Among the inventions disclosed in the present application is an electronic subsystem, comprising: a voltage input terminal, for receiving an unpredictable AC input voltage, and a voltage output terminal, connected to provide an AC output voltage which is proportional to said input voltage; an integrated circuit potentiometer, comprising a first terminal thereof connected to ground, a second terminal thereof connected to said voltage input terminal, a resistor ladder connected between said first and second terminals, and a wiper terminal connected to said voltage output terminal, and connected to a selectable intermediate point of said resistor ladder; exactly one externally-accessible input receptor, dimensioned to be actuated by contact with a user's fingertip; and control logic, integrated with said resistor string, configured and connected to selectably increment and decrement the position of said intermediate point on said resistor string in accordance with actuations of said input receptor.

BRIEF DESCRIPTION OF THE DRAWINGS

The present invention will be described with reference to the accompanying drawings, which show important sample embodiments of the invention and which are incorporated in the specification hereof by reference, wherein:

FIGS. 11–19, 20A, 20B and 21–23 are further schematic circuit diagrams for blocks of FIG. 6;

FIGS. 31–36 are further schematic circuit diagrams for blocks of FIG. 6;

FIGS. 38–56A and 56B are further schematic circuit diagrams for blocks of FIG. 6.

DESCRIPTION OF THE PREFERRED EMBODIMENTS

Overview of Architecture

Figure 1:
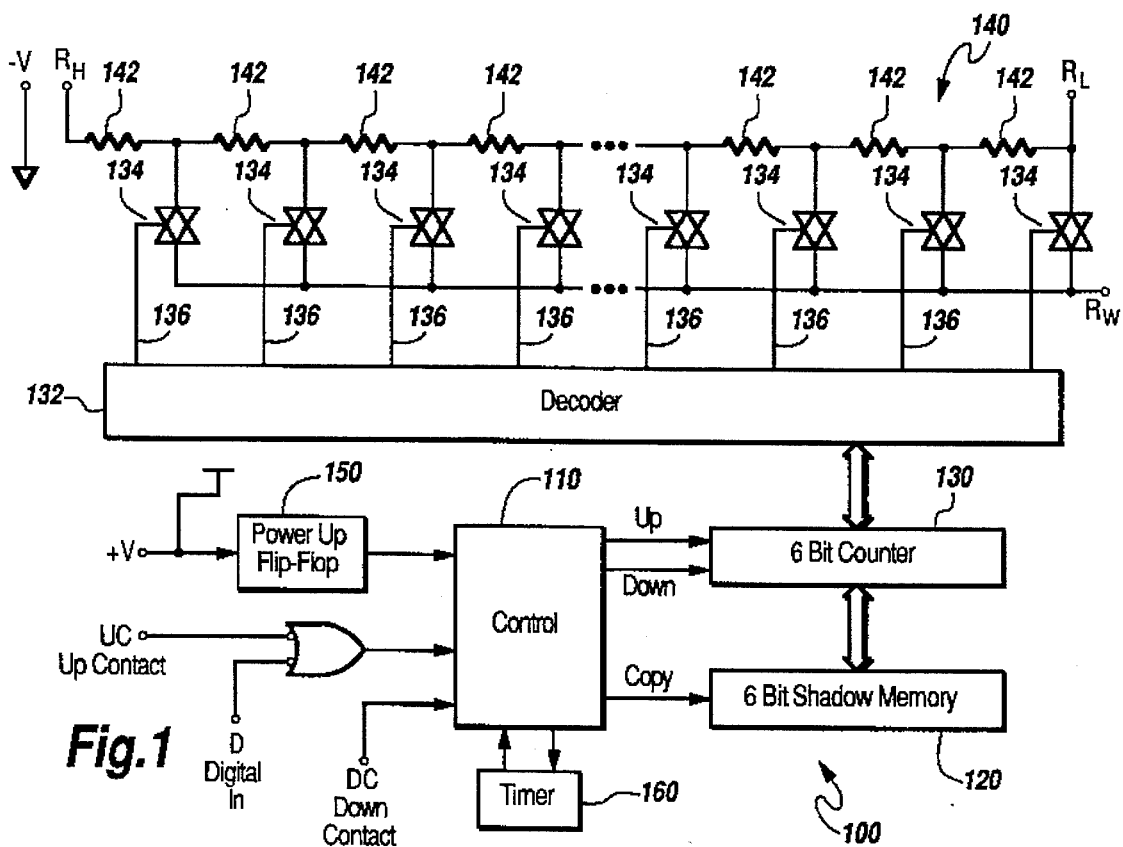
FIG. 1 shows in schematic block format the overall architecture of a first preferred embodiment control unit.

FIG. 1 shows in block form the overall circuit architecture of the first preferred embodiment control unit, generally denoted by reference numeral 100. Control unit 100 takes the form of an integrated circuit with terminals $R_H$ (resistor high end), $R_L$ (resistor low end), $R_W$ (resistor wiper), +V and −V (power supply voltage inputs), UC (up contact input), D (digital input), and DC (down contact input). Tapped resistor string 140 provides a voltage output, at wiper output terminal $R_W$, which can be selected to fall at any one of many points between the voltage applied at "high" terminal $R_H$ and "low" terminal $R_L$. (It is not actually necessary for the polarity of the applied voltage to be higher at $R_H$ than at $R_L$; this relationship could be reversed if desired. However, the following description assumes that this is the case, so that an increase in the value stored in counter 130 will correspond to an increase in the voltage at output terminal $R_W$.) In other words, the resistance between output $R_W$ and $R_L$ or $R_H$ varies as the value stored in counter 130 varies. In the presently preferred embodiment, resistor string 140 is tapped at sixty-four separate points along its length. However, it is contemplated that for future versions it may well be preferable to use 128 or 256 tap points. Each of the sixty-four resistors 142 has a resistance which depends upon the total resistance from $R_L$ to $R_H$. For example, if the total resistance were 10K, then each resistor 142 would have a resistance of about 156 ohms, and this would be the resolution of control unit 100. Similarly, if there were 256 tap points for a 100K total resistance, then the resolution would be 390 ohms.

Counter 130 is a 6-bit up/down counter; however, if more tap points are provided on the resistor string, the number of bits in the counter would of course need to be increased accordingly. The manner in which the value in this counter is set and changed will be discussed in detail below.

A decoder 132 drives one of sixty-four output lines 136 active, following the state of the counter 130. (Of course, in practice, the decoder and counter circuitry would probably be merged.) These sixty-four outputs are each connected to drive a transmission gate 134.

The presently preferred embodiment is actually configured in two alternative versions. One version uses CMOS transmission gate 134 with an inverter in the branch of line 136 to the PMOS device, and the other version replaces these CMOS gates with NMOS gates only. The advantage of using NMOS only is that higher voltages on the voltage input line are not as likely to cause forward-biasing and latchup.

Thus, only one of the gates 134 will be turned on at a given instant, and the state of the counter 130 determines which gate that will be. Whichever one of the gates 134 is currently active will connect a respective tap point in resistor string 140 to "wiper" output terminal $R_W$. Thus, the value stored in counter 130 will determine the value of the resistance seen between $R_W$ and $R_H$ (and between $R_W$ and $R_L$).

Counter 130 is also connected, by a bidirectional parallel data interface, to nonvolatile shadow memory 120. In the presently preferred embodiment, shadow memory 120 uses EEPROM cells, together with a charge pumping circuit which generates the high voltage (about 20 V, in the presently preferred embodiment) needed for programming the nonvolatile memory. Because of the need to handle high voltages, this nonvolatile memory is preferably segregated on a separate area of the chip from the other elements shown in FIG. 1.

In the presently preferred embodiment, a high-voltage process which provides both low and high voltage devices is used for fabrication of the control unit as an integrated circuit. This process generally has 3 micron minimum spacings, but also has 1.2 micron minimum gate length.

To detect the initial application of power, a conventional power-on-reset circuit can be used. Alternatively, a power-up flip-flop, which is configured to always come up in a "set" state upon power-up, can be used, but the exact configuration is not at all critical.)

Control logic 110 is connected to detect closures of the contact UC, and is also connected to receive the logic output of the flip-flop 150. As closures are detected, the control logic provides increment or decrement signals to the counter 130, as described below. This is a clocked counter, in the presently preferred embodiment. External contact UC is preferably connected as one of the top-mounted contacts in the preferred package of FIG. 3. A high-impedance pull-up holds a logic-high voltage on this contact, until it is shorted to ground by fingertip contact or by button closure.

The control logic 110 can also command a parallel transfer of data from the shadow memory 120 to the counter 130. This is done at power-up, to restore control unit 100 to its previous setting.

The control logic 110 can also command a parallel transfer of data from the counter 130 to the shadow memory 120. This is done only under two conditions: 1) for the first change made after a power-up; or 2) at other times when the change made is large enough that the value in counter 130 differs from the stored value by more than a minimum threshold amount. In the presently preferred embodiment, the updated value is stored into shadow memory 120 only if it requires a change to one of the three higher-order bits in 6-bit counter 130. Alternatively, a subtraction and digital compare operation can be used to determine whether the degree of change exceeds a predetermined threshold difference.

Control logic 110 is also connected to detect the state of flip-flop 150. Whenever control logic 110 writes a value newly changed after power-up into shadow memory 120, it also clears flip-flop 150.

Figure 2:
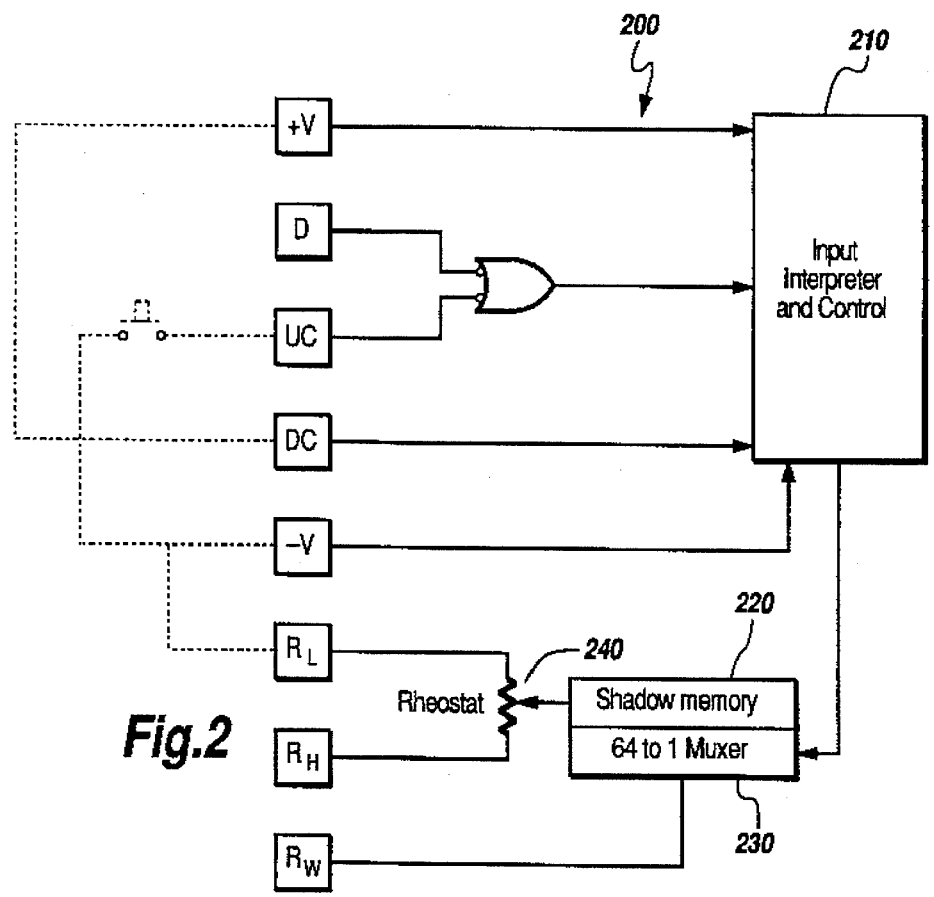
FIGS. 2, 3A, 3B and 3C show a first preferred embodiment and packaging with internal connections to provide one button operation.
Figure 3A:
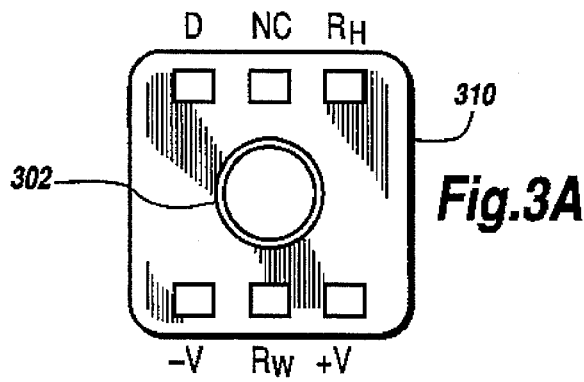
Figure 3B:
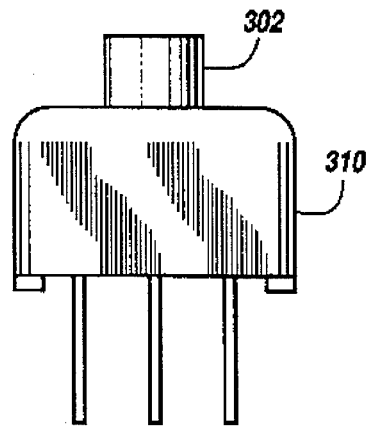
Figure 3C:
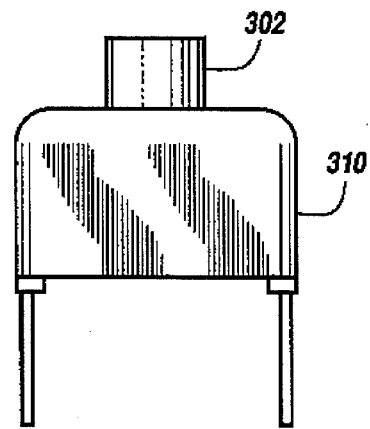

FIG. 2 shows the same elements as FIG. 1 but redrawn and consolidated for simplicity; note that the resistor string and taps appear as rheostat 240 and the counter subsides within multiplexer 230. With internal connections and a pushbutton corresponding to the broken lines in FIG. 2, the control unit can be packaged as illustrated in FIGS. 3A, 3B and 3C with only six projecting pins plus the pushbutton. This version of the control unit with the internal connections is referred to as control unit 200. Without the internal connections, control unit 100 would be packaged in a standard eight or 16-pin package.

Overview of Operation

Figure 4:
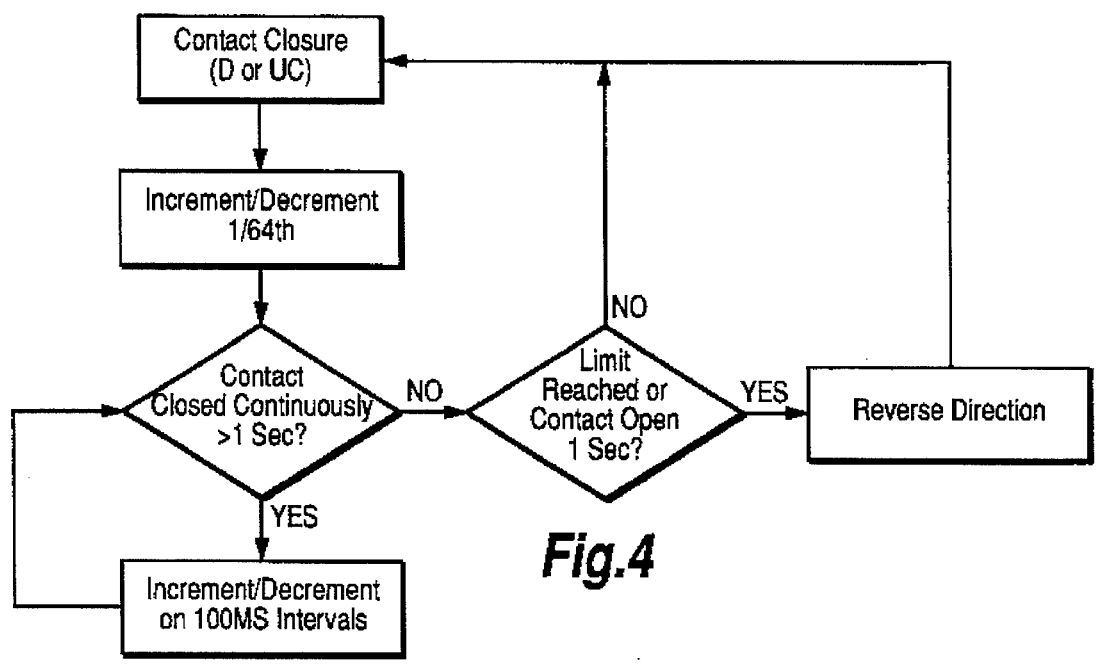
FIGS. 4–5 are flow diagrams for one button and two button operation.

FIG. 4 is a flowchart for the operation of control unit 200 which has terminal DC connected to +V and a pushbutton between UC and −V. In particular, a low going pulse of duration at least 1 millisecond input at either of terminals D or UC ("Contact closure" in the upper lefthand portion of FIG. 4) results in an increment or decrement by 1 of the value held in counter 130 and a consequent change in the resistance between terminals $R_W$ and −V ($R_L$) by one resistor 142 resistance. Note that each of the terminals D, UC, and DC is pulled up to the internal power supply (+V which is about +5 volts) by 100 Kohm resistors (see FIG. 6 described in the following section). Subsequent input low going pulses will increment or decrement for each pulse. However, if the input rmains active (low) for greater than 1 second, then increments or decrements will be automatically generated at intervals of 100 msec for as long as the input is active or until an end of the resistor string is reached; see the bottom lefthand portion of FIG. 4. Anytime that input activity stops for a period of time greater than 1 second, the direction of change will be reversed; that is, if a series of increments have been input followed by a 1 second pause, then the next input pulse will yield a decrement. The direction also reverses when an end of the resistor string is reached. See the righthand portion of FIG. 4. The total time to move from one end to the other end of the resistor string by holding an input continuously active is about 7.4 seconds: 1 second to begin automatic generation plus 6.4 seconds for 64 intervals of 100 msec each.

Figure 5:
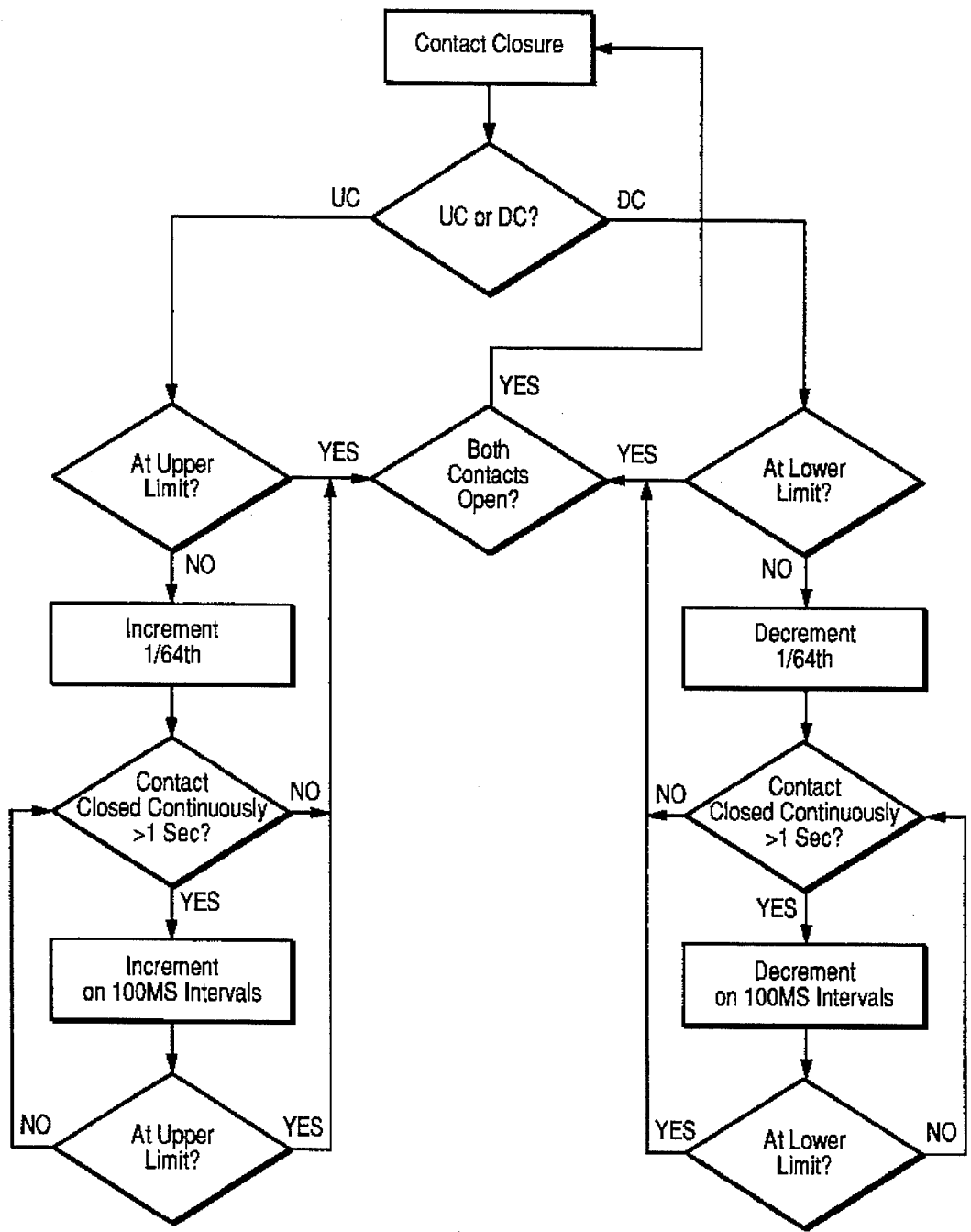

Control unit 100 has both one-button and two-button operation possible: making connections as shown by the broken lines of FIG. 2 essentially forms a control unit 200 with one-button operation as just described. Alternatively, separate inputs to UC and DC will be sensed and an input to UC will always increment the counter and an input to DC will always decrement; this is two-button operation. FIG. 5 shows the flow for two-button operation. Control unit 100 senses the impedance between DC and +V upon power up and determines the mode of operation.

Connection between either the UC or the DC terminal and the −V terminal with a resistance of less than 10 Kohms will be interpreted as a low input. A low going pulse at the D terminal needs to go below about 0.8 volt relative to the −V terminal voltage (i.e., TTL levels relative to −V) and pulses as short as 1 microsecond at the D terminal will be recognized.

Nonvolatile Wiper Settings

The wiper setting of control units 100 or 200 is maintained in shadow memory 120 or 220 when the control unit is powered down. During normal operation the position of the wiper is determined by decoder 130 or multiplexer 230. Shadow memory 120 or 220 is periodically updated by the multiplexer during normal operation. The manner in which an update occurs has been optimized for reliability, durability, and performance and is totally transparent to the user. When power is applied to a control unit the wiper setting is set at the last value recorded in the shadow memory. On an initial power up for the first time, the wiper position may, therefore, be random. If the control unit setting is changed after power is applied, the new value will be stored in the shadow memory after a delay of about two seconds. The initial storing of a new value after power up always occurs if a change is made and this change is not related to time. After the initial change, subsequent changes in the control unit setting of less than 12.5% are not copied in the shadow memory. Since the control unit contains a 64 to 1 multiplexer, a change in the 3 LSBs is not copied into the shadow memory except for change after power up or if the change is large enough to effect the 4th LSB or greater. Changes greater than 12.5% are always copied into the shadow memory. As on power up, the copy from the multiplexer to shadow memory allows for a two second delay to guarantee that the new setting changes are finalized, and all shadow updates are transparent to the user. On power down (loss of power) the shadow memory is not changed and retains the most recent update resulting from a setting change. This value is used to set the control unit counter value on power up. The shadow memory is made with EEPROM type memory cells that will accept at least 20,000 writes before wear out. If the EEPROM cells ever reach a wearout condition, the control unit will still continue to operate properly while power is applied, but will return to the last accepted value of the shadow memory on power up.

Test Mode

Application of 8–10 volts to the D input terminal triggers test mode of operation in which a test clock may be fed into the wiper output terminal $R_W$ and this test clock will clock in test bits from the high output terminal $R_H$ into a test register and then run tests.

Block Diagram

Figure 6:
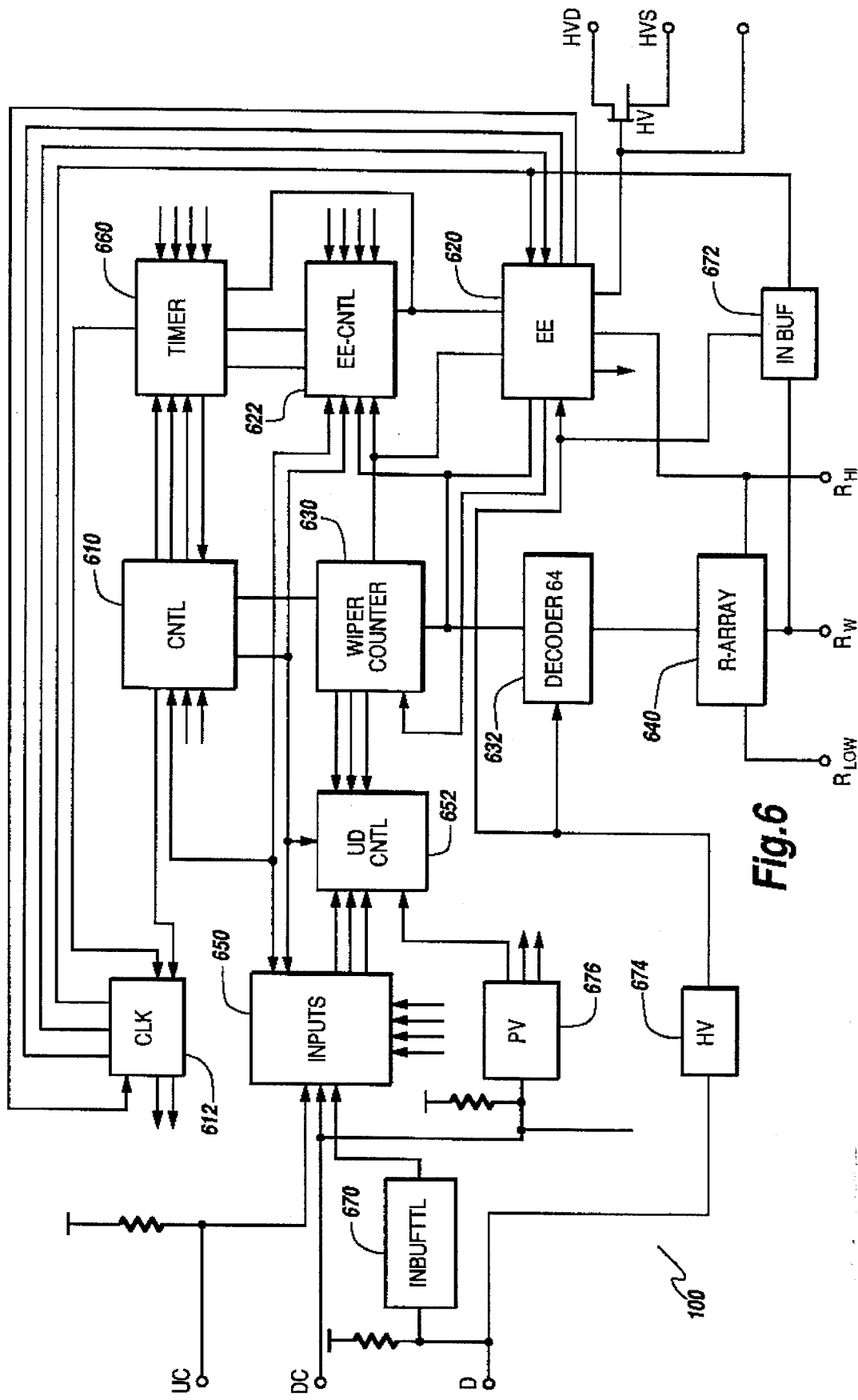
FIG. 6 is a functional block diagram of the first preferred embodiment.

FIG. 6 shows in functional block format control unit 100 of FIG. 1, and FIGS. 7–56 provide details of circuitry within the blocks. In particular, FIG. 6 illustrates control unit 100 as composed of the following blocks: control logic CNTL 610 (FIGS. 7–10 including state diagrams), clock CLK 612 (FIGS. 11–12), shadow memory EE 620 (FIGS. 13–38), shadow memory control EE_CNTL 622 (FIG. 39), counter WIPER_COUNTER 630 (FIGS. 40–43), counter decoder DECODER64 632 (FIG. 44), resistor array R_ARRAY 640 (FIGS. 45–46), input logic INPUTS 650 (FIGS. 47–49), up/down counter UD_CNTL 652 (FIG. 50), timer TIMER 660 (FIGS. 51–52), TTL input buffer INBUFTTL 670 (FIG. 53), test mode buffer IN_BUF 672 (FIG. 54), test mode detector HV 674 (FIG. 55), and power up reset circuitry PU 676 (FIGS. 56A and 56B), plus terminals UC (up count), DC (down count), D (data), R_ low (resistor string low end $R_L$), Rw (resistor string wiper $R_W$), R_hi (resistor string high end $R_H$), V+, and V−. Terminals HVD and HVS connect to the drain and source of high voltage FET with gate driven by the HV output of block EE 620 and used for testing the high voltage generator.

Control Logic

Figure 7:
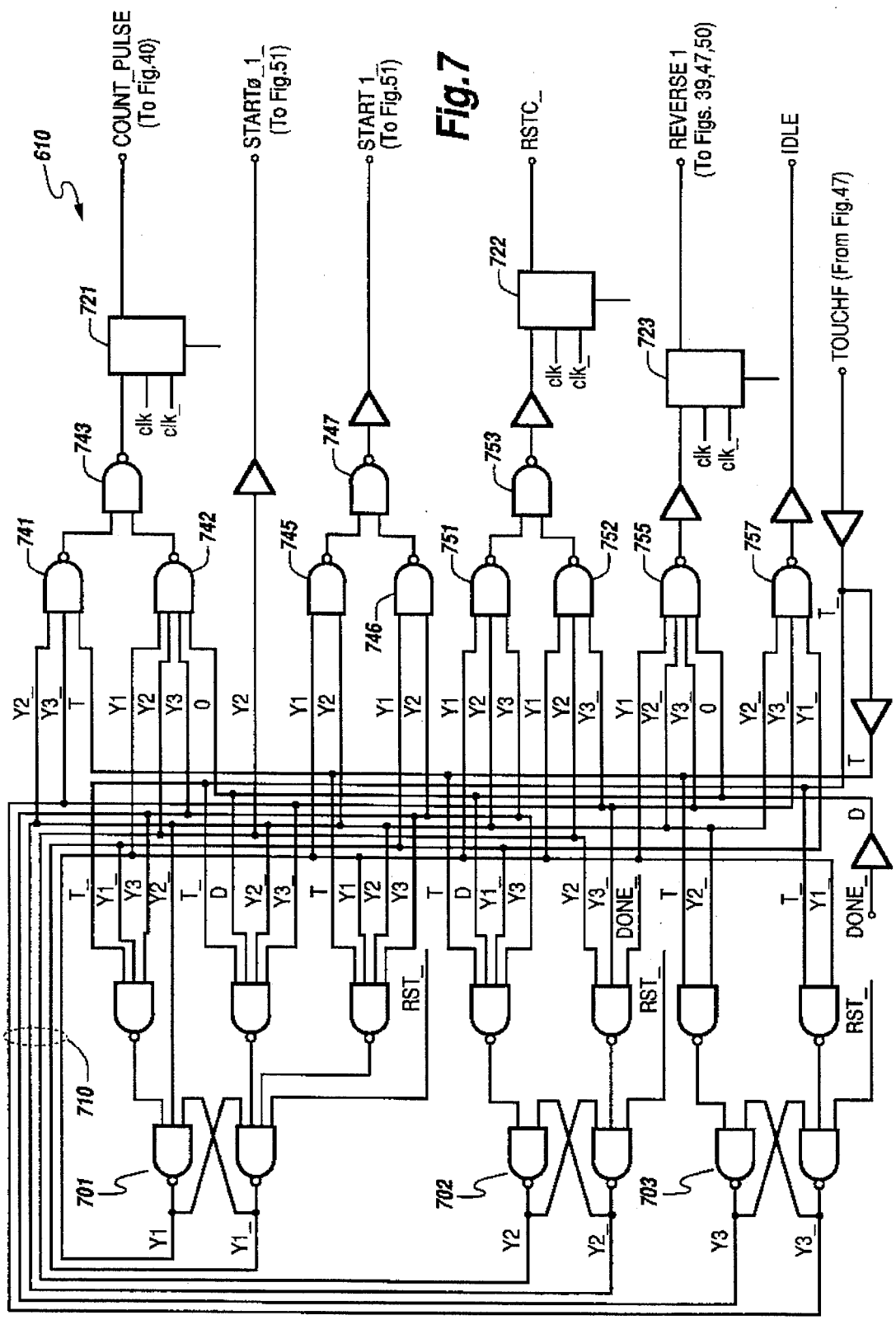
FIGS. 7–8 are schematic circuit diagrams for a block of FIG. 6.

FIG. 7 shows control logic CNTL 610 as a state machine with three latches 701–703 (each latch made of cross-coupled NAND gates) with six feedback lines 710 plus three input lines 711–713. The six feedback lines are labelled with the corresponding latch output (Y1, Y1_, Y2, Y2_, Y3, and Y3_) and the three input lines are labelled D (an inversion of the DONE_ input) and T and T_ (the TOUCHF input and its complement). Also, DONE_ directly feeds one of the NAND gates which drive latch 702. Note that a trailing underscore ("_") generally denotes the complement of a signal, so Y1_ is the complement of Y1. Six logical combinations of the nine lines generate the COUNT_ PULSE, START0_1_, START1_, RSTC_, REVERSE1, and IDLE outputs. A power up reset (RST and RST_) will directly drive the latches 701–703 to Y1_, Y2_, and Y3_ all high and also drive D low (see FIG. 16a for DONE_) and T low (see FIG. 47). Thus a power up reset puts the state machine in the 000 state where the notation represents the values of Y1,Y2,Y3 with 1 indicating high and 0 low; the reset also sets D and T low and T_ high. And the outputs are then COUNT_PULSE low, START0_1_ and START1_ both high, RSTC_ high, REVERSE1 low, and IDLE high. Each combination of the DONE_ and TOUCHF signals determines the transitions among the eight states of the state machine as follows:

```
DONE_=1, TOUCHF = 0:000 and 100 are stable
                    010→100
                    001→101→100
                    011→111→110→100
DONE_=1, TOUCHF = 1 001 and 111 are stable
                    000→001
                    011→111
                    110, 010→100→101→001
DONE_=0, TOUCHF = 0 000 and 110 are stable
                    010→110
                    001→101→100→000
                    011→111→110
DONE_=0, TOUCHF = 1 111 and 110 are stable
                    000→001→011→111
                    100→101→001→011→111
                    010→110
```

Figure 8:
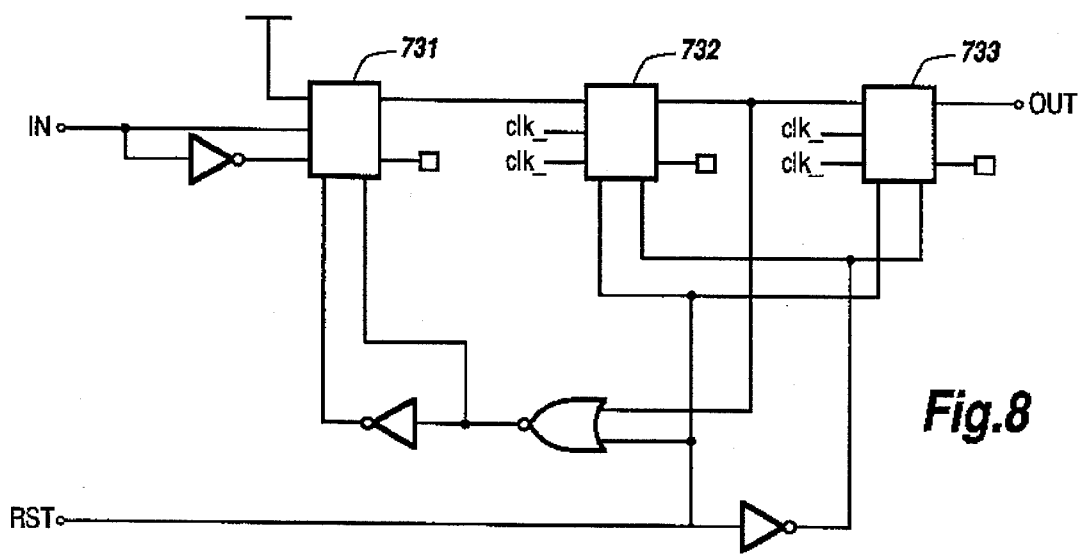

Note that a transition takes about 2–5 nsec and thus various short pulses may be generated within the logic generating the outputs COUNT_PULSE, START0_1_, START1_, RSTC_, REVERSE1, and IDLE. In particular, FIG. 8 shows the structure of each of the pulse generators 721–723 as three flip-flops 731–733 with a feedback from flip-flop 732 to the reset input of flip-flop 731. A low-to-high transition at the IN node sets flip-flop 731 high and drives the OUT node high two CLK cycles later and also resets flip-flop 731 low. The high at OUT persists for one CLK cycle, and flip-flop 731 remains low until the next low-to-high at IN. A short high pulse (e.g., 2–5 nsec) at IN suffices to set flip-flop 731 high and thereby generate the one CLK cycle high pulse at OUT when CLK is active.

Figure 9:
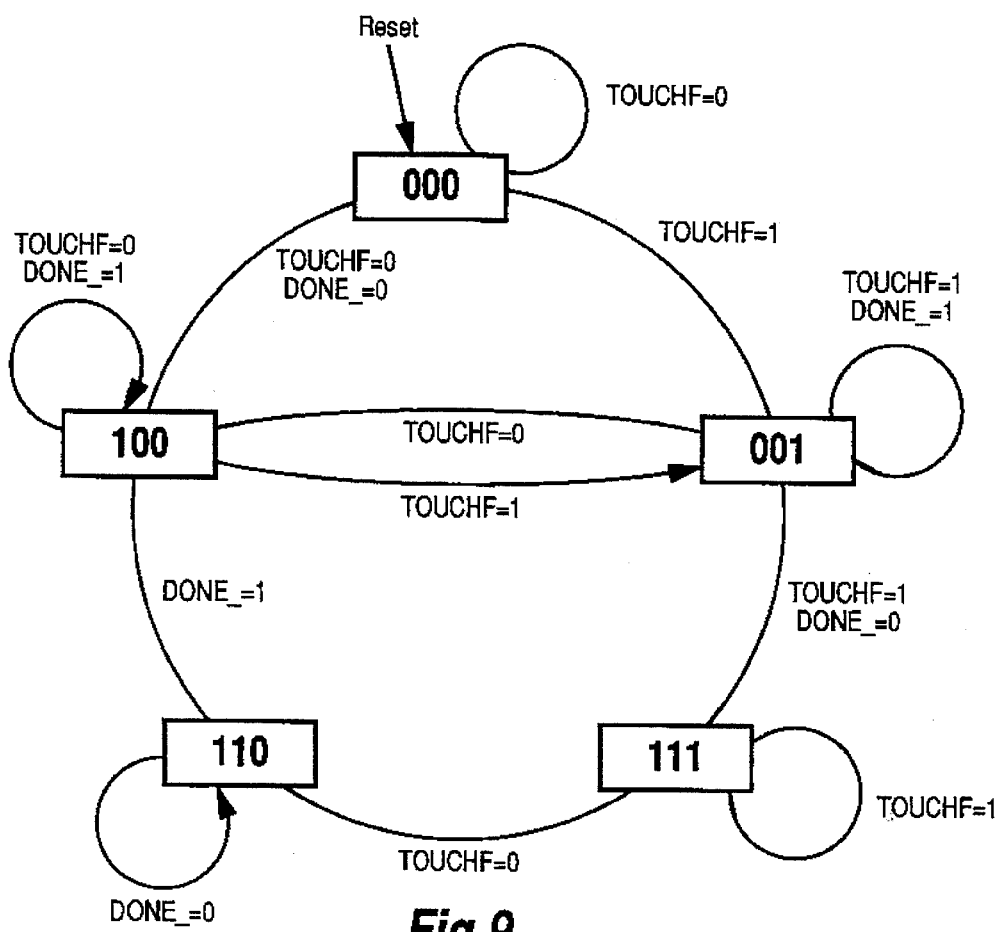
FIGS. 9–10 are state diagrams of operation.

As detailed below, the UC, DC, and D inputs drive TOUCHF; and DONE_ goes low (active) for one CLK cycle when a selected time interval completes and the selection signal (e.g., START1_) remains active. FIG. 9 is a state diagram showing DONE_ and TOUCHF driving the state changes and essentially distills out the stable states from the foregoing list of state transitions.

Figure 10:
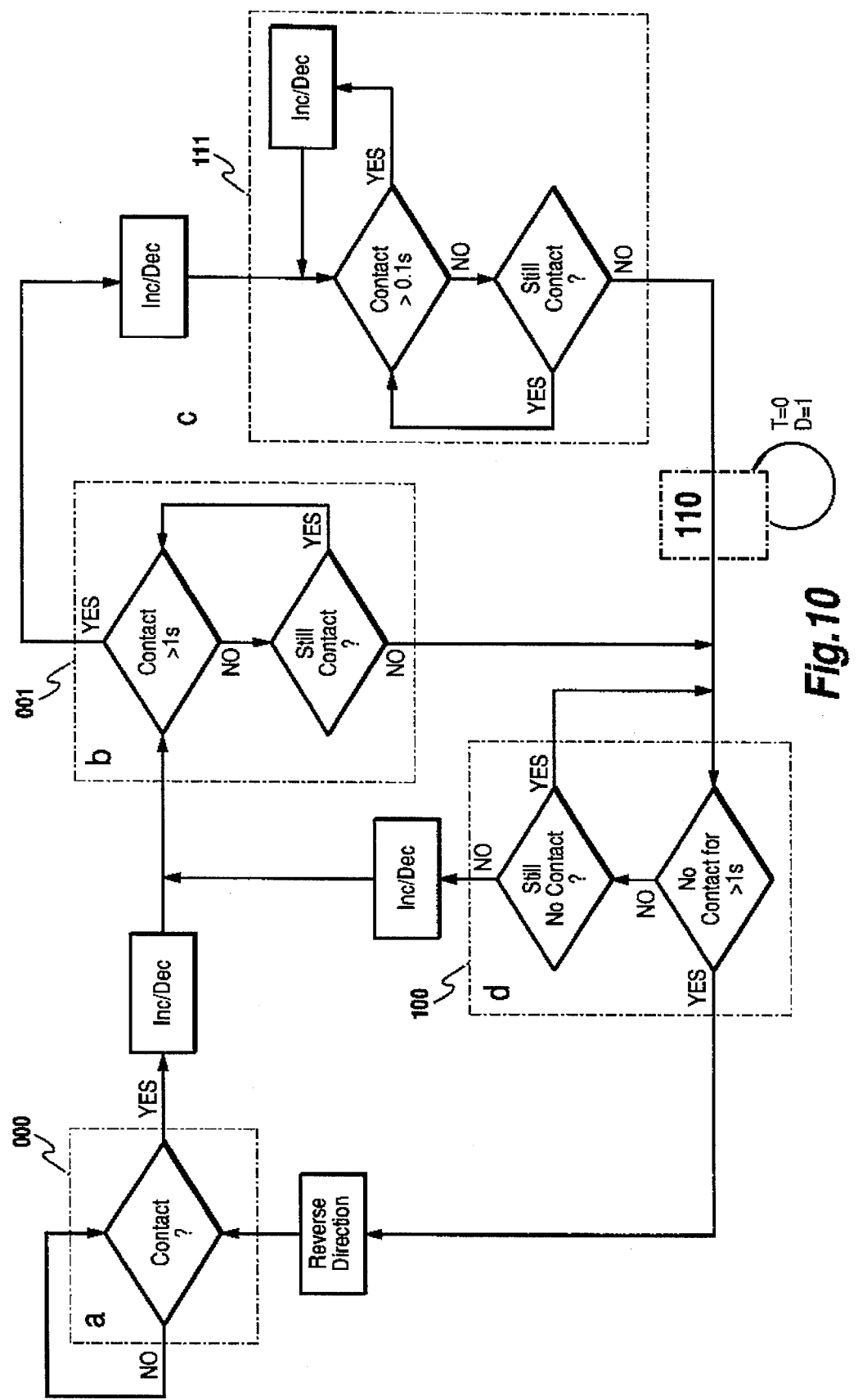

FIG. 10 provides an alternative format state diagram which indicates the actions taking place in control unit 100. Control unit 100 essentially operates in four modes: The Idle mode with no incrementing/decrementing (state 000); a first waiting mode starting when a button has been pushed (to generate a single increment/decrement) and waiting to see if the button will be held down (state 001); the fast count mode which generates an increment/decrement every 0.1 second while the button is held down (state 111); and a second waiting mode to see if a direction reversal is intended when the button has been released (state 100). In particular, the broken line box in the upper lefthand portion of FIG. 10 represents the Idle state which is state 000. As shown, the Idle state persists until there is "contact" which means one of the terminals UC, DC, D has gone low and driven TOUCHF high. TOUCHF going high has two immediate effects: (1) NAND gate 741 goes low and thus NAND gate 743 goes high to set pulse generator 721 and (2) latch 703 switches to Y3=1 so the state changes to 001. Now Y3 going high drives NAND gate 757 high and output IDLE low which turns on the oscillator in block CLK 612 to start a stream of CLK and CLK_ pulses. The CLK and CLK_ pulses drive pulse generator 721 to output a high COUNT_PULSE pulse (which increments or decrements the position counter in block WIPER_COUNTER 630). The box labelled "inc/dec" between state 000 and state 001 in FIG. 10 represents this COUNT_PULSE pulse. Y3 going high also switches NAND gate 746 low and thus NAND gate 757 high and output START1_ low to start timing a 1 second interval. Lastly, Y3 going high returns NAND gate 741 high and thus NAND gate 742 applies a low to pulse generator 721 to ready it for another pulse generation.

The broken line box in the top center portion of FIG. 10 shows state 001 persisting while "contact" continues (TOUCHF remains high) and the 1 second time interval has not expired. First consider the case of "contact" continuing for more than 1 second; this implies entry into the fast count mode as suggested by the feedback in the broken line box showing state 111 in the righthand portion of FIG. 10. Indeed, when the 1 second time interval expires DONE_ goes low (active) for one CLK period and this drives a transition from state 001 through state 011 and into state 111. That is, first Y2 switches from 0 to 1, and then Y1 switches from 0 to 1.

Y2 switching from 0 to 1 means output START0_1_ goes low to start timing a 0.1 second interval. And then Y1 switching high means NAND gate 742 goes low and pulse generator 721 outputs another high pulse at COUNT_PULSE which again increments or decrements the counter in WIPER_COUNTER. As before, a box labelled "inc/dec" indicates this pulse. Y1 going high also drives NAND gate 746 high which switches NAND gate 747 low and output START1_ high (inactive). The broken line box in the righthand portion of FIG. 10 shows state 111 persisting while "contact" continues (TOUCHF remains high); this is the fast count mode which generates a COUNT_PULSE pulse every 0.1 second until "contact" terminates as follows. When the 0.1 second time interval expires DONE_ goes low (active) for one CLK cycle and this drives NAND gate 742 low and NAND gate 743 high to generate a high pulse at output COUNT_PULSE which increments or decrements the counter in WIPER_COUNTER (see the "inc/dec" box within state 111). DONE_ going low also resets the timer (see FIG. 51) to restart the 0.1 second interval. That is, the 0.1 second interval completion drives DONE_ low for one CLK cycle, generates a COUNT_PULSE pulse, and restarts another 0.1 second interval. This repeats as long as TOUCHF remains high. TOUCHF going low (e.g., the held down button is released) drives a transition from state 111 to state 100 to wait to see if direction reversal occurs.

The case of state 001 with the "contact" terminating prior to the 1 second time interval completion (the button is released prior to fast count mode) is as follows. TOUCHF going low leads to a transition from state 001 through state 101 to state 100; that is, first Y1 goes high, then Y3 goes low. Now Y1 going high switches NAND gate 745 low and NAND gate 746 high (note that Y1 goes high just prior to Y1_ going low so there is no glitch) so NAND gate 747 remains high and output START1_ remains low (active) so the time interval continues. Then when Y3 goes low there is no change and START1_ persists low.

Release of a button drives the control unit into state 100 which persists as long as TOUCHF is low (no "contact" occurring) and the 1.0 second time interval has not completed. The broken line box at the bottom of FIG. 10 illustrates state 100. If a button is pushed prior to completion of the 1.0 second time interval which began when the button was released, thus generates a COUNT_PULSE pulse to again increment/decrement the counter in WIPER_COUNTER and the control unit transitions into state 001. Conversely, if the 1.0 second time interval completes without any button pushing, then the increment/decrement direction changes and control unit reverts to the idle state 000.

FIG. 10 omits one aspect of the operation of control unit 100: the control unit reverses increment/decrement direction upon reaching the end of the resistor string, that is, when the count in the WIPER_COUNTER equals 0 or 63.

The low (active) inputs from terminals UC, DC, and D all drive the TOUCHF input of the state machine as follows.

(a) When UC goes low block INPUTS 650 (see FIG. 47) immediately turns on oscillator OSC in block CLK 612 (FIG. 11 below) to begin the CLK and CLK_ signals cycling at 8 KHz, and if UC remains low for at least three CLK cycles (about 375 microsecond): this filters out short UC inputs, then TOUCHF goes high and switches state machine from state 000 to state 001. That is, in addition to T and T_ switching, Y3 and Y3_ also switch. The outputs then change as follows: IDLE goes low and this keeps OSC oscillating and CLK cycles (see FIG. 11); START1_ goes low and starts TIMER dividing CLK cycles; and COUNT_PULSE generates a high pulse. Note that the COUNT_PULSE pulse comes from T switching high and driving NAND gate 711 low for about 2 nanoseconds (nsec) until the switching of Y3_ from high to low reaches NAND gate 711 and drives it back high. This 2 nsec pulse suffices to drive the input IN of pulse generator 721 and trigger its output high. The first CLK cycle resets the output of pulse generator 721 low and completes the COUNT_PULSE pulse which has a duration of about 250 microseconds. The COUNT_PULSE pulse clocks counter 1101 (see FIG. 40) to increment or decrement, depending upon the CNTL signal from UD_CNTL 652.

(b) If UC persists low for one second, then TIMER 660 will drive DONE_ low and this will switch the state machine from state 001 through state 011 to state 111 and the outputs will change.

Figure 51:
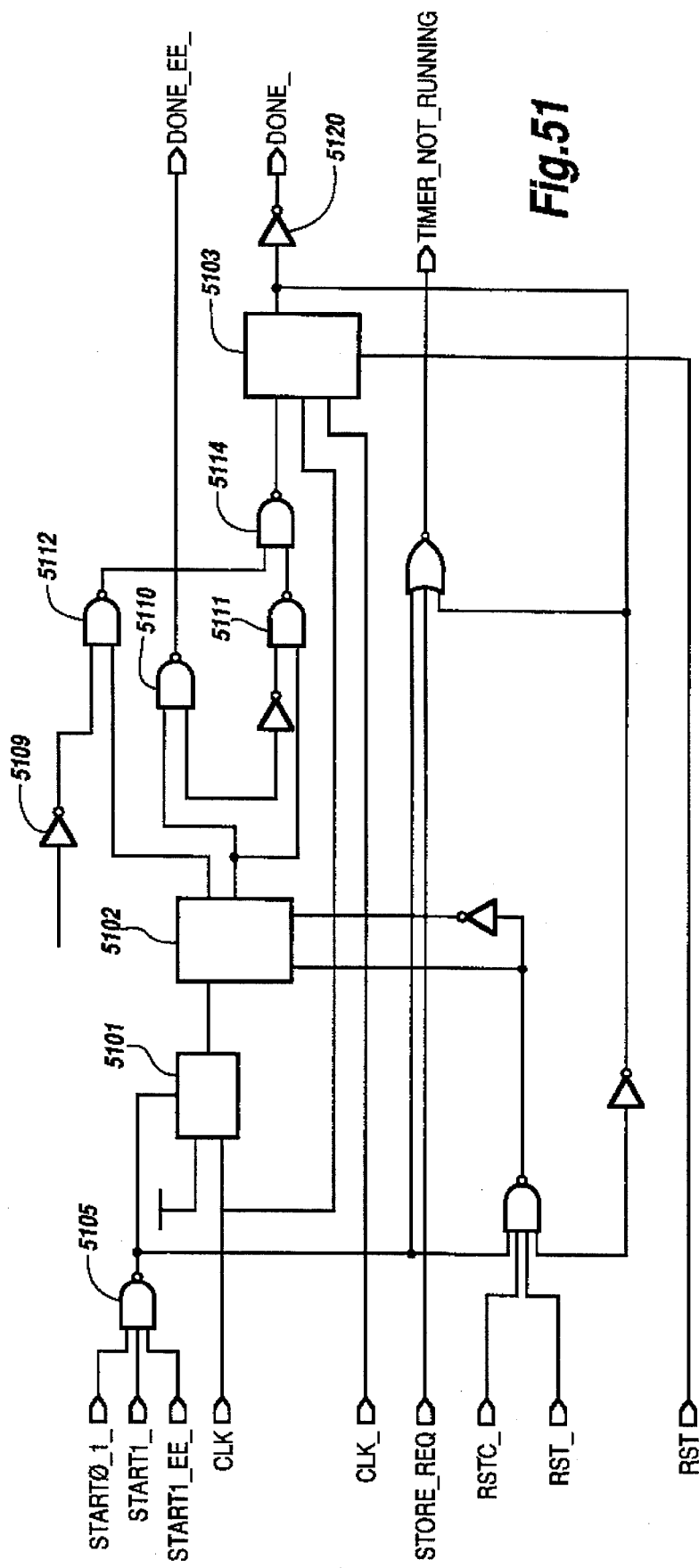
Figure 52:
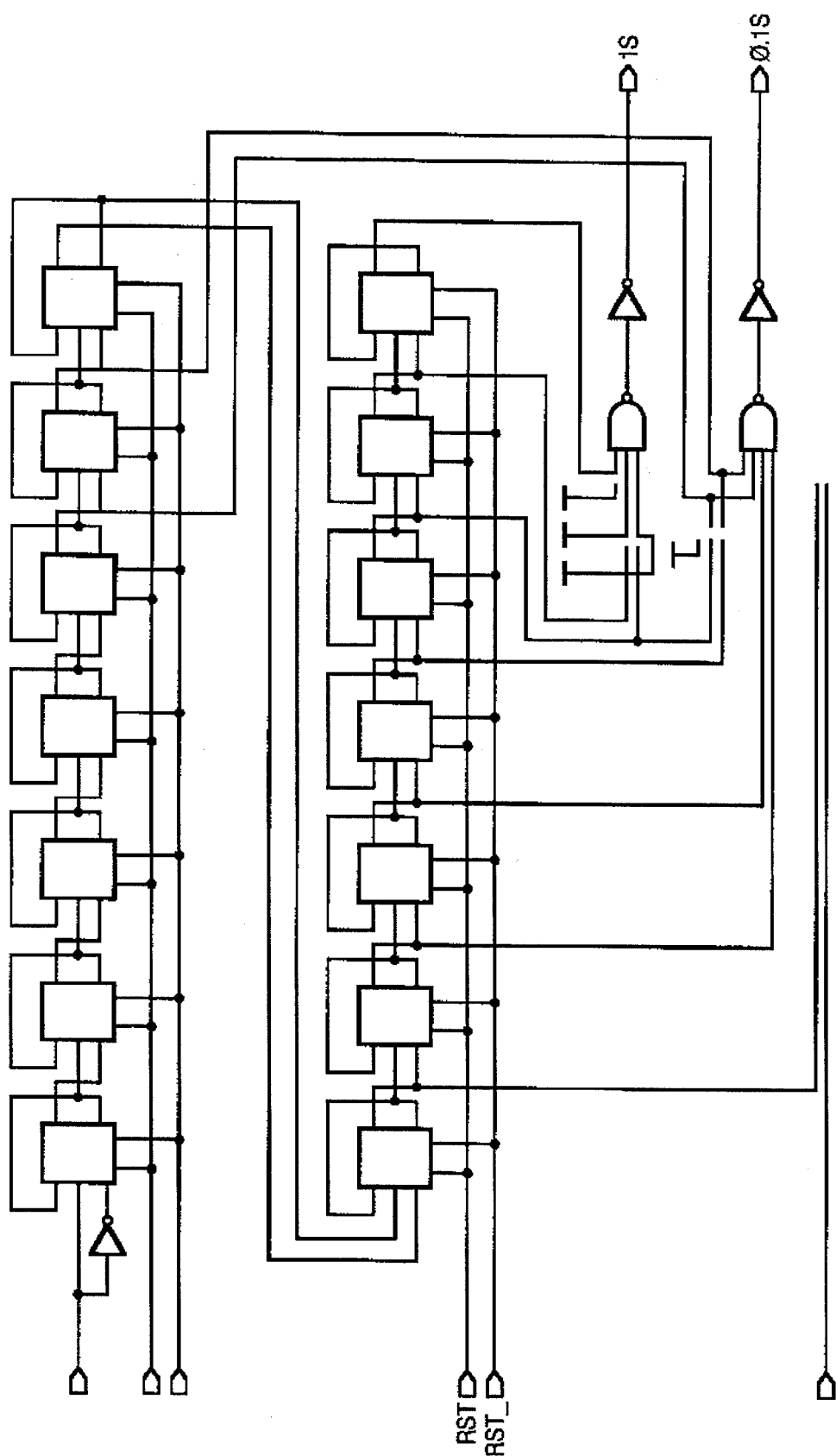

(c) Conversely, if UC returns high within one second, then DONE_ will remain high and TOUCHF will switch back low. This drives the state machine from state 001 to state 100, and Y1 goes high about 4 nsec prior to Y3 going low, so IN has a high pulse at pulse generator 722 and RSTC_ has a low output pulse which resets divider 1602 in TIMER (FIG. 51)

(d) While in state 100, the state machine outputs a low IDLE and OSC keeps running until another UC (or DC or DIG_IN) input or until a one second timeout expires.

(e) Analogous to the UC going low case, when DC goes low INPUTS also turns on OSC and if DC remains low for three CLK cycles, then TOUCHF goes high and the state machine switches from state 000 to 001. Similarly, DIG_IN going low also turns on OSC and drives TOUCHF high but without the necessity of a three CLK cycle duration to filter out short pulses.

Clock Generator

Figure 11:
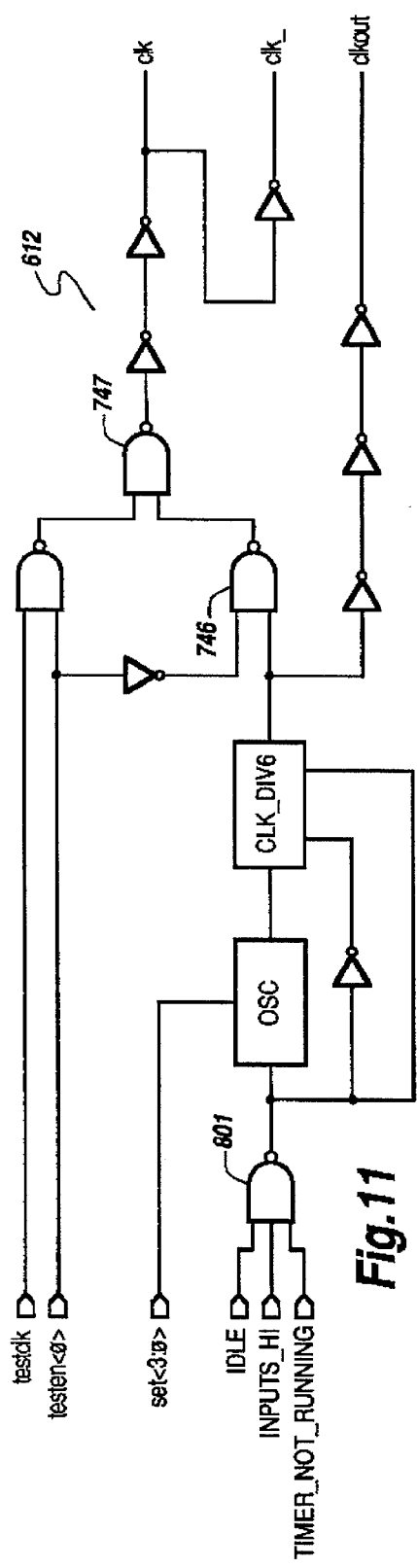
Figure 12:
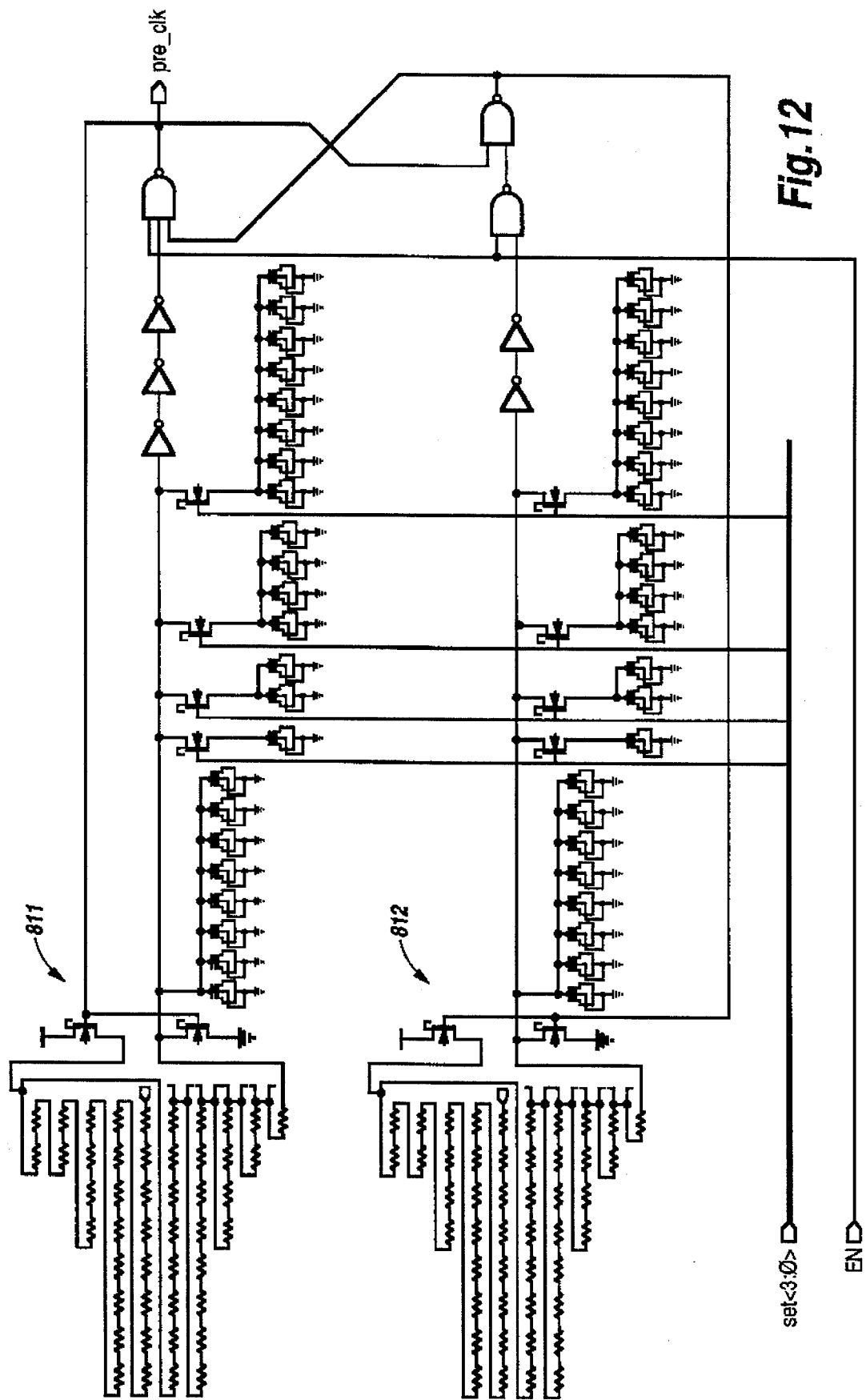

FIG. 11 illustrates clock generator CLK 612 which includes an oscillator OSC and a divider CLK_DIV6 to divide the output of OSC by 64 ($2^6$). FIG. 12 shows OSC as two cross-coupled five-inverter ring oscillators (one in the upper half of FIG. 12 and the other in the lower half) with the frequency of oscillation primarily determined by the resistance in and the capacitance loading on inverters 811–812 in the lefthand portion of FIG. 12; that is, the RC time constant determines the frequency of oscillation. The resistance can be selected by metal layer options during fabrication of the control unit; also, the four bits on bus SET<3:0> control futher capacitive loading for programmable control of the frequency of oscillation. The resistance can be selected in the range of 16K to 92K and the capacitance with 0000 on bus SET <3:0> is about 0.14 pF and this roughly triples with 1111 on the bus. Thus the frequency of oscillation can be initially selected in the range of about 900 KHz to 1 MHz and lowered by programming up to a factor of three. Oscillator OSC outputs a symmetrical square wave ranging between the high and low power supply voltages (e.g., +5 volts and ground).

The input at EN controls oscillator OSC, and EN is high (and OSC running) when any of INPUTS_HI, IDLE, or TIMER_NOT_RUNNING is low. INPUTS_HI derives from input block INPUTS 650 and goes low when any of the three inputs UP_, DOWN_, or DIG_IN goes low; that is, when control unit 100 recieves an input to changes the resistor setting (see FIG. 47). Thus a resistor change input starts up oscillator OSC. And INPUTS_HI continues low as long as the UP_, DOWN_, or DIG_IN stays low; for example, when the pushbutton in FIG. 3 is held down.

IDLE derives from control CNTL and goes low when any of Y1_, Y2_, or Y3_ switches low which means any change from the idle state 000; see FIGS. 7, 8 and 9.

TIMER_NOT_RUNNING derives from timer TIMER 660 and goes low when any of START0_1_, START1_, or START1_EE_ switches low. Now START0_ 1_ and START1_ derive from control CNTL and switch low when the state machine changes from state 001 to state 111 for START0_1_ and from state 000 to state 001 or to state 100 for START1_. Such state changes arise from input TOUCHF changing.

START1_EE_ derives from EE_CNTL 622 and goes low if both (i) REVERSE1 is high (see FIG. 7) and (ii) either latch 1005 is high (the power up reset case) or any of the three most significant bits stored in EE and differ from the corresponding bits currently in WIPER_COUNTER so that the EEPROM must be updated.

In short, any of the following turn on oscillator OSC:
(1) activity at one of the inputs DC, UC, and D;
(2) the control unit is not in the idle state (000);
(3) a timer is running (the 1.0 and 0.1 second timers);
(4) the EEPROM is being updated.

Further detail as to the operation will be described in the following sections.

EEPROM Array Architecture

Figure 13:
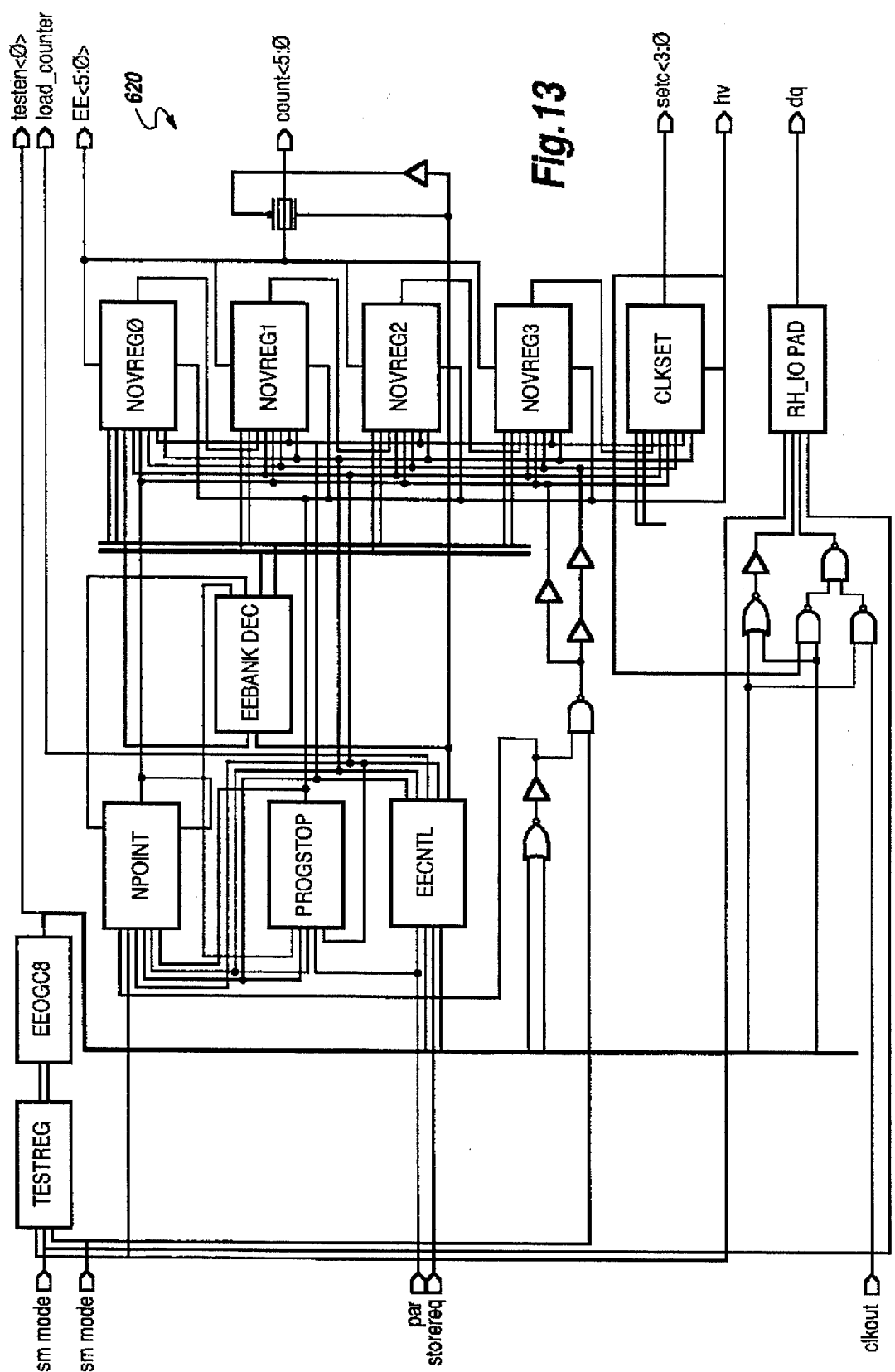

FIG. 13 shows the shadow memory block EE 620 as including four nonvolatile 6-bit registers NOVREG0, NOVREG1, NOVREG2, and NOVREG3 in parallel (i.e., redundant) on 6-bit data bus EE<5:0> and which also connects to 6-bit bus COUNT<5:0> through a transmission gate. Shadow memory block EE 620 also includes nonvolatile register selection decoder EEBANKDEC to select one of the four nonvolatile registers NOVREGj for current use, 4-bit cycler NPOINT to rotate selection among the four nonvolatile registers NOVREGj, high voltage generator PROGSTOP, controller EECNTL, main clock timing trim CLKSET, input/output pad driver RH_IOPAD, test register TESTREG, test decoder EEDEC8, and test logic gates fed from 8-bit test bus TESTEN<7:0>. Block EE 620 basically operates as follows.

Figure 14:
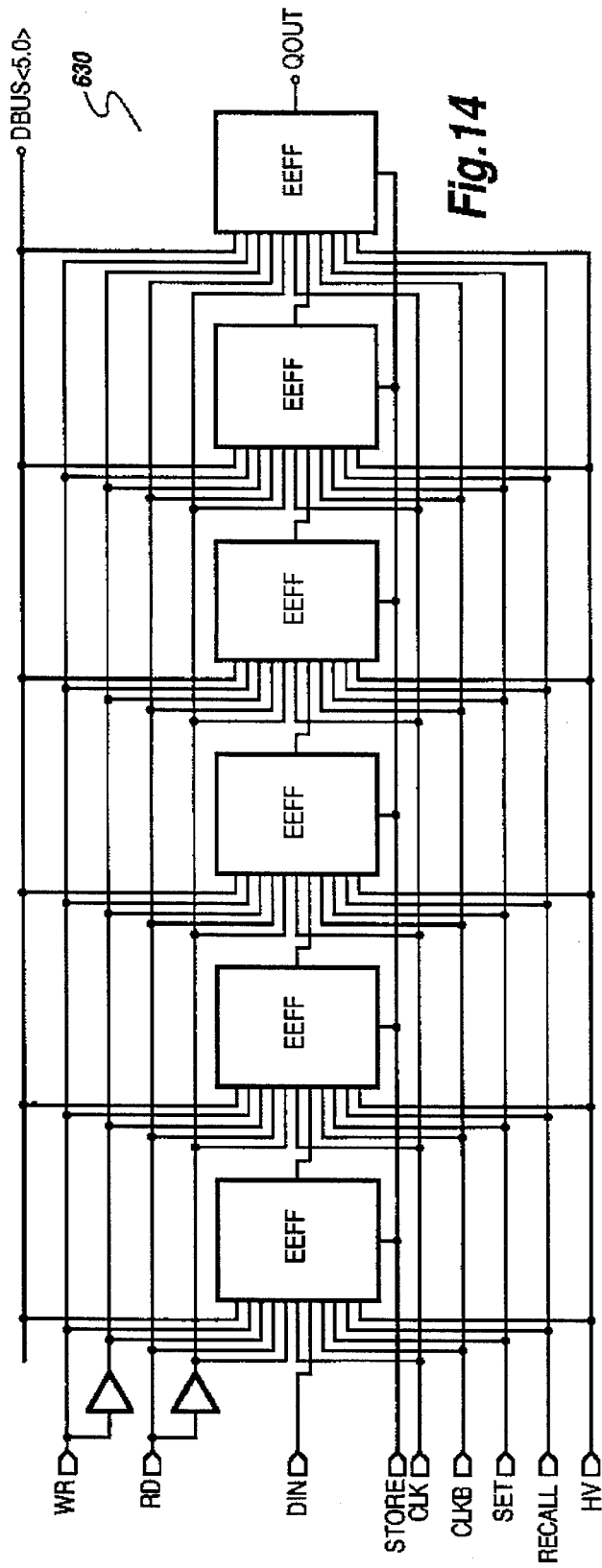

Each of the four nonvolatile registers NOVREGj is the same as the 6-bit register illustrated in FIG. 14 and includes six flip-flops EEFF with one flip-flop for each bit of bus DBUS<5:0> which connects to bus EE<5:0>.

Figure 15:
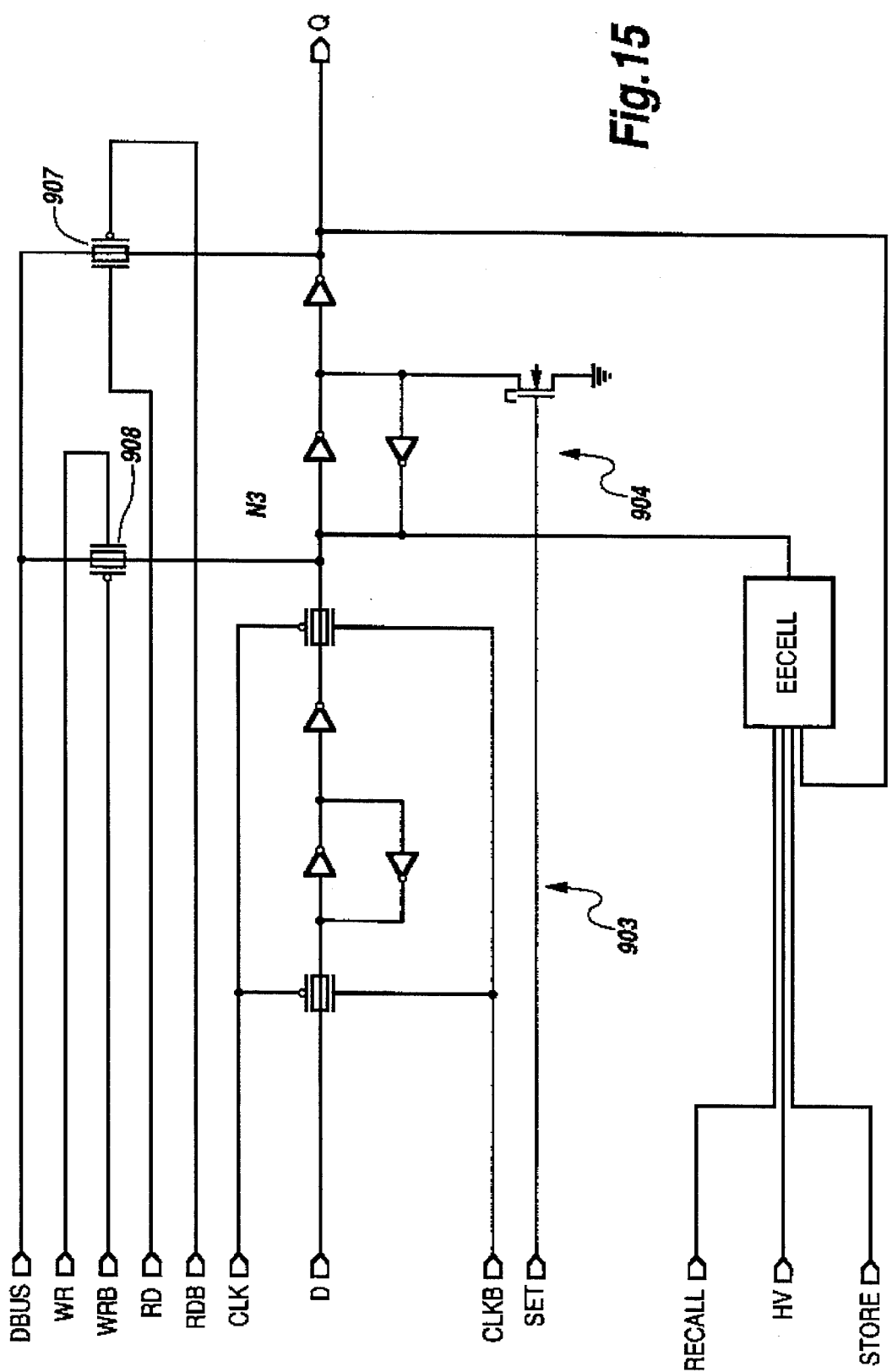

Each flip-flop EEFF is the same as the flip-flop shown in FIG. 15 and contains an EEPROM cell EECELL plus memory cells 903 and 904 made of inverter pairs. Flip-flop EEFF operates as follows. The bit held by memory cell 904 at node N3 and at output node Q is read by driving input RD high to turn on transmission gate 907 and connect the corresponding line of bus DBUS to the node Q. Conversely, the bit on the corresponding line of bus DBUS is written to memory cell 904 by driving input WR high to turn on transmission gate 908 and connect DBUS to node N3; for such a write CLK must be low to isolate memory cell 904 from control by memory cell 903. Driving node RECALL high activates the OUT node of EEPROM cell EECELL (see FIG. 22 and discussion in following section EEPROM Cell Architecture) to similarly write the bit held in EECELL to node N3 and memory cell 904. Note that when CLK is low, the bit at input node D controls the state of memory cell 903 and memory cell 904 is isolated from memory cell 903; whereas when CLK is high, input node D is isolated from memory cell 903 and the bit held by memory cell 903 controls the state of memory cell 904.

Figure 16:
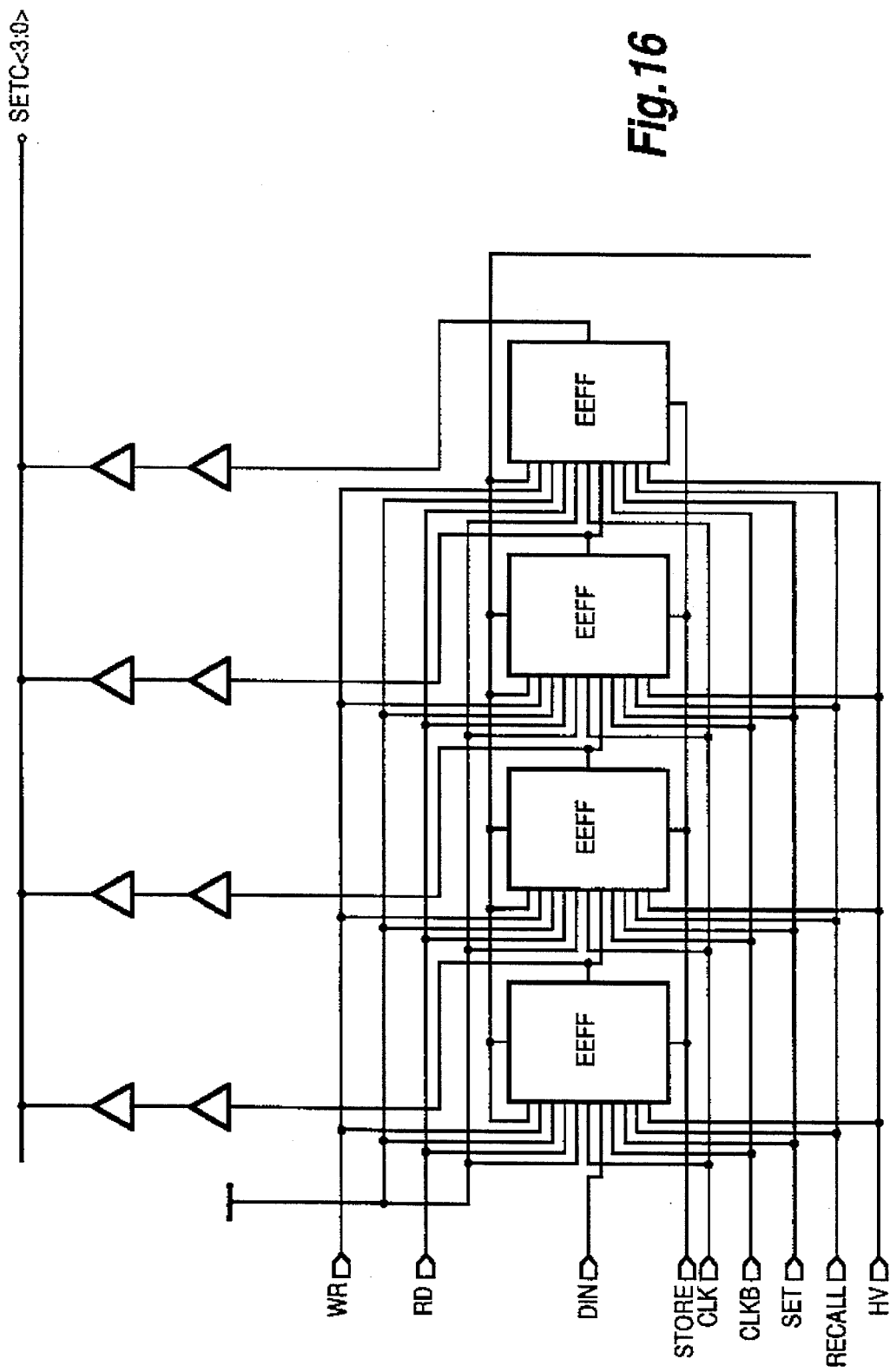

A low-to-high transition by CLK isolates node D from memory cell 903 and effectively transfers the bit held by memory cell 903 to memory cell 904, and a subsequent high-to-low CLK transition reverts to the isolation of the memory cells 903–904 plus writes the input at node D into memory cell 903. FIG. 14 shows that repeated clocking by CLK transitions permits a data stream at input DIN to be serially loaded into nonvolatile register NOVREG because the Q output of each flip-flop EEFF ties to the subsequent input node D of the adjacent flip-flop. Further, FIG. 13 shows that the four nonvolatile registers NOVREGj are serially connected with NOVREG0 having its DIN input connected to output Q3 of 4-bit cycler NPOINT and with NOVREG3 havings its QOUT connected to the DIN input of . . . CLKSET. FIG. 16 shows CLKSET to just be a four bit register made of four flip-flops EEFF. Thus all four nonvolatile registers NOVREGj plus CLKSET can be serially loaded by CLK clocking. Note that the four bits held in CLKSET feed bus SETC<3:0> which connects to four bit bus SET<3:0> and controls the capacitors in oscillator OSC as illustrated in FIG. 12 to set the frequency of oscillation. Thus CLKSET sets the speed of the clock.

Figure 17:
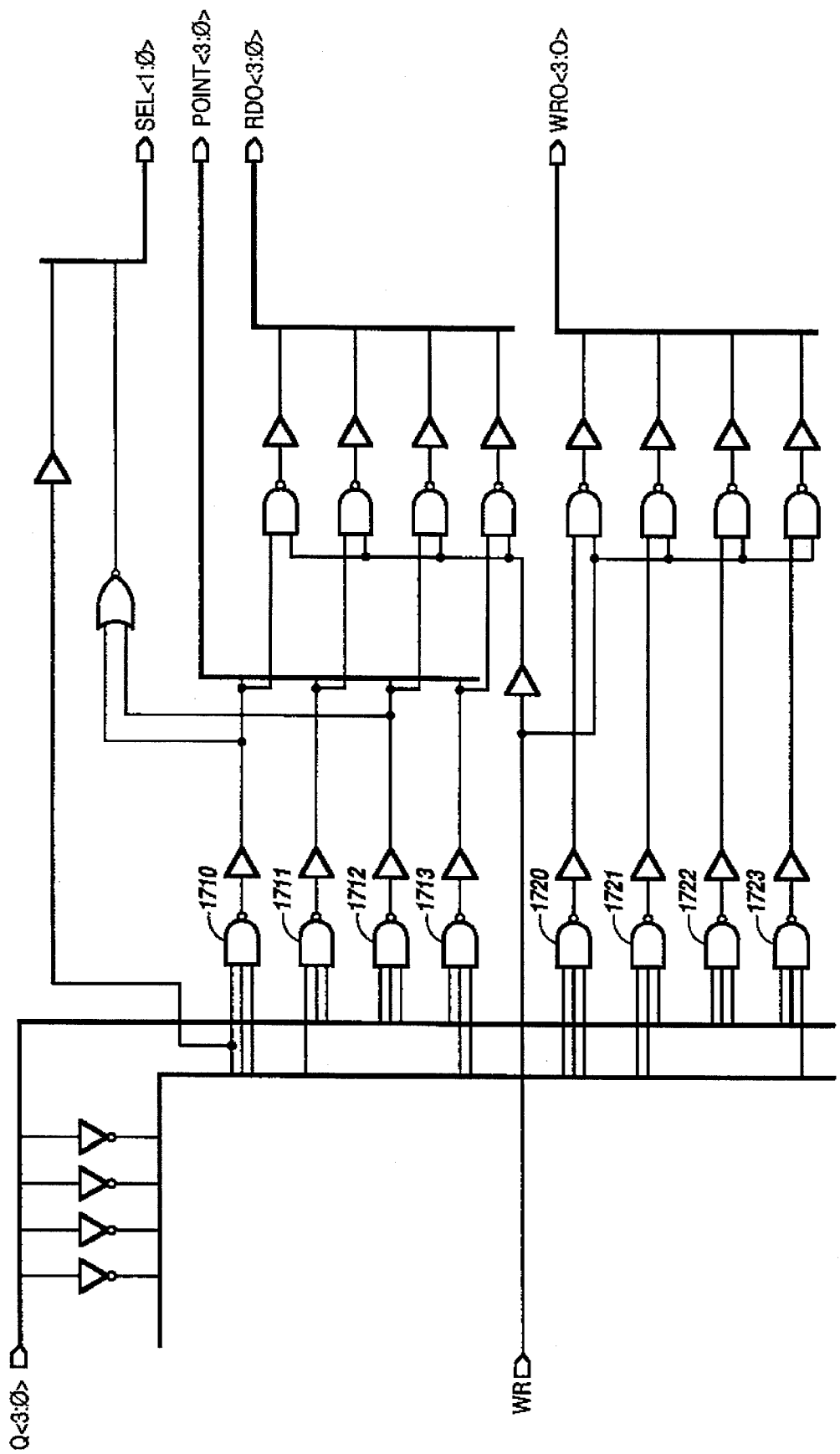
Figure 53:
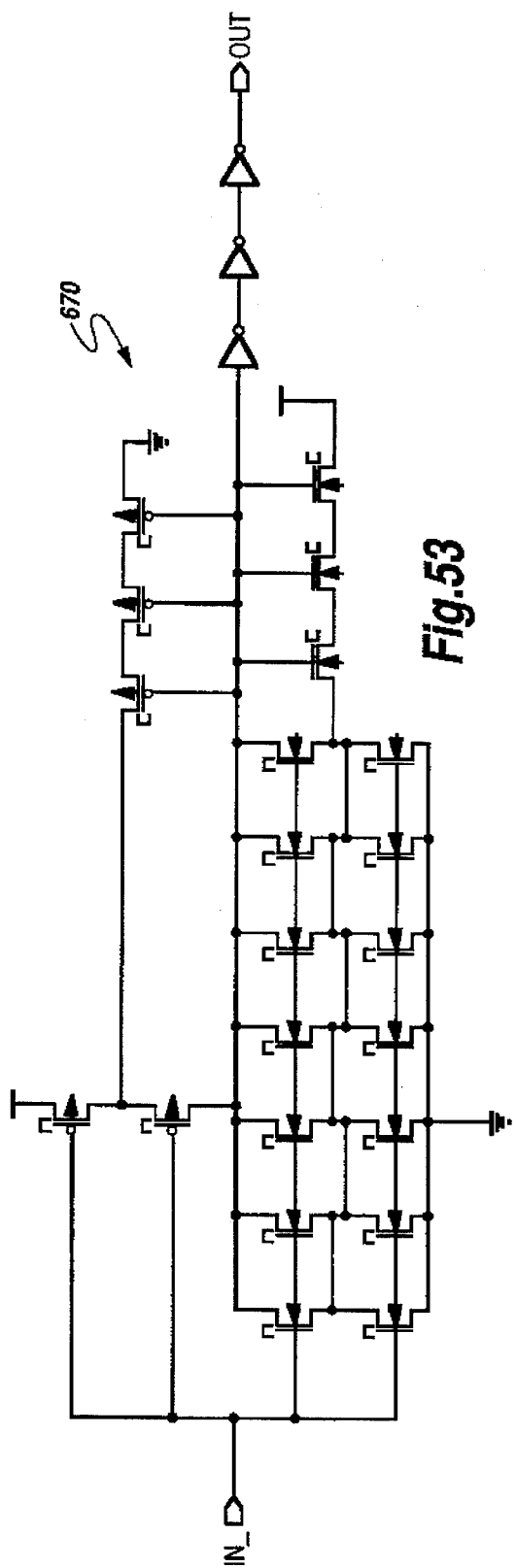
Figure 54:

FIG. 17 shows decoder EEBANKDEC as decoding the four input bits Q0–Q3 from 4-bit cycler NPOINT to select one of the four nonvolatile registers NOVREGj and the write/read input WR as driving the write input of the selected NOVREG if WR is high or the read input if WR is low. In particular, when WR is low and Q1=Q2=Q3=0, NAND gate 1710 is low to drive the RDO0 bit high; that is, read NOVREG0. Similarly, with WR=0, Q0=Q1=1 and Q3=0 drives NAND gate 1711 low to set the RDO1 bit high to read NOVREG1; Q1=Q2=Q3=1 drives NAND gate 1712 low to set the RDO2 bit high to read NOVREG2; and Q0=Q1=0 and Q3=1 drives NAND gate 1713 low to set the RDO3 bit high to read NOVREG3. Analogously with WR=1, Q0=Q1=Q2=0 drives NAND gate 1720 low to set the WRO0 bit high to write NOVREG0; Q0=1 and Q2=Q3=0 drives NAND gate 1721 low to set the WRO1 bit high to write NOVREG1; Q0=Q1=Q2=1 drives NAND gate 1722 low to set the WRO2 bit high to write NOVREG2; and lastly, Q0=0 and Q2=Q3=1 drives NAND gate 1723 low to set the WRO3 bit high to write NOVREG3. FIG. 53 also shows the outputs POINT0, . . . POINT3 are the same as the inverted outputs of the NAND gates 1710–1713. POINT0–POINT3 are NORd together to gate a set signal NPOINT as shown in FIG. 54. FIG. 53 further shows the outputs SEL0,SEL1 are high when Q1, Q2, and Q3 are not equal and when Q3 is high, respectively. SEL0,SEL1 drive . . . in programming stop circuit PROGSTOP discussed below in connection with FIG. 26

Figure 18:
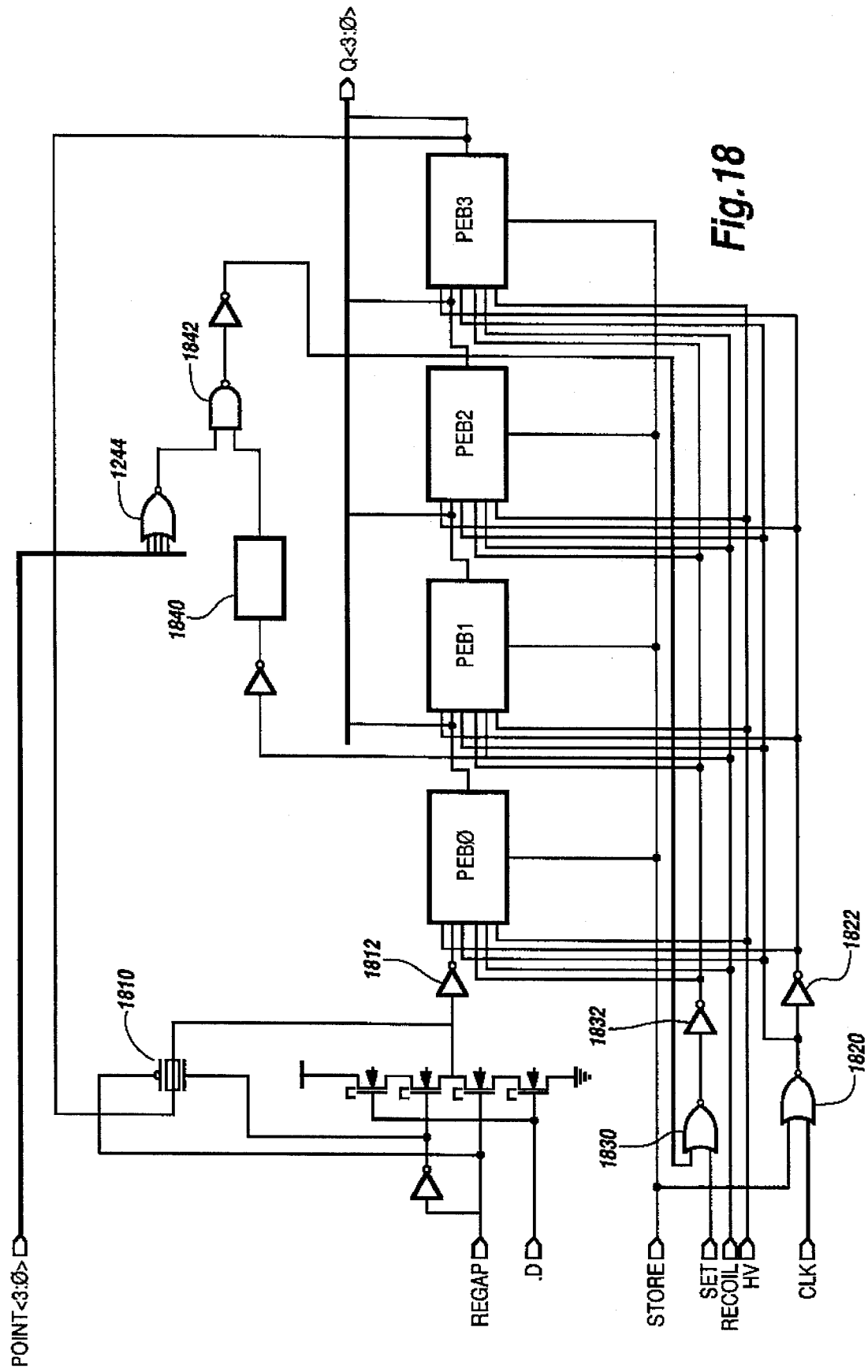

FIG. 18 shows 4-bit cycler NPOINT as including four nonvolatile flip-flops PEB0, . . . PEB3 each of which has the structure shown in FIG. 19. The outputs of the flip-flops PEB0 . . . PEB3 appear as Q0 . . . Q3 on the bus Q<3:0>. Note that the structure in FIG. 19 duplicates that in FIG. 15 with the omission of the read and write busses. 4-bit cycler NPOINT has a feedback loop from the output of PEB3 to the input of PEB0 via transmission gate 1810 and inverter 1812. 4-bit cycler NPOINT operates as follows.

First presume input nodes REGOP, SET, CLK, and RECALL are all low. Note that REGOP only goes high when either TESTEN3 or TESTEN4 are high during a test mode; SET only goes high during a power-on-reset or a test reset; CLK is the test clock; and RECALL only goes high after SET goes high. Controller EECNTL, shown in FIGS. 20A and 20B, generates all of these signals with one-shots OSH0–OSH5. FIG. 21 illustrates the one-shot circuitry which generates a 125 nsec high pulse for a low-to-high input transition. Further, Thus the signal at node STORE derives from one-shot OSH5 and consists of a high pulse of duration about 125 nsec. This high pulse at STORE passes through NOR gate 1820 as a low pulse and then through inverter 1822 as a high pulse to drive the CLK and CLKB inputs of each of PEB0, . . . PEB3 to load the bit at its D input and output it at its Q output. Thus a STORE pulse simultaneously shifts the bit Q0 in PEB0 to PEB1, the Q1 bit in PEB1 to PEB2, the Q2 bit in PEB2 to PEB3, and the complement of the Q3 bit in PEB3 to PEB0 with the complementing by feedback inverter 1812. Hence, a stream of STORE pulses circulates the Q0, . . . Q3 bits with complementation at the wraparound.

Figure 20A:
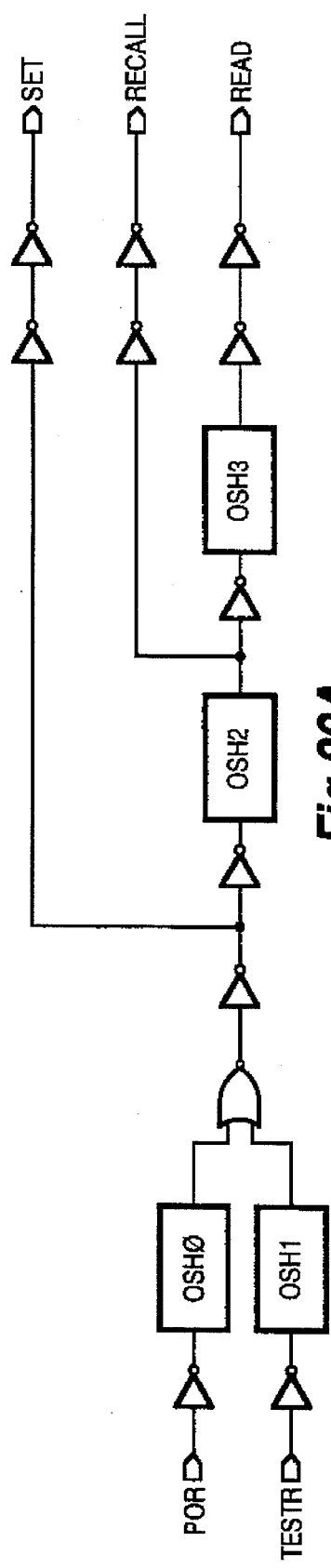

The initial values for Q0 . . . Q3 arise from a power-on-reset pulse input to controller EECNTL at input node POR (FIG. 20A). This generates a SET pulse followed by a RECALL pulse. The SET pulse passes through NOR gate 1830 and inverter 1832 (FIG. 18) and puts each of PEB0 . . . PEB3 into the Q=1 state. Then the RECALL pulse drives the RECALL input of each PEBj to read the bit stored in EECELL 1920 into latch 1910 and thus puts Q equal to the stored bit. FIG. 22 shows EECELL 1920 which is a floating gate EEPROM cell and will be described in the following EEPROM Cell Architecture section. Thus Q0 . . . Q3 now equal the stored bits. Lastly, the RECALL pulse falling edge triggers one-shot 1840 to apply a high pulse to NAND gate 1842, and this pulse will pass NAND gate 1842 when NOR gate 1844 is high and then eventually feed NOR gate 1830 and set each of PEB0 . . . PEB3 back to Q=1. Now NOR gate 1844 high means each of its inputs is low; in other words, each of NAND gates 1710 . . . 1713 (FIG. 17) is high. This occurs when Q0 . . . Q3 do not match any of the four read patterns previously listed (Q0Q1Q2Q3=×000 or 11×0 or ×111 or 00×1). Hence, if a read pattern was stored in the EECELLs and RECALL reads this into latches 1910, then NOR gate 1844 is low and NAND gate 1842 blocks the pulse from one-shot 1840; conversely if the stored pattern was not a read pattern, then NOR gate 1844 is high and the pulse from one-shot 1840 sets the PEBj back to the Q0=Q1= Q2=Q3=1 state. Note that every RECALL pulse generates this followup pulse by one-shot 1840 and thus every RECALL will have this check for a read pattern and if none found, then a default to Q0=Q1=Q2=Q3=1.

The circulation of Q0 ... Q3 values in NPOINT by STORE pulses thus proceeds from the default as follows: 1111→0111→0011→0001→0000→1000→1100→1110→1111. Q0 ... Q3 equal to 1111 will drive NAND gates 1712 and 1722 low to provide a high RDO2 or WRO2, depending upon WR. Thus the 1111 values correspond to a read or write of NOVREG2. Similarly, Q0 ... Q3 equal 0111 drives NAND gates 1712 and 1723 low which corresponds to a read of NOVREG2 or a write of NOVREG3. Indeed, the following correspondence applies:

| Q0Q1Q2Q3 | WRITE | READ |
| --- | --- | --- |
| 1111 | NOVREG2 | NOVREG2 |
| 0111 | NOVREG3 | NOVREG2 |
| 0011 | NOVREG3 | NOVREG3 |
| 0001 | NOVREG0 | NOVREG3 |
| 0000 | NOVREG0 | NOVREG0 |
| 1000 | NOVREG1 | NOVREG0 |
| 1100 | NOVREG1 | NOVREG1 |
| 1110 | NOVREG2 | NOVREG1 |

That is, the nonvolatile register used to store values is rotated among the four NOVREG0 ... NOVREG3 and the after a write the next register for a read is the one just written. The use of four register implies that each register receives only one quarter of the writes and thus only wears out (tunneling oxide breakdown typically) at one quarter of the rate of a comparable single register arrangement. For example, if a single register were expected to survive 50,000 writes prior to significant wear out, then the rotation of four registers allows for about 200,000 writes prior to wear out. Similarly, with the Q0 ... Q3 values gray-coded, only one of PEB0 ... PEB3 has tunneling during a STORE and thus NPOINT wears out at the same rate as the NOVREGj.

A high STORE pulse also has the EEPROM cell EECELL in each of PEB0, ... PEB3 in NPOINT store the bit held by ramping up the high voltage at node HV as described in the following section. Note that as long as node RECALL remains low, this change of stored bit will not affect the bit stored in latch 1910 of PEBj.

CLK clocking (during test mode) drives PEB0 ... PEB3 to shift a serial bit stream at input D of 4-bit cycler NPOINT through to output Q3 in the same manner as described in connection with flip-flop EEFF of FIG. 15 and nonvolatile registers NOVREGj. Also, note that the Q3 output of NPOINT connects to the D input of NOVREG0, and the D input of NPOINT connects to the DIN output of buffer RH_IOPAD. FIG. 23 shows buffer RH_IOPAD has node DQ connected through a NAND gate and an inverter to output DIN; thus a serial bit stream at node DQ may be clocked through RH_IOPAD (when TESTMODE is high), NPOINT, top to bottom NOVREGs, and CLKSET by CLK. This permits initialization of the memories in NPOINT, the four NOVREGj, and CLKSET; and each of these subcircuits has a nonvolatile memory for retaining the initialization bits.

Figure 20B:
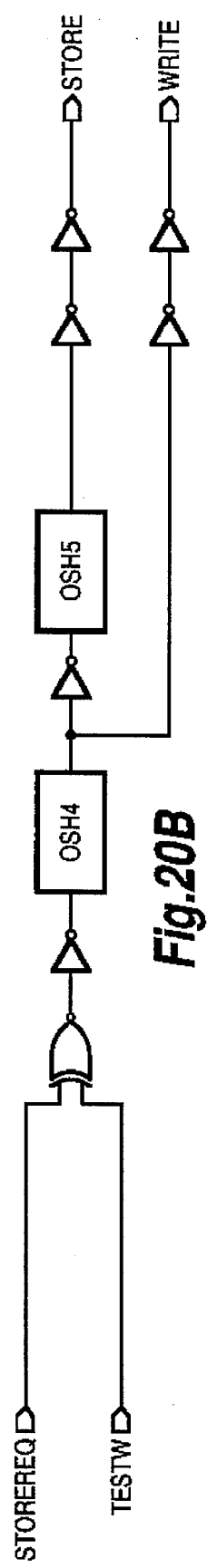

FIGS. 20A and 20B show controller EECNTL as simply a collection of one-shots OSH0–OSH5 and inverters for generating pulses from inputs POR (power on reset), TESTR (test read), STOREREQ (store request), and TESTW (test write). FIG. 21 shows the one-shot structure for each of OSH0–OOSH5.

EEPROM Cell Architecture

FIG. 22 illustrates EEPROM-storage cell EECELL in schematic form. Cell EECELL includes floating gate NMOS device 2201 with floating gate 2211 coupled by a small tunneling capacitor 2221 to tunneling node 2225 and coupled by a large control capacitor 2231 to control node 2235. Thus capacitors 2221 and 2231 form a series coupling of tunneling node 2225 to control node 2235 with floating gate 2211 connecting the capacitors. The capacitor dielectric in both capacitors is 100 Angstrom of silicon dioxide, and the area of the large control capacitor is about twenty-five times that of the small tunneling capacitor. CMOS inverters 2240 and 2250 are cross coupled to form a latch with the output of inverter 2240 (and input to inverter 2250) being tunneling node 2225 and the output of inverter 2250 (and input to inverter 2240) being control node 2235. Inverters 2240 and 2250 are powered by the voltage at node HV which ramps up from about +4 volts to +20 volts during programming of the cell but which is at ground otherwise. NMOS device 2260 is a pass gate from the DATA input node to the input of inverter 2240, and NMOS device 2270 connects the floating gate NMOS device 2201 to the data output node OUT. Cell EECELL operates as follows; first consider the case of the floating gate 2211 with no net charge.

To store a 1 begin with node HV low (about ground) and a high (about +5 volts) at node DATA to represent the 1 to be stored. First raise node HV to high and then turn on NMOS 2260 by driving node LOAD high; this connects the high at node DATA to the input of inverter 2240 and switches, if necessary, the latch 2240–2250 to have inverter 2240 outputting a low and inverter 2250 a high. Thus tunneling node 2225 is low and control node 2235 is high. Then turn off NMOS 2260 to isolate the latch. Next, ramp up the voltage at node HV from high (about +5 volts) to about +20 volts in about 1 millisecond; this ramps up the output of inverter 2250 and control node 2235. Tunneling node 2225 remains at ground. Because the capacitance of control capacitor 2231 is much greater than that of tunneling capacitor 2221, most of the voltage drop from control node 2235 to tunneling node 2225 appears across tunneling capacitor 2221 so the voltage on floating gate 2211 also ramps up. And when HV reaches about 13 volts the voltage across tunneling capacitor 2221 is about 12 volts and the tunneling current injecting electrons through the capacitors' dielectric into the floating gates becomes large enough to rapidly charge floating gate 2211 and hold the voltage of the floating gates to about +12 volts as HV continues ramping up towards +20 volts. This is "programming" the floating gates; see the dotted line in FIG. 24. Note that if HV were just jumped up to +20 volts, the tunneling current would initially be very large and then decrease as the voltage of the floating gate increased with charge build up. This initial large voltage jump and large current are difficult to control and lead to premature tunneling oxide breakdown.

As the voltage at node HV ramps up, PROGSTOP (FIG. 26) detects the degree of programming of floating gate 2211 and drops node HV to ground upon the completion of the programming. Thus, control node 2235 drops to ground both inverters 2240 and 2250 turn off. Hence, floating gate 2211 drops to about −5 volts because most of the injected electrons will be on the large control capacitor 2231 and control node 2235 has dropped from about 20 volts to ground. More precisely, floating gate 2211 has various attached capacitances in addition to tunneling capacitor 2221 and control capacitor 2231, namely, the gate-to-source/drain capacitance of NMOS 2201 and other stray capacitances; thus when control node 2235 drops from about +20 volts to ground, the charges redistribute among these capacitors to determine the exact final potential of the floating gates.

To store a 0 again begin with node HV low and a low at node DATA to represent the 0. First raise node HV to a high and then turn on NMOS 2260 by driving node LOAD high; this connects the low at node DATA to the input of inverter 2240 and switches, if necessary, the latch 2240–2250 to have inverter 2240 outputting a high and inverter 2250 a low. Thus tunneling node 2225 is high and control node 2235 is low. Then turn off NMOS 2260 to isolate the latch. Next, ramp up the voltage at node HV from high (about +4 volts) to about +20 volts in about 1 millisecond; this ramps up the output of inverter 2240 and tunneling node 2225. Control node 2235 remains at ground. Because the capacitance of control capacitor 2231 is much greater than that of tunneling capacitor 2221, most of the voltage drop from tunneling node 2225 to control node 2235 appears across tunneling capacitor 2221 so the voltage on floating gate 2211 stays near ground. And when HV reaches about 13 volts the voltage across capacitor 2221 is about 12 volts and a tunneling current withrawing electrons through the capacitors' dielectric from the floating gate becomes large enough to rapidly remove electrons (erase) floating gate 2211 and ramp the voltage of the floating gates to about +8 volts as HV continues ramping up to +20 volts. See the dotted line in FIG. 25. Then when node HV drops back to ground, so does tunneling node 2225 and net positive charge on floating gate 2211 redistributes to bring the potential down to about +5 volts; recall that the large size of control capacitor 2231 and the grounding of node control implies that the potential of the floating gates will not change much when node HV drops to ground.

Now if the floating gates already have a net negative charge (cell programmed for a 1) or a net positive charge (cell erased to a 0), then the foregoing operations of storing a 1 or 0 still apply with the following modifications. Storing a 1 when the cell is already programmed just means that the floating gate starts at a negative potential so the voltage across the tunneling capacitor is lower than in the no net charge description, and when node HV gets close to +20 volts then the voltage across the tunneling capacitor is about 12 volts and tunneling current will insure that the floating gates hold at about this voltage; see the broken line in FIG. 24. For the case of storing a 1 when the cell is erased means that the floating gate starts with a positive potential and the voltage across the tunneling capacitor is higher than in the no net charge description. So when node HV reaches about 7 volts the voltage across the tunneling capacitor already has hit 12 volts and a large tunneling current will inject sufficient electrons to cancel the net positive charge plus create a net negative charge as HV rises to +20 volts; see the solid line in FIG. 24. Similarly, FIG. 25 illustrates storing a 0 (erasing) when the floating gates are programmed (solid line) or already erased (broken line).

To read a stored 0 or 1 in cell EECELL, apply a high at node RECALL to turn on NMOS 2270. Then if the cell is programmed (a 1 stored), floating gate 2211 will have about a −4 volt potential and keep NMOS 2201 turned off so that a high impedance to ground appears at node OUT. Conversely, if the cell is erased (a 0 stored), then the floating gate has about a +4 volt potential and NMOS 2201 is turned on so a low impedance to ground appears at node OUT.

Programmings and erasures create stresses on the tunneling dielectric will affect performance of the cell over time; and thus the rotating among four separate cells extends expected lifetime by a factor of four.

High Voltage Programmer

Figure 26:
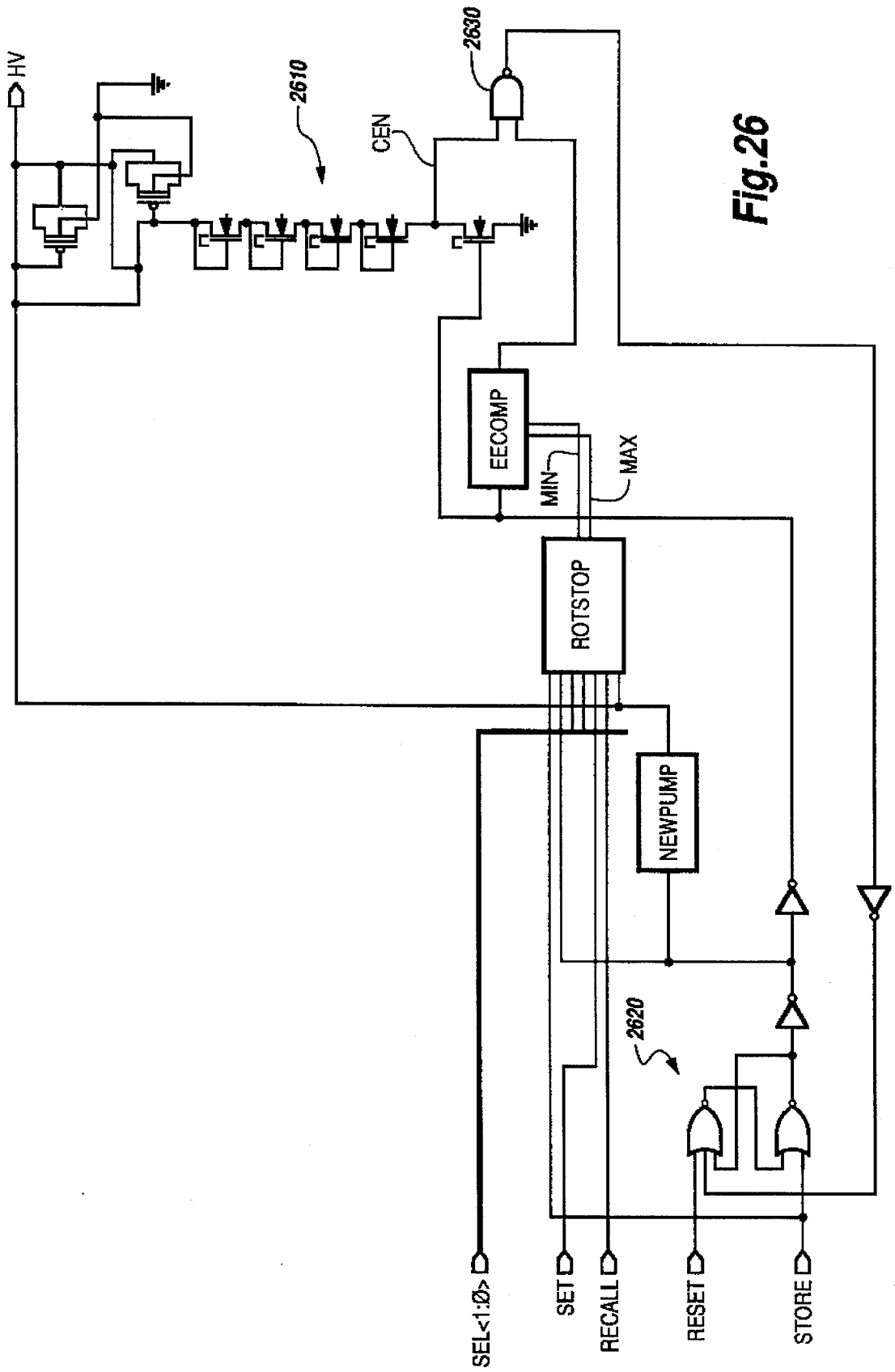
FIGS. 26–29 are further schematic circuit diagrams for blocks of FIG. 6.
Figure 27:
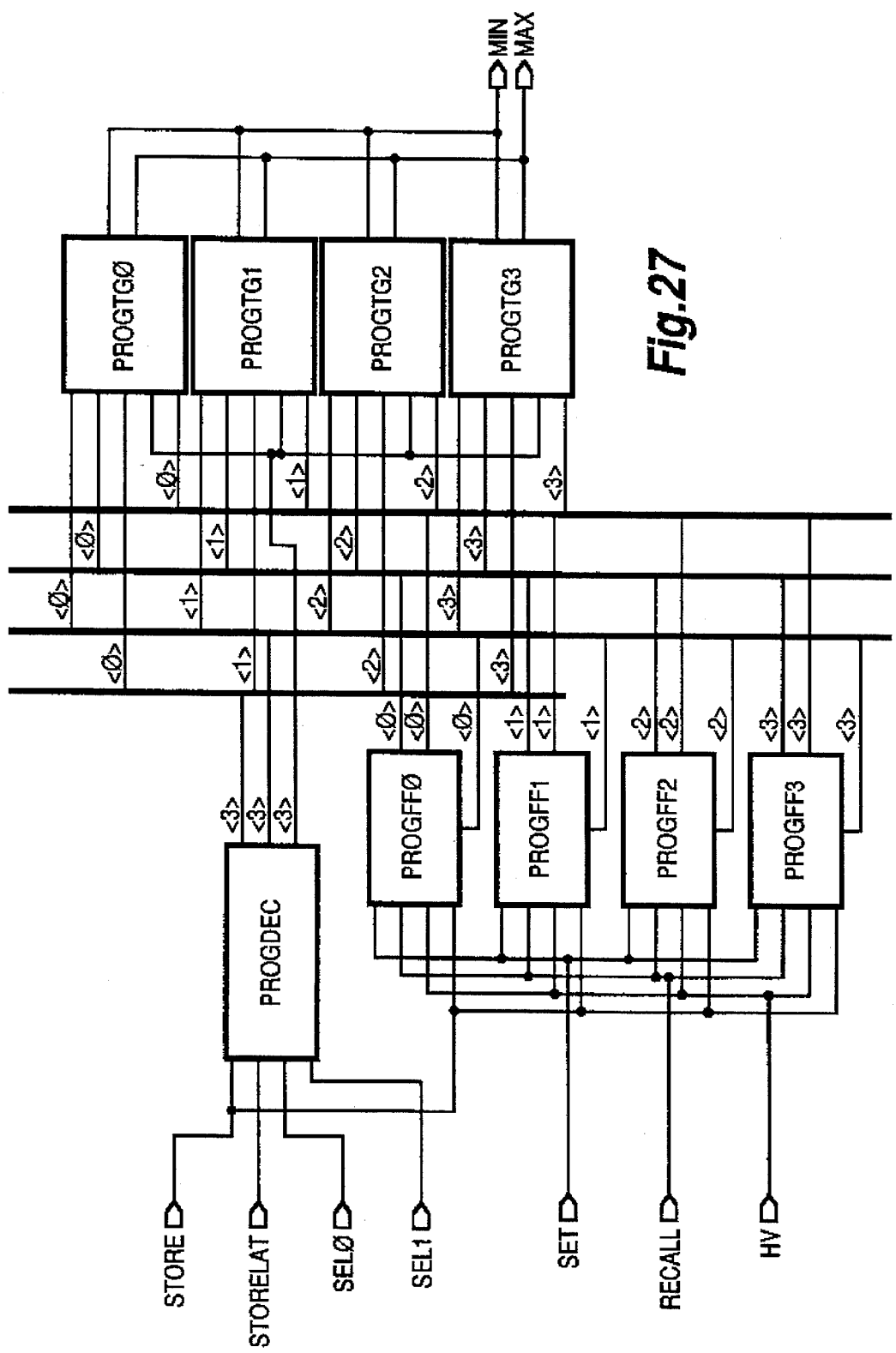
Figure 28:
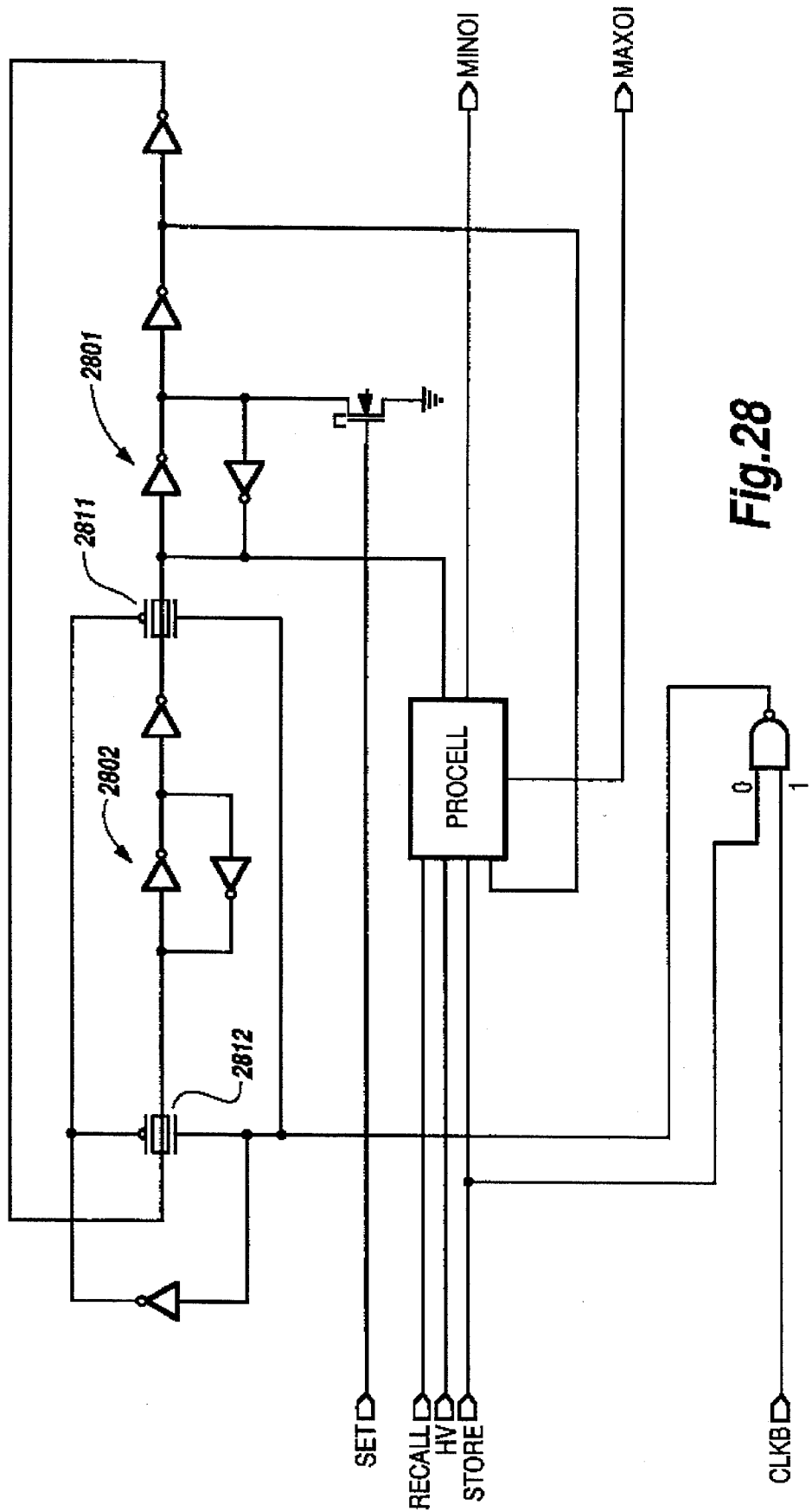
Figure 29:
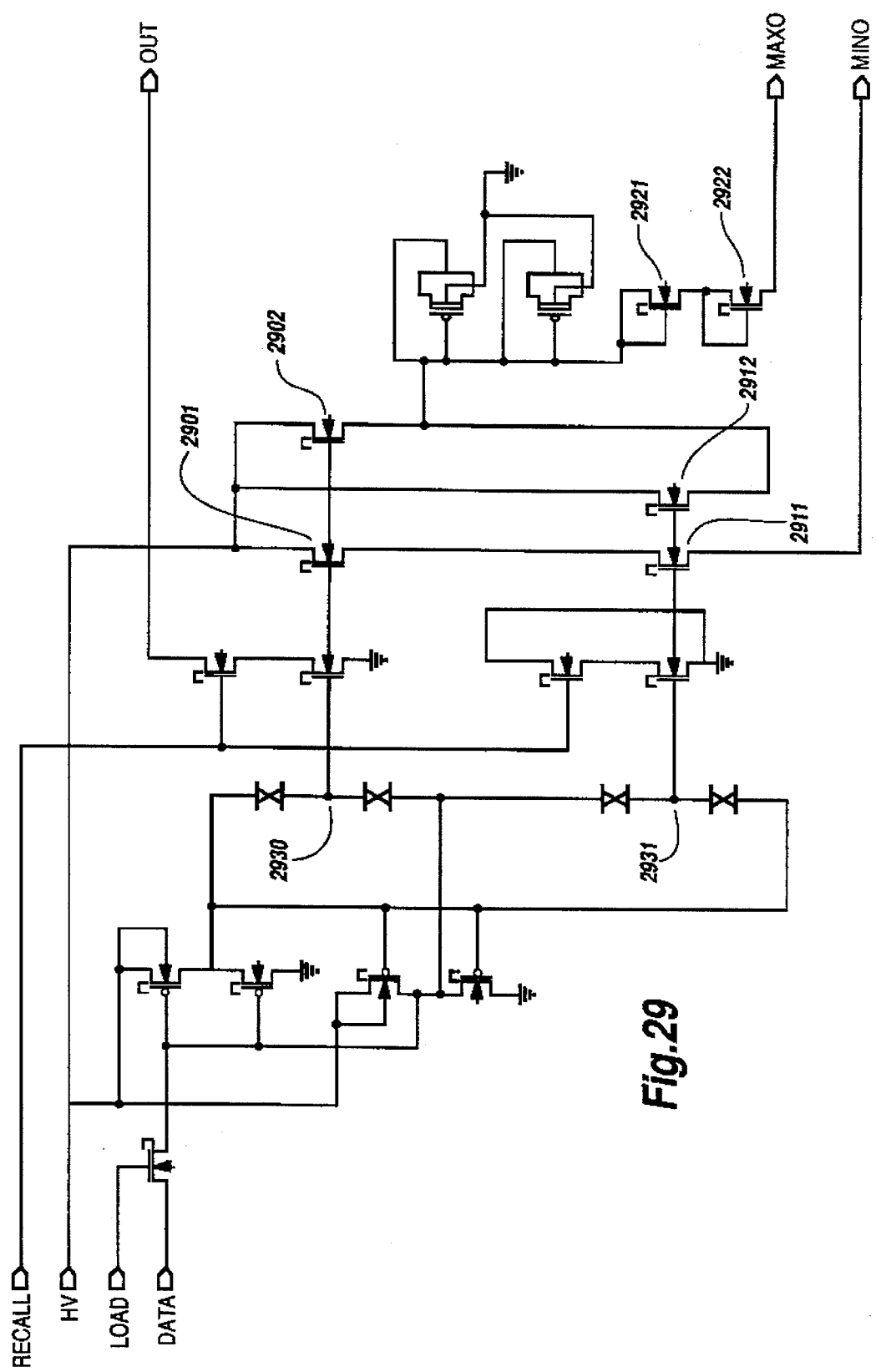

FIG. 26 schematically illustrate the high voltage programmer PROGSTOP that ramps node HV from high minus a threshold (about +4 volts) to +20 volts, detects programming completion, and then drops HV back to ground upon completion. Generator PROGSTOP includes charge pump NEWPUMP, programmable cells ROTSTOP, comparator EECOMP, diode-connected NMOSs 2610, NOR gate latch 2620, NAND gate 2630, and inverters. In turn, programmable cells ROTSTOP (FIG. 27) includes four programmable flip-flops PROGFF0 . . . PROGFF3, decoder PROGDEC, and four transmission gate pairs PROGTG0 . . . PROGTG3. FIG. 28 shows programmable flip-flop PROGFFj as including latches 2801 and 2802 and EEPROM memory cell PROGCELL which is shown in FIG. 29. PROGCELL is analogous to EECELL (FIG. 22) but with the two floating gates oppositely connected; that is, the floating gate connected to the gates of FETs 2901 and 2902 has the small tunneling capacitor connected to node tgate and the large control capacitor connected to node cgate, but the floating gate connected to the gates of FETs 2911 and 2912 has the small tunneling capacitor connected to node cgate and the large control capacitor connected to node tgate.

PROGFF operates as follows. Initially, presume SEL is high because this just selects one of the four PROGFF0 . . . PROGFF3 to be active, and presume STORE is low. With STORE low, the bit stored in latch 2801 (node N3) has its complementary bit stored in latch 2802 because transmission gate 2811 is nonconducting but transmission gate 2812 is conducting. Now the bit stored in latch 2801 (node N3) is set by the bit stored in PROGCELL: a high to input node SET pulls down node N4 of latch 2801 to make node N3 high, and then driving RECALL high in PROGCELL either leaves N3 high if the upper floating gate is programmed or pulls node N3 down if the upper floating gate is erased.

When STORE switches high, the transmission gates 2811–2812 switch conductivity and latch 2802 drives latch 2801 and effectively complements the previous bit at node N3. This new bit at N3, after two inversions, feeds the DATA input of PROGCELL. Thus as HV rises (as described in the following) one floating gate is programmed and the other erased because this bit is the complement of the bit currently stored in the floating gates of PROGCELL. The two floating gates, 2930 and 2931, program and erase in the same manner as described for cell EECELL but with opposite signs; that is, one floating gate programs while the other erases because the cgate and tgate node connections are reversed between 2930 and 2931. Thus as HV ramps up the floating gate which is being programmed ramps up to towards about +12 volts as in the broken line curve of FIG. 24 and the floating gate being erased ramps up to about +6 volts as illustrated in by the broken line curve of FIG. 25. The floating gates drive the gates of NMOS 2901–2902 and 2911–2912 which are connected between HV and MAXO, MINO. Two diode-connected NMOS 2921–2922 are also in series for MAXO. Thus the voltage on MAXO follows the greater of the voltages on the two floating gates (minus three thresholds whic is about 5 volts) because NMOS 2902 and 2912 are in parallel, and the voltage on MINO follows the lesser of the voltages on the two floating gates (minus a threshold) as HV ramps up because NMOS 2901 and 2911 are in series.

Figure 24:
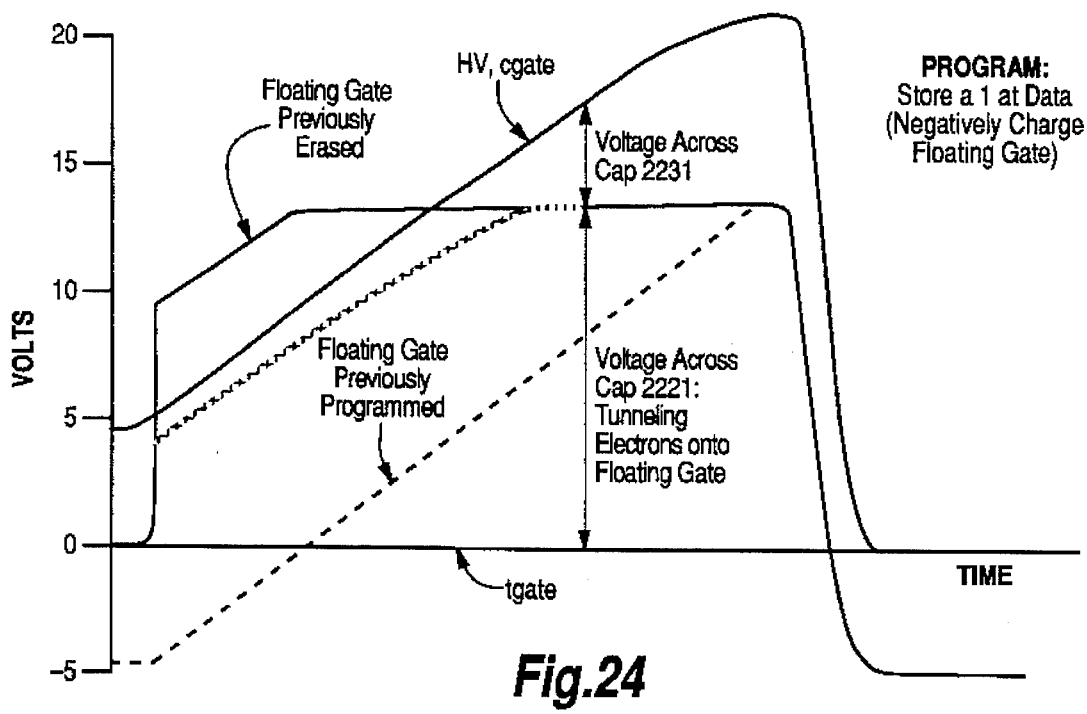
FIGS. 24–25 show voltages for programming and erasing nonvolatile memory cells in the first preferred embodiment.
Figure 25:
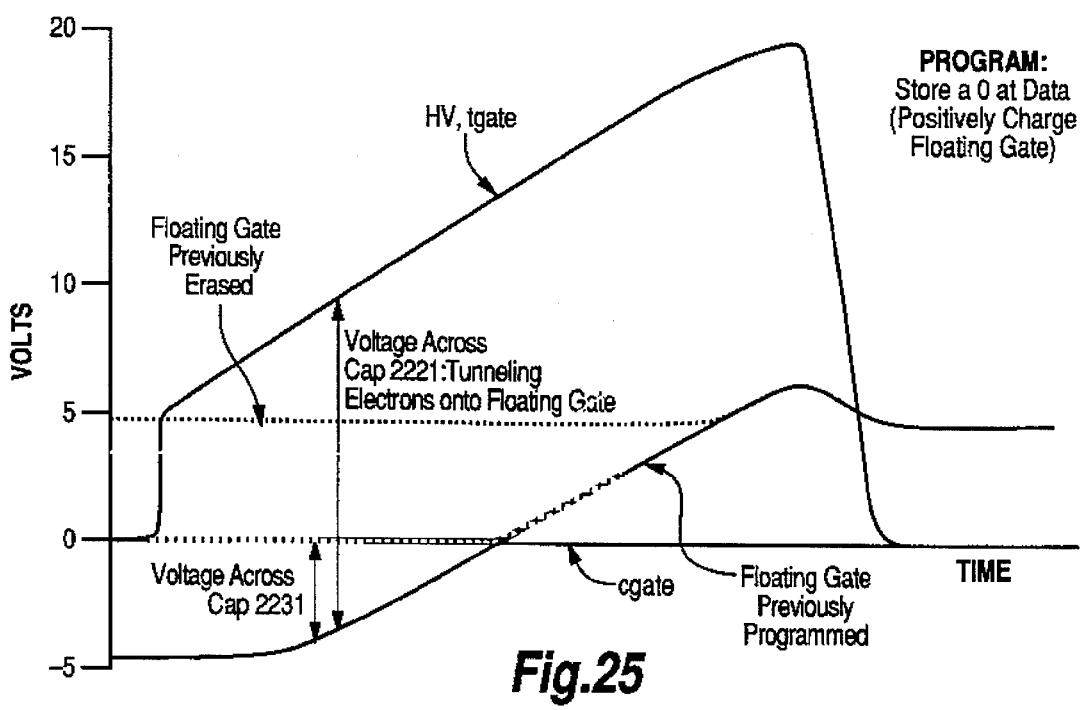
Figure 30:
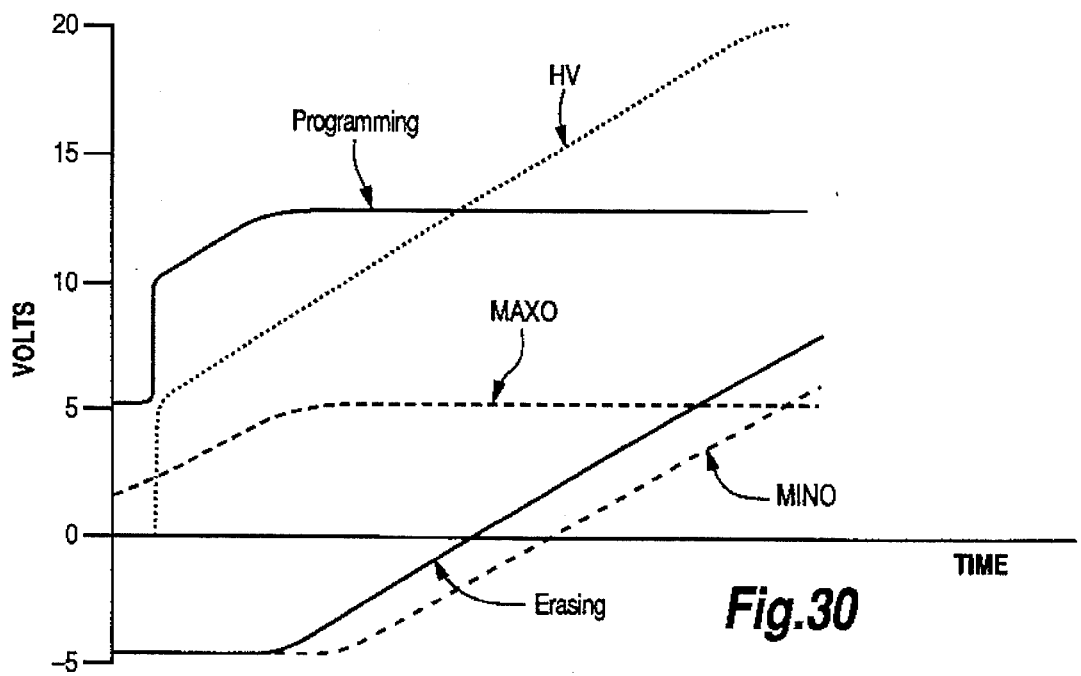
FIG. 30 shows voltages for programming control.
Figure 36:
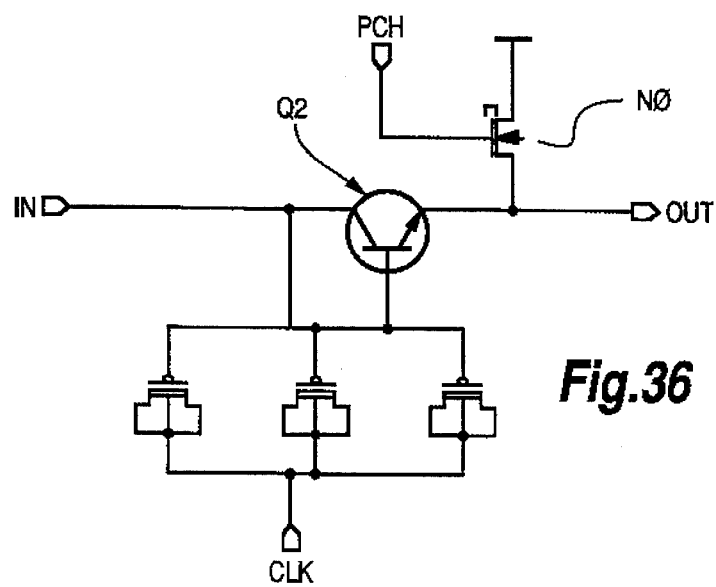

Hence, MAXO initially ramps with HV but levels off as the erased cell begins programming; recall FIG. 24. Conversely, MINO initially stays below ground but ramps up when the programmed cell begins erasing; see FIG. 25. FIG. 30 illustrates the voltages and shows how MINO exceeds MAXO when programming and erasing complete. This takes about a millisecond, but this use of endpoint detection and shut off avoids a timed programming or erasure cycle. The MINO and MAXO signals output each PROGFF as MINOI and MAXOI, respectively, and are selected to feed the MIN and MAX outputs of ROTSTOP by decoder PROGDEC (FIG. 31) which simply decodes the SEL0, SEL1 bits from bank decoder EEBANKDEC (FIG. 53) to produce the four outputs SEL0O, . . . SELO3 and their complements SELOB0, . . . SELOB3 which select one of PROGFF0 . . . PROGFF3 and turn on the corresponding one of the transmission gates PROGTG0 . . . PROGTG3 to pass the MINOI and MAXOI to the MIN and MAX nodes. The SEL0, SEL1 bits derive from Q0Q1Q2Q3 (see FIG. 53 and discussion of EEBANKDEC) and are decoded to activate PROGFFj when NOVREGj has the active read. The use of just the selected PROGFF again extends the lifetime by a factor of four.

PROGSTOP operates as follows. First, a power on RESET high plus a low STORE sets latch 2620 to output a high and thus hold charge pump NEWPUMP output HV at ground (see FIG. 32) along with nodes MIN, MAX, and CEN. Now a store request high at input STORE drives latch 2620 to output a low which, inverted, applies a high to the HV20V input of NEWPUMP and this turns on NEWPUMP to ramp up the voltage at output HV. The inverted low from latch 2620 also applies a high to the STORELAT input of ROTSTOP to activate decoder PROGDEC and thus select one of PROGFFj to generate MINO and MAXO signals. Then when the value of MIN rises past that of MAX, comparator EECOMP goes high; see FIG. 38. Now, CEN will be high once HV exceeds high plus four thresholds from NMOS chain 2610, so comparator EECOMP going high switches NAND gate 2630 low to flip latch 2620 and turn off charge pump NEWPUMP to stop the programming and erasing. See FIG. 26.

FIG. 32 shows charge pump NEWPUMP as including oscillator EEOSC, divider NOVCLK, pump chain PCHN, high voltage capacitors PC0, PC2 and 2 Megohm resistor R0 connected to output node HV, and enable input HV20V. The capacitors and resistor form an RC filter for the high voltage output.

Figure 33:
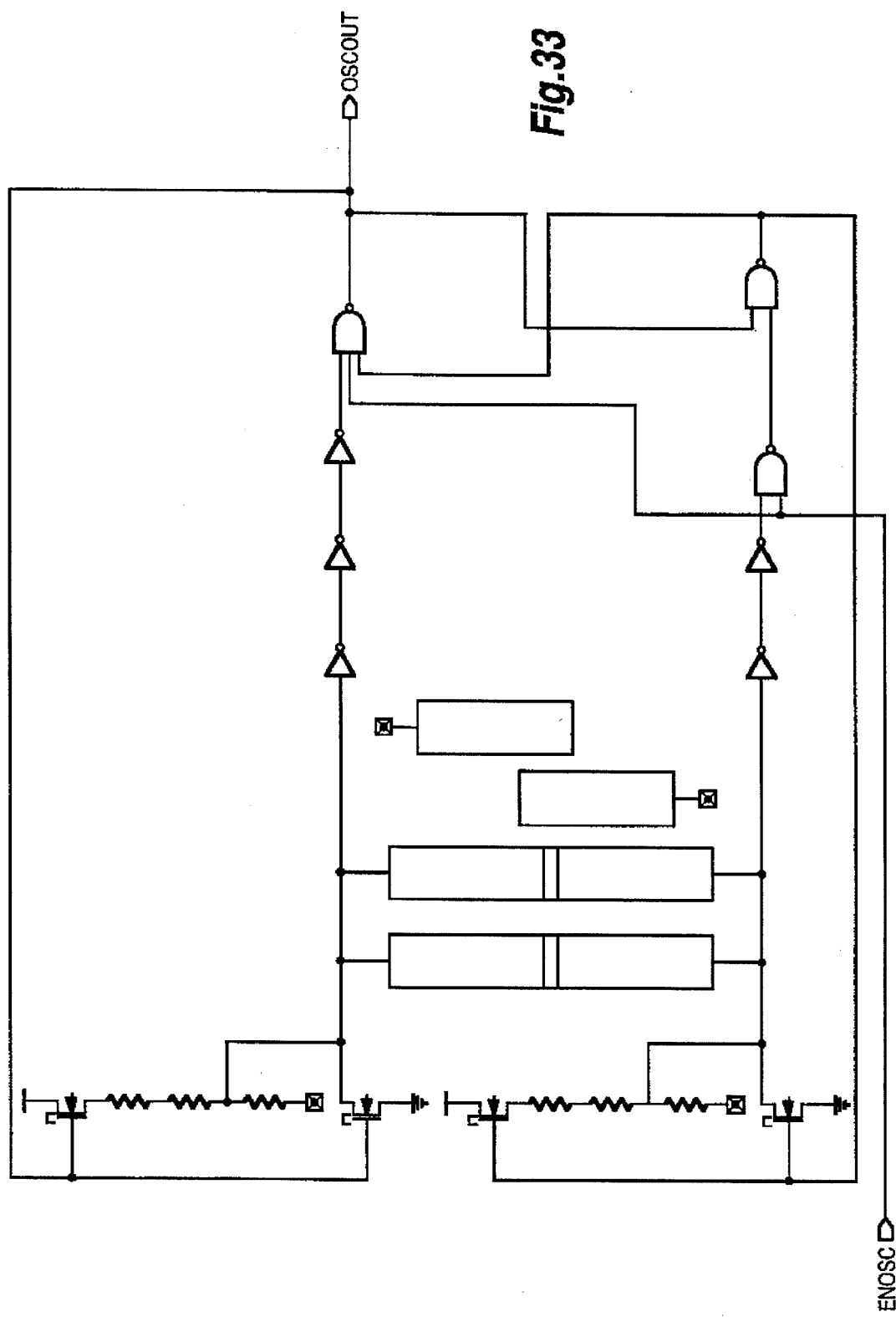
Figure 38:
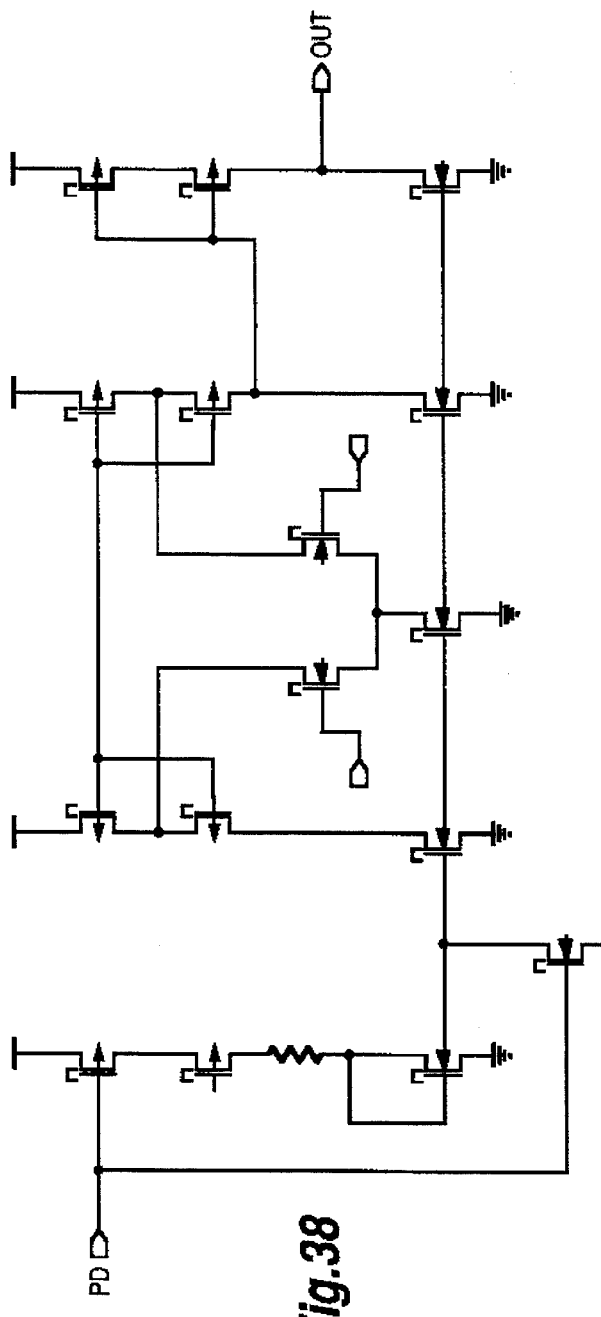

FIG. 33 shows oscillator EEOSC which is similar to oscillator OSC of FIG. 12 but with only metal level options for changing the capacitors. EEOSC typically oscillates at about 150 KHz with a symmetrical square wave output at OSCOUT. A low at enable node ENOSC (which connects to HV20V) will drive NAND gates in each ring oscillator to high and stop oscillations. Thus HV20V high enables EEOSC.

Figure 37:
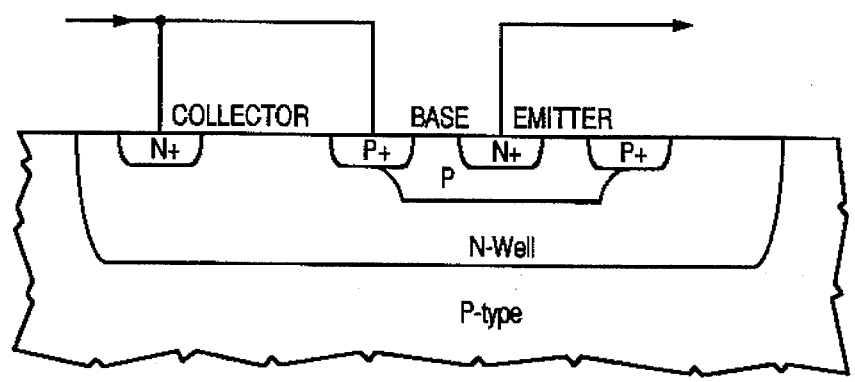
FIG. 37 is a cross sectional elevation view of the charge pump diode of the first preferred embodiment.
Figure 31:
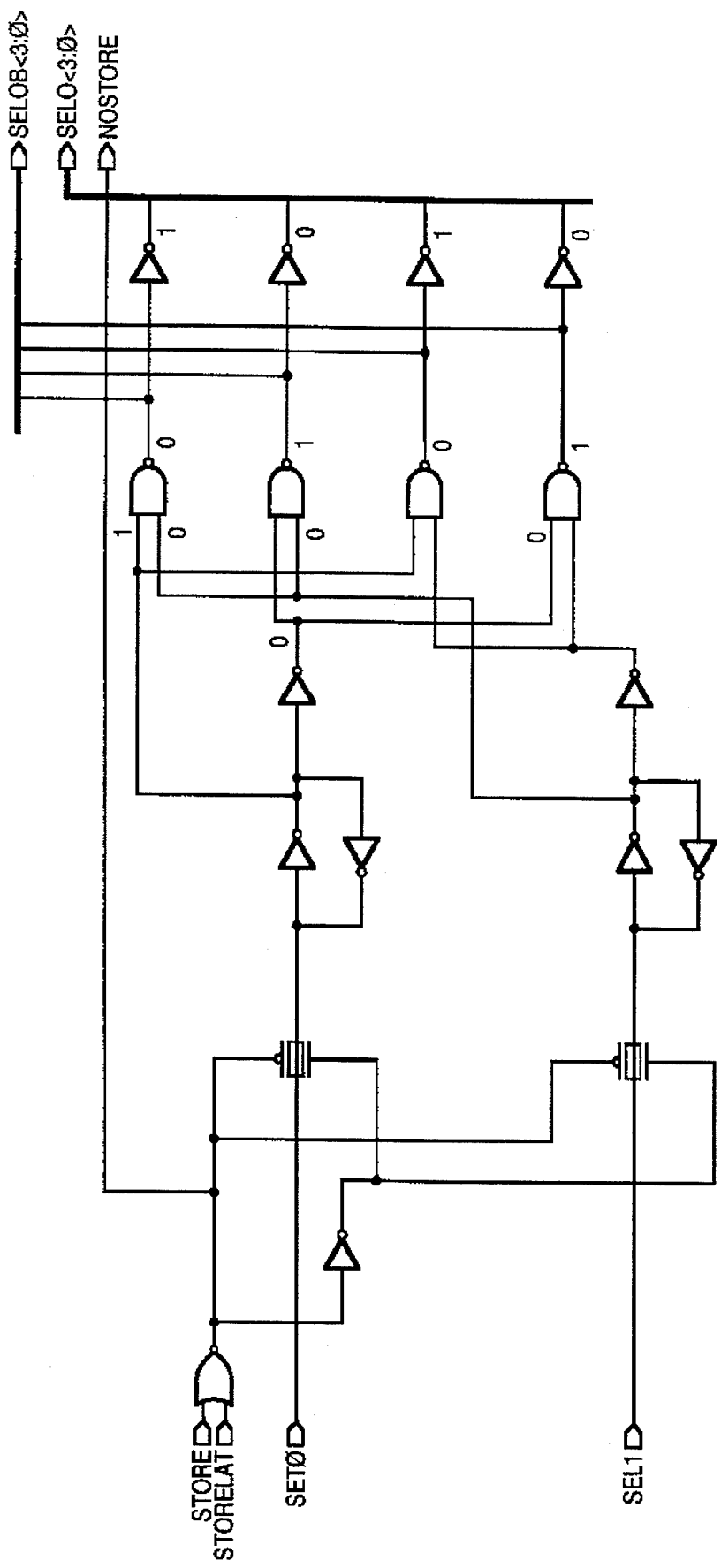

FIG. 34 shows NOVCLK as a NOR gate latch with output of EEOSC and its complement driving the latch inputs to generate the clk and clkb inputs to clock the series-connected pump cells PB0, PB1, . . . PB9 of PCHN as shown in FIG. 35; note that PB7, PB8, and PB9 are optional by metal level connections. Each pump cell PBj has the structure of the cell shown in FIG. 36 and includes diode-connected npn transistor Q2, high voltage capacitors PP0, PP1 (and optional PP2) and high voltage n-channel FET N0. FIG. 37 is a cross sectional elevation view of the diode-connected Q2 and illustrates the isolated collector of Q2; that is, the collectors are not common with the substrate.

Indeed, the collector will be at a high voltage and the p-substrate will be near ground, so the collector-substrate will be reversed biased to up to 20 volts. If a diode-connected FET had been used instead of Q2, then for an n-channel FET the back bias of the p-well will increase as the IN and OUT nodes charge up and the diode will be stop functioning; and for a p-channel FET the n-wells will charge up separately in each pump cell. FIG. 37 also shows the base surrounding the emitter with the intrinsic base border at the extrinsic base. U.S. Pat. No. 4,862,310 discusses this diode structure in greater detail. Of course, using complementary structures with pnp transistor will provide for a charge pump which generates negative voltage relative to the substrate.

Pump chain PCHN operates in the typical charge pump manner as follows. First, HV20V goes high to turn on FET N0 in each cell PBj and pull up both the IN and OUT nodes to within a threshold of high (about +4 volts), note that the IN node of PB0 is always diode-connected to high. Thus the capacitors PP0, PP1 have a charge of about +4 volts. Next, when clkb makes a low-to-high transition, the low voltage plates of capacitors PP0, PP1 jumps from ground to about +5 volts, so the IN node will jump from about +4 volts towards +9 volts and diode Q2 will pass charge to the OUT node and PB1. Then when clkb returns low, the low voltage plates of capacitors PP0, PP1 will again drop to ground and the other plates will drop below +4 volts, but diode Q2 prevents the higher voltage at the OUT node from decreasing. The diode connected high at the IN node of PB0 will again charge up the capacitors to +4 volts and the cycle will repeat when clkb returns high.

When clkb is high, clk is low and the capacitors PP0, PP1 of PB1 will have one plate grounded and the other plate will be charged up towards +9 volts by PB0 as just described. Indeed, the voltage will ramp up towards +9 on successive transitions of clkb. Now when clk goes high and jumps the low voltge plates to +5 volts, the IN node will jump towards +14 volts and diode Q2 will pass charge to the OUT node and PB2. And when clk returns low, the IN node will drop below it previous level, but clkb will be going high to pass more charge from PB0 and restore the voltage on the capacitors. In this fashion, the IN node of PB1 ramps up towards +9 volts and the OUT node ramps up to +14 volts.

PB2 similarly operates with clkb driving its capacitors to have the IN node driven by PB1 ramping up to +14 volts and the OUT node thus ramping up to +19 volts. Similarly, PB3, PB4, . . . have successively have higher voltage IN nodes and consequently higher voltage OUT nodes. The OUT node of PB6 (or optionally PB7, PB8, or PB9) connects to HVOUT and the RC filter to node HV. FIG. 32 also shows that when HV20V is low and inactivating EEOSC, node HV is pulled to ground by FET NHV1; whereas, when HV20V switches high, node HV is immediately pulled up to about +4 by FET NVH0 and then ramps up towards +20 volts by EEOSC clocking PCHN. The ramp rate is roughly 15 volts in 1 millisecond.

Counter Control

Figure 39:
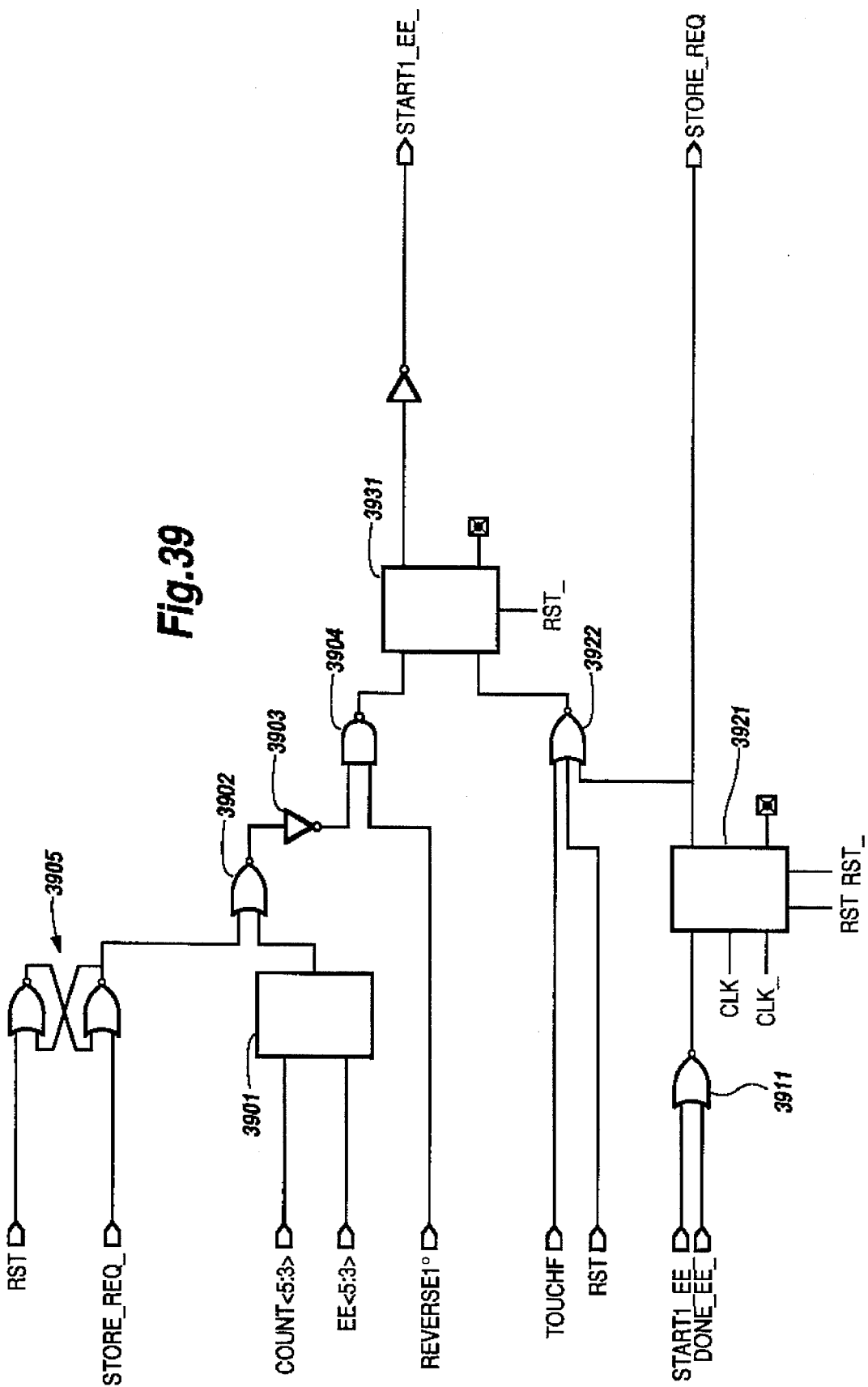

FIG. 39 shows that control block EE_CNTL 622 includes block UPDATE 3901 which NANDs the bitwise exclusive NOR of the three most significant bits on busses COUNT<5:0> and EE<5:0>, NOR gate 3911, flip-flop 3921, and RS flip-flop 3931. EE_CNTL 622 operates as follows. First, the power up reset RST high pulse resets flip-flop 3921 to Q=0 and Q_=1 which puts STORE_REQ low. The RST high pulse further sets the NOR gate latch 3905 to output a high to NOR gate 3902; latch 3905 remains in this state until STORE_REQ goes high. The RST high pulse also drives NOR gate 3922 to send a low to reset RS flip-flop 3931 and thereby set START1_EE_ high (inactive).

When a high pulse arrives at REVERSE1 (from block CNTL, see FIG. 7) it drives NAND gate 3904 to output a low pulse to set RS flip-flop 3931 high and thereby make START1_EE_ active low. Note that a change from state 100 to state 000 (see FIGS. 9 and 10) when DONE_ goes low leads to the REVERSE1 high pulse. Next, when DONE_EE_ (from block TIMER and FIG. 51) goes low it drives NOR gate 3911 high which sets flip-flop 3721 high when clocked by CLK to thereby put STORE_REQ high. Note that DONE_EE_ goes low after a one second delay from START1_ (from block CNTL and FIG. 7) going low, and START1_ goes low due to a change from state 000 to state 001 or on to state 100.

STORE_REQ high both triggers a storage of the bits on COUNT<5:0> in the EEPROM memory and a switching of latch 3905 to a low output to NOR gate 3902. Latch 3905 continues to output a low regardless of STORE_REQ until another power up reset RST pulse resets it. Thus after the first STORE_REQ high following a power up reset, latch 3905 has no influence.

When any of the three most significant bits on busses COUNT<5:0> and EE <5:0> differ, UPDATE 3701 outputs a high to NOR gate 3702 which inverts it as does inverter 3903 to feed a high to NAND gate 3904. Then a high pulse at REVRESE1 will again set RS flip-flop 3931 to put START1_EE_ low (active) and again drive STORE_REQ high when DONE_EE_ goes low following START1_ going low. In short, each REVERSE1 high puls will lead to a STORE_REQ either when one or more of the three most significant bits on busses COUNT<5:0> and EE<5:0> differ or when a power up reset has just occurred.

Wiper Counter

Figure 42:
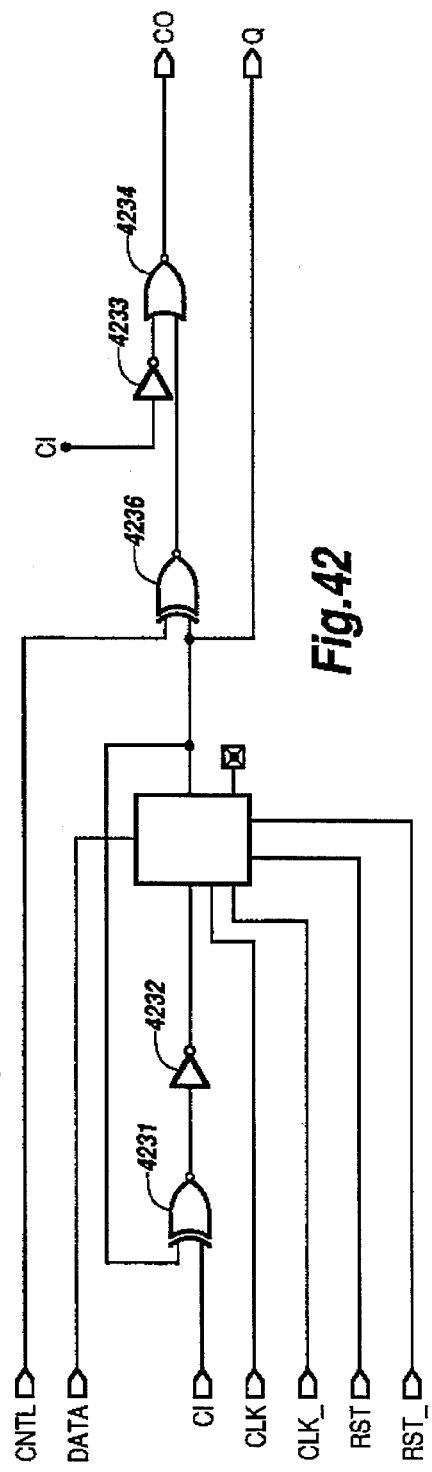
Figure 40:
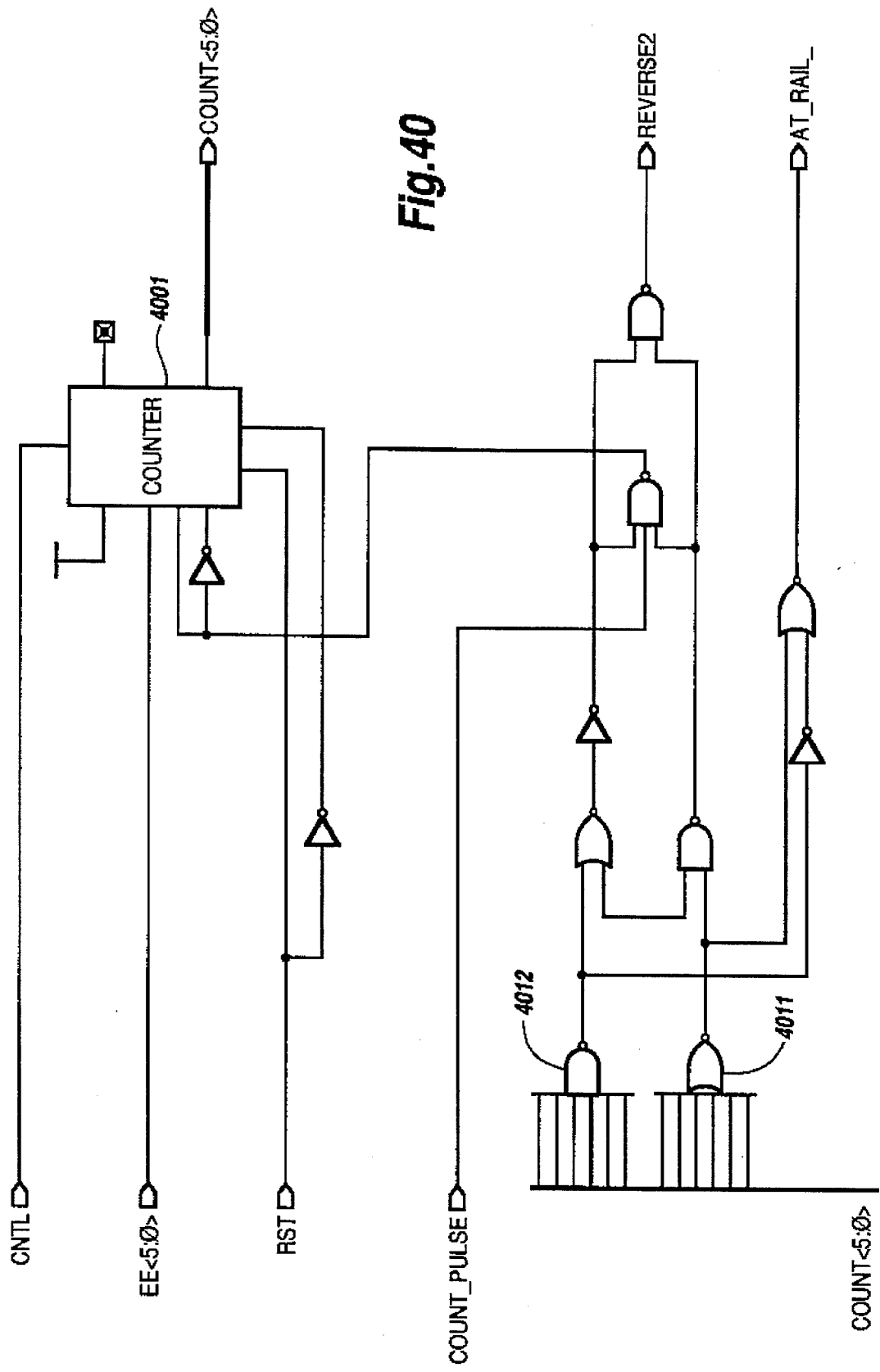
Figure 43:
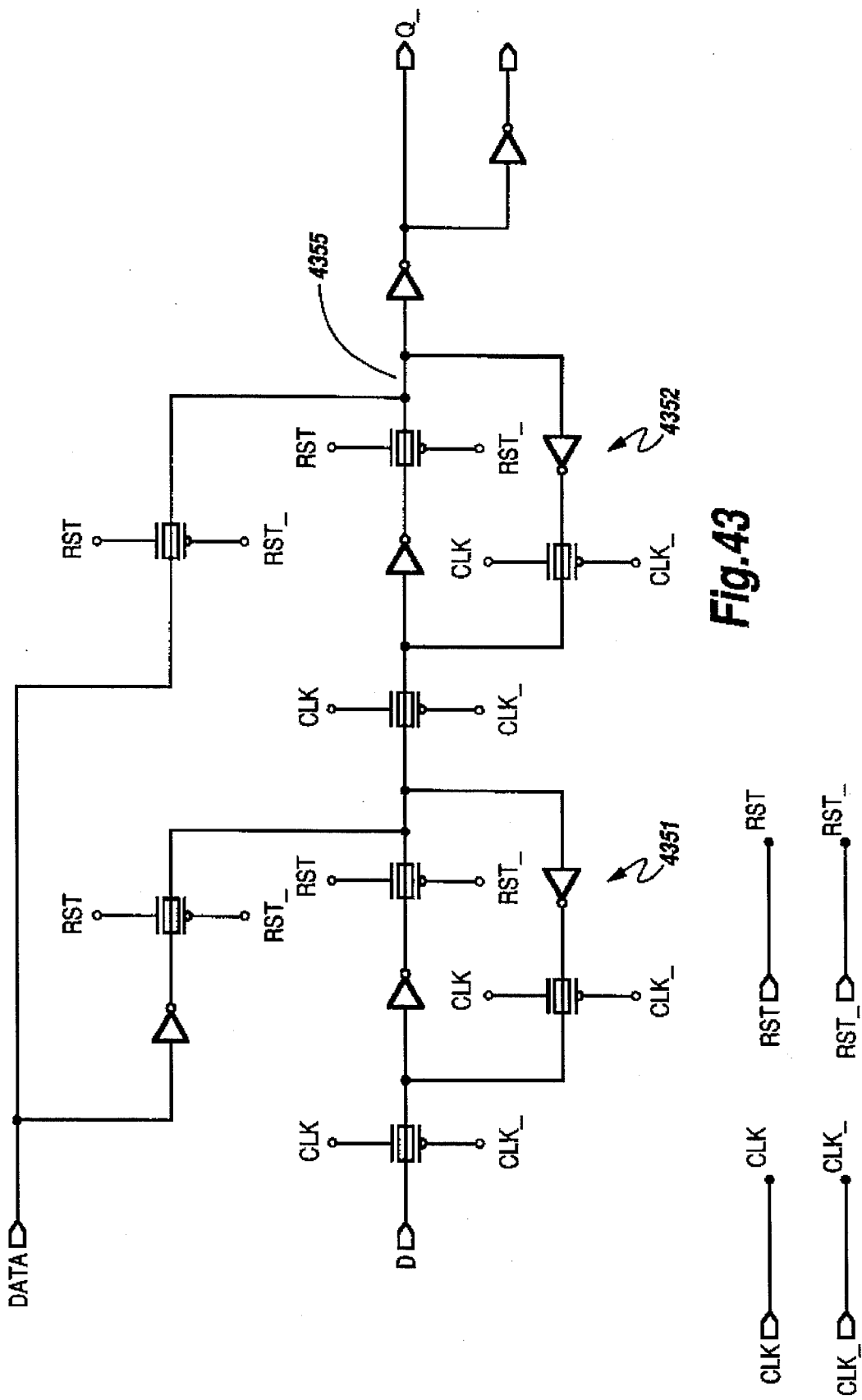

FIG. 40 shows that counter block WIPER_COUNTER 630 includes 6-bit counter 4001 connecting to 6-bit bus COUNT<5:0> as output and 6-bit bus EE<5:0> as input. COUNT_PULSE clocks counter 4001 except when all bits on bus COUNT<5:0> are 0 (this indicates that the wiper is at the low end of the resistor array and NOR gate 4011 goes high) and CNTL is high or when all bits are 1 (the wiper at the high end of the resistor array and NAND gate 4012 goes low) and CNTL is low. In either of these cases REVERSE2 goes high. FIG. 41 shows counter 4001 made of six parallel counter bit devices 4120–4125 with each counter bit device illustrated in FIG. 42; the storage flip-flop of each counter bit is shown in FIG. 43. Except during power up reset RST is low and RST_ is high, so the transmission gates connecting DATA to the two memory cells 4351–4352 of the storage flip-flops are nonconducting to isolate DATA and the upper transmission gates within the memory cells are conducting. When COUNT_PULSE is low (and the counter is neither 000000 nor 111111) clk is low into counter 4001 so the lower transmission gate in memory cell 4352 is conducting and the bit at node 4355 is held by the feedback of the inverters; this bit appears at output Q and thus on bus COUNT<5:0>. Clk low also implies that the transmission gate connecting memory cells 4351 and 4352 is nonconducting to isolate the memory cells, that the lower tranmission gate within memory cell 4351 is nonconducting to prevent the inverter feedback, and that the transmission gate connecting memory cell 4351 to input D is conducting so the bit at D controls memory cell 4351. Now FIG. 42 shows that the output Q feeds back through an XOR (made of XNOR gate 4231 plus inverter 4232) to the D input. The other input to the XOR is the carry in node CI which connects to the carry out node CO of the next less significant bit device 4120–4124 in counter 4001, and CI connects to high for the least significant bit device 4120. Thus when CNTL is low (WIPER_COUNTER is counting up) and COUNT_PULSE makes a low to high transition, the expected addition and carry happens: if CI is low (no carry in), then CO is low (no carry out because inverter 4233 drives NOR gate 4234 low, and Q feeds back to D because the XOR of Q and a low is Q, and the stored bit remains unchanged. Contrarily, if CI is high (carry in a 1), then the XOR of CI and Q complements Q to D, so the stored bit switches (i.e., 1+0 is 1 and 1+1 is 0 plus a carry out 1), and XNOR gate 4236 complements Q because CNTL is low. Thus CO is high if Q is high (i.e., 1+1 generates a carry out 1) because both inputs to NOR gate 4234 are low, and CO is low if Q is low (i.e., 1+0 does not generate a carry out).

Conversely, if CNTL is high (WIPER_COUNTER is counting down) then the expected subtraction and borrow occurs: CI high indicates that the next less significant bit needd to borrow, so in addition to the complementing of Q to switch the stored bit, XNOR gate 4236 passes Q and CO goes high if Q is low to indicate to the next more significant bit that a borrow is needed, but CO stays low if Q is high and can supply the borrow needed by next less significant bit.

FIG. 43 also shows that on a reset (RST high and RST_ low) the 6 bits stored in nonvolatile memory EE and available on bus EE<5:0> (which connects to the DATA inputs of bit devices 4120–4125) are stored in counter 4001 because RST, RST_ make conducting the transmission gates connecting DATA to the memory cells 4351–4352.

Counter Decoder

Figure 44:
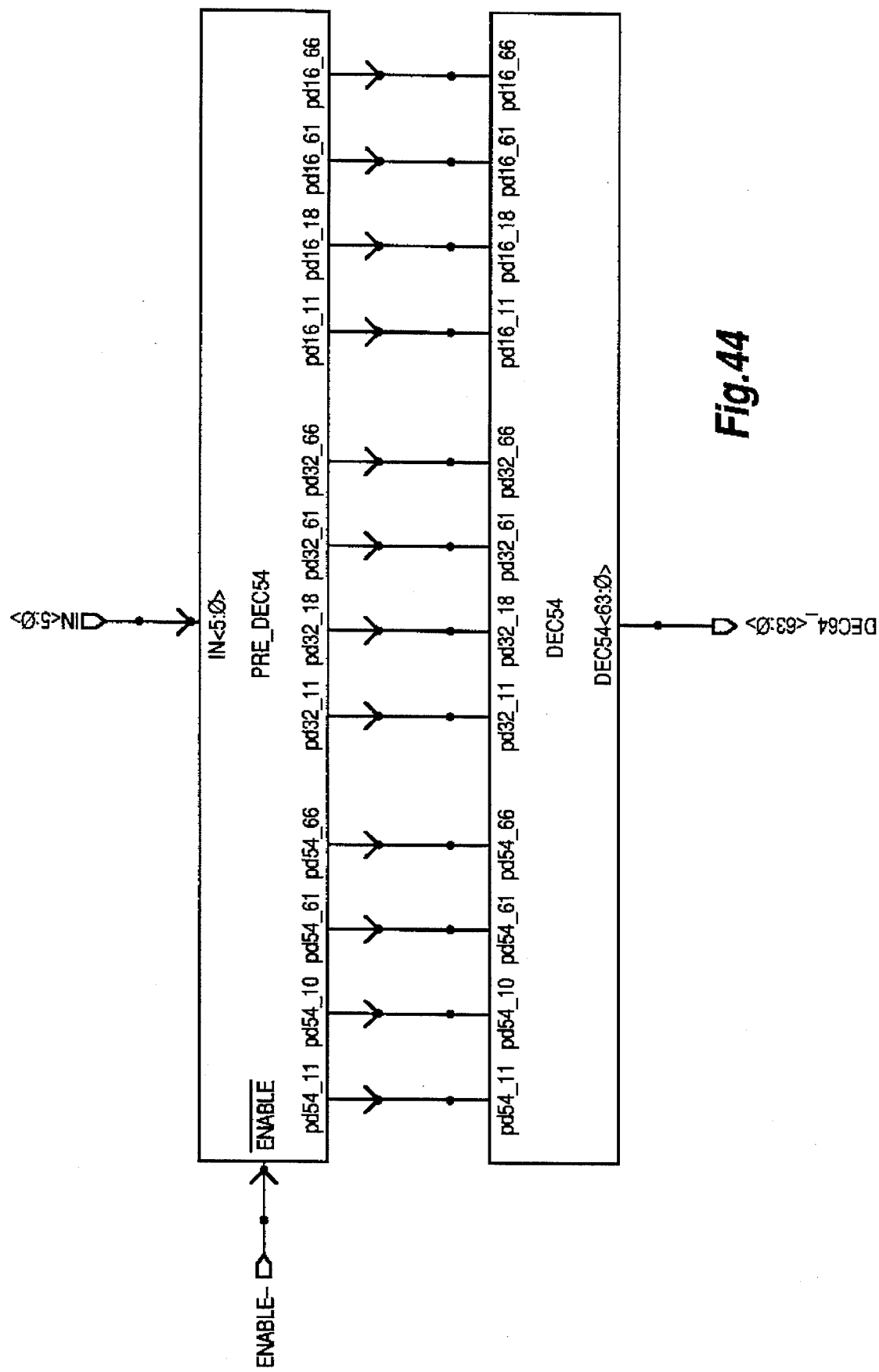

FIG. 44 schematically show decoder block DECODER64 632 which is a straightforward binary decoder of 6 bits to 64 lines.

Resistor Array

Figure 45:
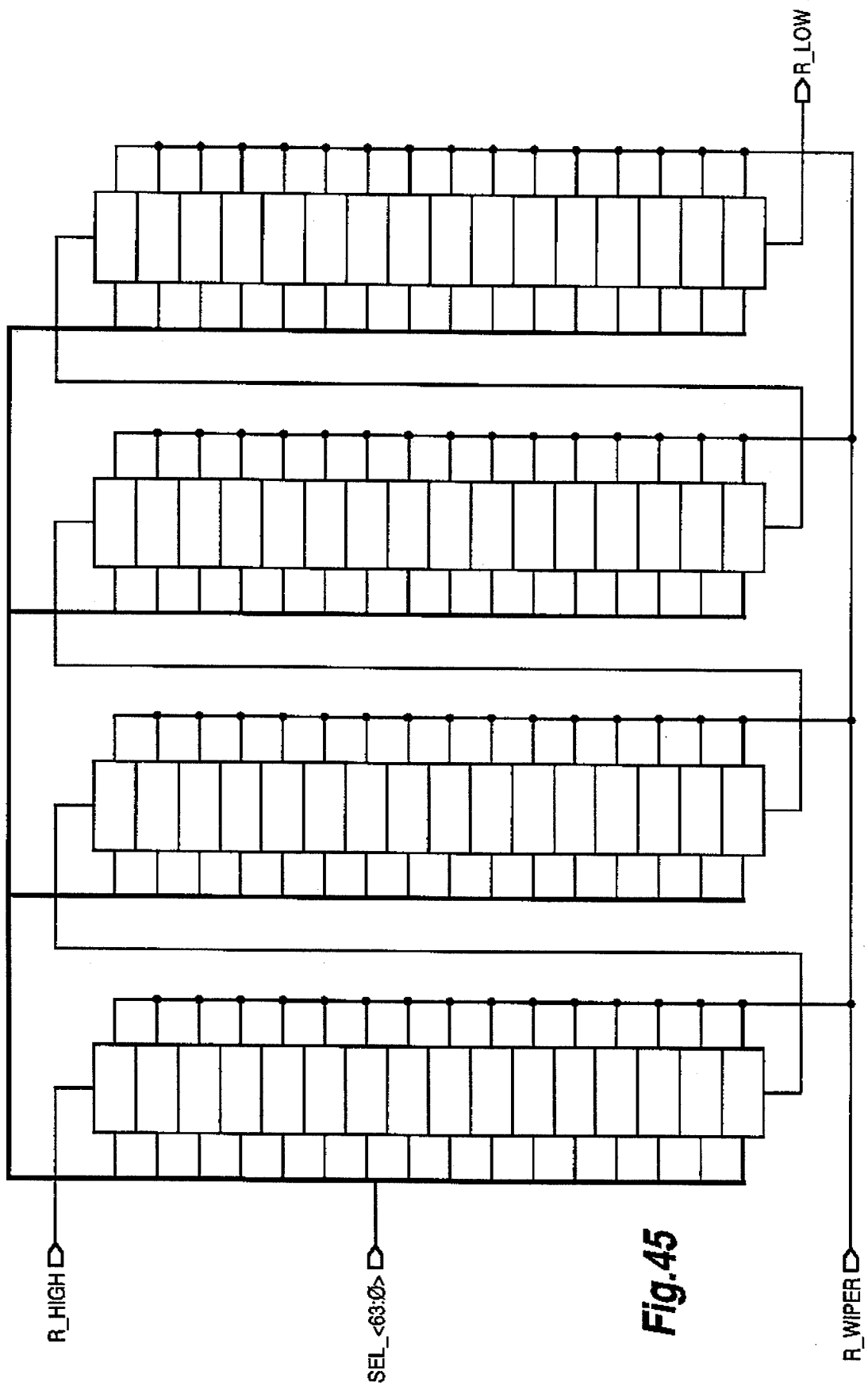

FIGS. 45 and 46 schematically show the resistor array block R_ARRAY 640.

Input Logic

Figure 47:
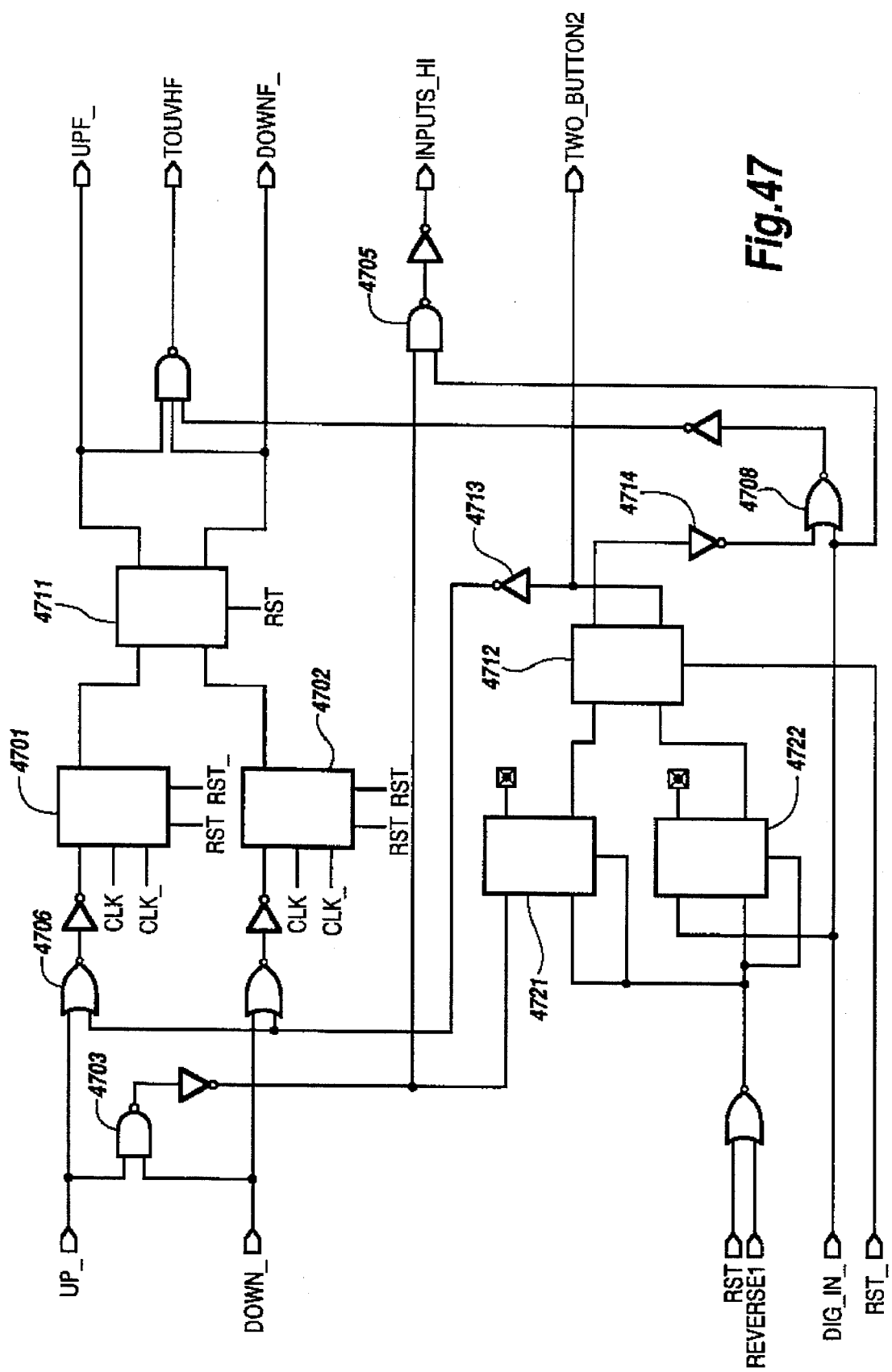
Figure 48:
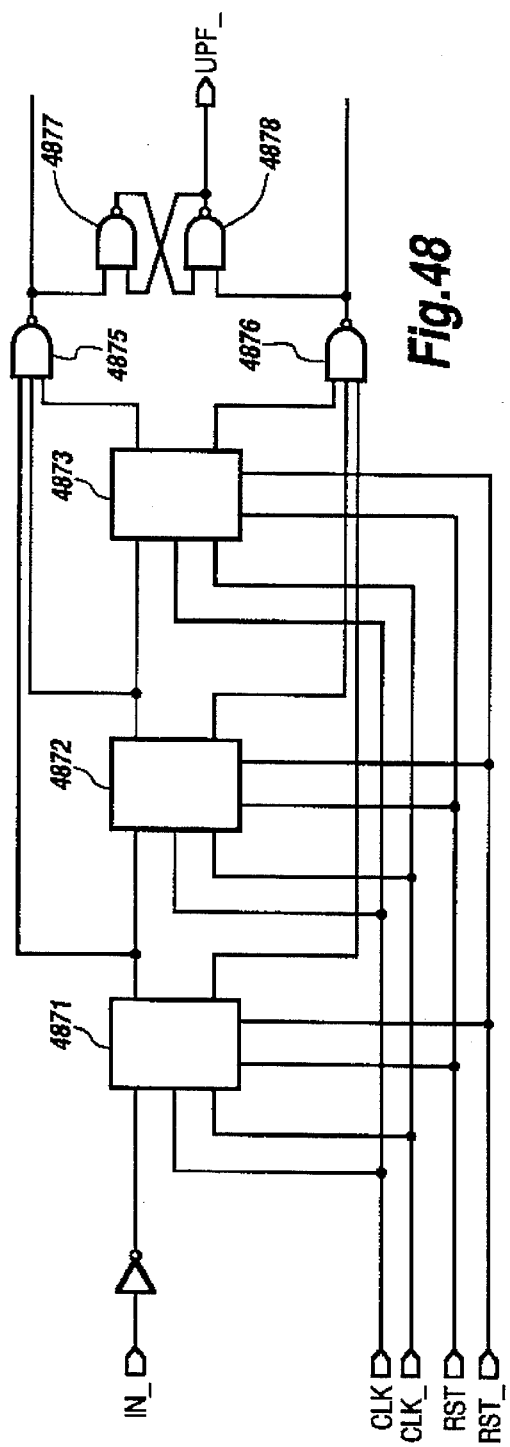
Figure 49:
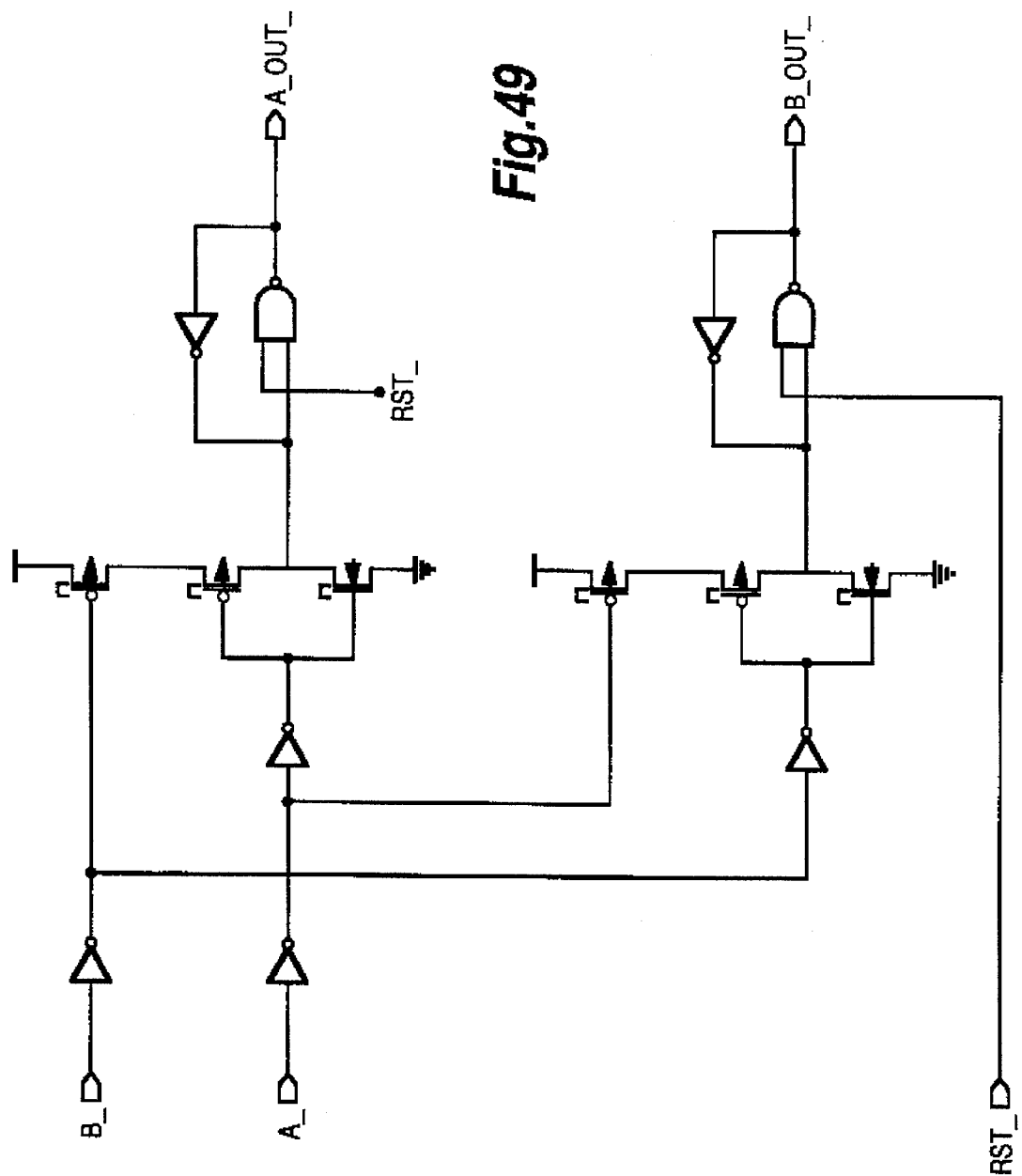

FIGS. 47, 48, and 49 schematically show logic INPUTS 650 with FIG. 47 the overall schematic diagram and digital filters 4701 and 4702 shown in FIG. 48 and rejection blocks 4711 and 4712 shown in FIG. 49. INPUTS operates as follows. First, input nodes UP_ and DOWN_ are pulled up by 100 Kohm resistors (see the lefthand portion of FIG. 6), node RST is low and node RST_ is high except during a power up reset (see FIGS. 56A and 56B), node REVERSE1 is low as seen from FIG. 7, and node DIG_IN is pulled up by a 100 Kohm resistor on the input side of TTL-level input buffer INBUFTTL. Now consider a low-going pulse at either input node UP_ or input node DOWN_. The pulse will drive NAND gate 4703 high and this will be inverted to drive NAND gate 4705 high and output INPUTS_HI low. Similarly, a low pulse at input node DIG_IN will direct drive NAND gate 4705 high and output INPUTS_HI low. This low at INPUTS_HI drives NAND gate 801 in clock CLK 612 high (see FIG. 11) and turns on oscillator OSC. (Presume that IDLE and TIMER_NOT_RUNNING were high so OSC was not already running.) OSC continues running until INPUTS_HI returns high, and this also resets divider CLK_DIV6 which has been counting the periods of OSC. If the low going pulse at UP_, DOWN_, or DIG_IN lasts for at least 64 OSC periods (which is selectable as previously described), then CLK_DIV6 outputs a low which drives CLK low and CLK_ and CLKOUT both high. And if the low pulse persists, then every 64 periods of OSC CLK_DIV6 will switch as will CLK and CLK_.

Reject memory 4712, schematic shown in FIG. 47, resets to high outputs at A_OUT_ and B_OUT_, so consider the case of these outputs high. Inverter 4713 will then feed highs to NOR gates 4706 and 4707 and inverter 4714 will feed a high to NOR gate 4708. Thus the low pulse at either UP_ or DOWN_ will, in addition to switching CLK and CLK_ as described in the preceding paragraph, provide a low input to the IN_ input node of either digital filter 4701 or 4702, respectively. FIG. 47 schematically shows digital filters 4701 and 4702 which reset to OUT_ as high. Now the three flip-flops 4871–4873 reset to the Q=0 state, so digital filters 4701 and 4702 each have NAND gate 4875 initially with three 0 inputs and NAND gate 4876 with three 1 inputs; this put the latch formed by NAND gates 4877–4878 into the OUT_ high state. Now the high at IN_ propagates through flip-flops 4871–4873 in three cycles of CLK/CLK_ and switches latch 4877–4878 to the OUT_ low state. Hence, digital filters 4801 and 4802 filter out short low pulses at UP_ or DOWN_, and OUT_ goes low only if the low going pulse at UP_ or DOWN_ persists for at least 375 microseconds.

Once a low pulse at UP_ or DOWN_ persists low enough to pass digital filter 4701 or 4702, the corresponding low going OUT_ from this filter along with the still high OUT_ from the other filter passes reject memory 4711 to have A_OUT_ or B_OUT_ low, respectively, and thus UPF_ or DOWNF_ low, respectively, plus TOUCHF high in either case. A low pulse at DIG_IN passes NOR gate 4708 to also drive TOUCHF high without any minimum pulse duration required. In the event that a low pulse appears at both UP_ and DOWN_ approximately simultaneously, both filter 4701 and 4702 will have OUT_ going low and reject memory 4711 will only pass the first OUT_ going low and reject the second as long as the first OUT_ persists, and once the first returns high then the second low passes through reject memory 4711. If filters 4701 and 4702 both switch OUT_ low on the same CLK cycle, then reject memory 4711 will not pass either. Hence, this prevents driving counter in both directions at once.

The R_ and RST_ inputs to RS flip-flops 4721 and 4722 are both high, so these block digital inputs while pushbuttons are processed, and vice versa.

Up/Down Control

FIG. 50 shows up/down controller UD_CNTL 652 which includes flip-flop 1501 that stores the up/down control bit: if Q is low, then CNTL is low and WIPER_COUNTER counts up, and if Q is high, the CNTL is high and WIPER_COUNTER counts down. Note that a reset puts Q low and thus the initial condition after a power up has WIPER_COUNTER counting up. When the inputs REVERSE1, ..., UPF_ in the lefthand portion of FIG. 50 provide a signal to clock flip-flop 1501, inverter 1503 feeding Q back to the D input insures that Q switches: from low to high or from high to low, and thereby reverses the count direction of WIPER_COUNTER. The inputs REVERSE1, ..., UPF_ provide a clocking signal when:

Timer

FIG. 51 timer TIMER 660 as made of multiplexer 1601 which can pass the CLK signal or a high, divider 1602 (FIG. 52) which divides the output of multiplexer by four and sixteen at output nodes 0.1s and 1s, respectively, pulse generator 1603 which has the same structure as that of FIG. 8, and logic gates. When any of the inputs START0_1_, START1_, and START1_EE_ goes low, then NAND gate 1605 goes high to select CLK to pass through multiplexer 1601 to divider. Timer TIMER operates as follows. First, when the inputs START0_1_, START1_, and START1_EE_ are all inactive high, inverter 1609 and NAND gate 1610 are both low, so NAND gates 1611 and 1612 are both high and NAND gate 1614 applies a low to the IN of pulse generator 1603. Multiplexer passes the power supply constant high to divider 1602, so the 0.1s and 1s outputs are both low (presuming a reset upon power up) and these lows feed the other inputs of NAND gates 1611–1612. Now when one of the inputs START0_1_, START1_, and START1_EE_ goes active low, then multiplexer 1601 switches to pass CLK to divider 1602 and either inverter 1609 or NAND gate 1610 goes high. This high feeds one of NAND gates 1611–1612, but the other inputs are lows from divider 1602. However, as soon as four or sixteen CLK cycles have passed to divider 1602, its 01.s or 1s output goes high and one of NAND gates 1611–1612 goes low to drive NAND gate 1614 high and thus trigger pulse generator to output a high which the next CLK cycle resets to low. However, inverter 1620 inverts this high pulse to drive a low pulse at node DONE_.

TTL Input Buffer

FIG. 53 shows input buffer INBUFFTL 670 as a buffer with hystersis centered about a TTL level (1.5 volts). The larger total gate width of the n-channel FETs (about seven times the total gate width of the p-channels) in the left inverter leads to the symmetrical switching about 1.5 volts.

Test Mode Buffer

FIG. 54 shows test mode buffer IN_BUF 672 as a simple enable buffer which will pass signals from IN to OUT when EN is high; otherwise OUT is held low.

Test Mode Detector

Figure 55:
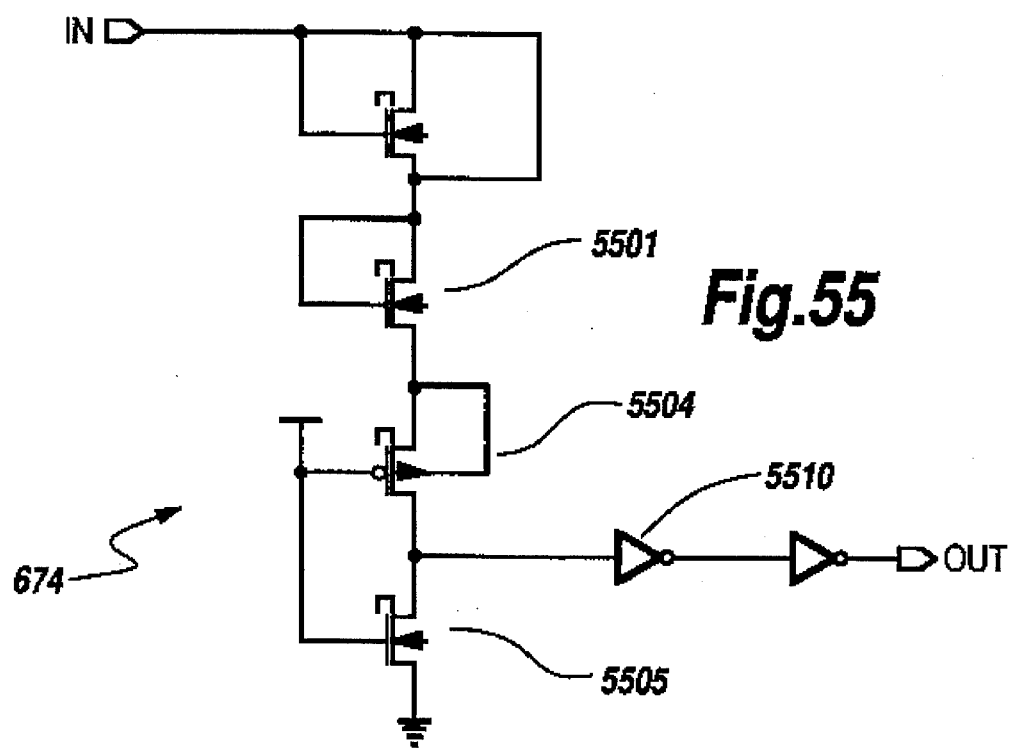

FIG. 55 shows test mode detector HV 674 as a high voltage detector which switches OUT from low to high when the input IN rises to about 7 volts. Detector HV has diode connected n-channel FET 5501 with a large gate width to length, so once the voltage across the diode reaches the threshold voltage (about 1 volt) there is very small resistance. Similarly, the p-channel FET 5504 also has a large gate width to length ratio and low resistance when turned on, whereas the n-channel FET 5505 has a very small gate width to length ratio to provide a resistive path to ground. Thus when the voltage at IN is two thresholds (about 2 volts) above the power supply, FETs 5501 and 5504 turn on to pull up the input of inverter 5510 and thereby drive OUT high. Inverter 5510 has a low threshold (width n-channel and narrow p-channel) to insure rapid switching of OUT when the voltage at IN reaches two thresholds above the power supply.

The switching of OUT from low to high disables decoder DECODER64 632, puts memory EE 620 into test mode, and enables input buffer IN_BUF 672 to pass signals from Rw to the TESTCLK input of clock CLK 612.

Power Up Reset

FIGS. 56A and 56B shows power up reset circuit PU 676 which includes the power up reset pulse generator in FIG. 56A and the two-button operation circuit in FIG. 56B. In particular, the 1 Mohm resistor 5605 plus 100 Kohm resistor 5610 and capacitor 5611 insure that when power is first turned on inverter 5620 will have a low input and a high output so that RST goes high, but after capacitor 5611 charges up through resistor 5610, inverter 5620 switches low and thus RST returns low.

Further, when terminal DC is connected to the power supply (see broken line in FIG. 2) to implement one-button operation, then on power up when the reset RST has a high pulse, transmission gate 5630 conducts and the high from terminal DC through node DOWN_ sets memory cell 5633 to have a high output. Once the reset pulse drops back low the memory cell 5633 is isolated and holds TWO_BUTTON low to indicate one-button operation.

Process Implementation

Control unit 100 may be fabricated in standard CMOS processing provided with the extra dopings to achieve the diodes of FIG. 37. Variations in the circuitry will permit use of NMOS or PMOS devices alone, and alternatives to the diodes of FIG. 37 may be used. BiCMOS processing may be used.

Packaging

FIG. 3 shows three views of the package preferably used to house the presently preferred embodiment. Note that this package includes pushbutton 302 on its topside.

It is more expensive to make an integrated circuit package with a pushbutton on its topside. However, this package is believed to provide substantial advantages, which are enough to outweigh its cost disadvantage.

The presently preferred embodiment uses a Ryton™ tub 310. This provides high-temperature durability. Pushbutton 302 includes a conductive portion on its underside, which contacts a contact wiring grid when the pushbutton is depressed. The pushbutton includes a deformable concave portion at its bottom, which provides a flexible elastic support to define the button's position.

The integrated circuit, in the presently preferred embodiment, is mounted directly on a circuit board. This circuit board is a simple "2-layer" board, i.e. a board which is wired on its top and bottom surfaces, but which does not contain interior layers of wiring.

Features

Some notable features of the Electronic Digital Rheostat of the presently preferred embodiment include the following.
Replaces Mechanical Variable Resistors
Available as the packaged complete unit of FIG. 3 or as an integrated circuit chip
Human engineered interface provides easy control
Optional electronic interface for digital as well as manual control
Wide differential input voltage range between 4.6 and 8 volts
Wiper position is maintained in the absence of power
Operational potentiometer version of DS1669 is available
Low cost alternative to manual controls
Applications include volume, tone, contrast, brightness, and dimmer controls

Control Section Features

Following is a brief summary of some of the features of the control organization of the presently preferred embodiment:
The initial setting, at power-up, is taken from the nonvolatile shadow memory.
An initial pushbutton contact closure causes 1 increment.
Continuous contact closure after 1 second causes additional increments at $\frac{1}{10}$ second intervals. Decrement from top to bottom will occur if contact closure is maintained after the controlled value has reached the top of its range.
Contact closure followed by a pause of greater than 1 second enables a change from increment mode to decrement mode (or from decrement mode to increment mode). Continuous contact closure after 1 second in the decrement mode causes additional decrements at $\frac{1}{10}$ second intervals. Increment from bottom to top will occur if contact closure is maintained.

Overall Description of Preferred IC Embodiment

The preferred embodiments include a digital rheostat or potentiometer which is adjusted to a desired value by a contact closure input. Alternatively, the desired setting can be achieved from a digital source input. When supplied as a 6 pin device, the contact closure is provided on the top of the package. In this configuration, $-V$ is connected to $R_L$ on the bottom side of the package, and $R_W$, $+V$, D and $R_H$ are single connections on the bottom side of the package. The 6 pin embodiment is a self contained substitute for rheostat and potentiometer applications. Any time the pushbutton on the top of the package is depressed the resistance setting between pins $-V$ and $R_W$ will increase or decrease provided that a potential of $+4.5$ V to $+8$ V exist between $-V$ and $+V$ inputs. The 8 pin packaged version can be used in a similar manner as the 6 pin version with $-V$ connected to $R_L$; $+V$ is connected to a positive source greater than $+4.5$ volts relative to $-V$, and a contact closure is between the inputs and $-V$. Under this condition, the wiper pin ($R_W$) provides a variable resistance relative to $-V$ and is increased or decreased based on a sequence of contact closures between UC, DC or D, and $-V$.

Both the 6 pin and 8 pin version can also be controlled by a digitral input which functions in parallel with a contact closure or instead of contact closure. In addition, the 8 pin version can be configured with and up/down two button arrangement.

Operation

The main elements of the preferred embodiment are shown on the block diagram of FIG. 1. The block diagram shows that the rheostat or variable resistor setting is determined by the value of a 64 to 1 multiplexer which is controlled by the input interpreter. The input interpreter takes a UC, DC, or D input, and sends control information to the multiplexer. The way the interpreter derives the control information is key to the operation. The dotted lines shown in the block diagram are included in one embodiment device and serve as a typical application example for the use of the DIP and SOIC embodiments. As shown, a pushbutton contact is between UC and $-V$ and pulls the inputs of an "OR" gate to the negative supply. Note that "D" assumes a logic high level when not connected. When the input of the OR gate is first connected low, the interpreter sends one pulse to the multiplexer which will either increment or decrement the rheostat wiper position $\frac{1}{64}$ of the total taper.

See flow diagram FIGS. 4 and 5. Increment or decrement determination is based on prior activity. A single input from contact closure of a duration of greater than 1 msec is sufficient to cause a wiper position change of 1/64 of total. Subsequent inputs will increment or decrement of 1/64 of total for each additional contact closure. However, if the contact input remains active for greater than 1 second, subsequent increments/decrements of 1/64 of total occur at intervals of 100 msec for as long as the input is active or until the top or bottom of the rheostat taper is reached. Anytime that input activity stops for a period of time greater than 1 second, the next action taken as a result of subsequent input activity will be reversed; i.e., if it was incrementing, it will decrement, and if decrement was the prior action, the next action taken will be increment. If input activity is maintained for a period of time such that the upper or lower limits of the rheostat are reached, successive action is in the opposite direction. Total time of movement from one end of the taper to the other requires 64×100 msec+1 second or 7.4 seconds. The 8 pin version can be configured for two button operation such that the DC input can be used for decrementing and the UC input is then used only for incrementing. Upon power up, the devcie will internally sense the impedance betgween the DC input and V+. For this reason, the DC input must be connected to +V when not is use. Otherwise, the pushbutton packaged version (FIGS. 3A, 3B and 3C) performs as described above with the contact input attached external to the device package. Connection between contacts inputs and −V of less than 10 Kohm is all that is required to be interpreted as activity. Alternatively, the D input acepts a low going signal of 0.8 volts maximum with respect to −V. The input pulse width must exceed 1 μsec to guarantee recognition. Successive input pulses can be any length apart provcided that they are not separated by more than 1 second. If the D input is held low for more than 1 second, incrementing/decrementing occurs automatically on 1/64 of total intevals. The flow chart for electronic control is shown in FIG. 4, as the D input acts the same as the UC input. When the 8 pin version is used, the rheostat low end and wiper may be connected to voltages sources other than −V or +V. The voltage applied to any rheostat element must not exceed −V−0.5 volts on the low end or +V+0.5 volts on the high end. If −V is connected to ground, then all other input voltages are referenced to ground.

Nonvolatile Wiper Settings

The wiper setting of the DALLASTAT is maintained in the absence of power in the shadow memory. During normal operation the position of wiper is determined by the multiplexer. The shadow memory is periodically updated by the multiplexer during normal operation. The manner in which an update occurs has been optimized for reliability, durability, and performance and is totally transparent to the user. When power is applied to the DALLASTAT, the wiper setting is set at the last value recorded in the shadow memory. On an initial power up for the first time, the wiper position may, therefore, be random. If the DALLASTAT setting is changed after power is applied, the new value will be stored in the shadow memory after a delay of about 2 seconds. The initial storing of a new value after power up always occurs when the first change is made regardless of when this change occurs after power up. After the initial change, subsequent changes in the DALLASTAT setting of less than 12.5% are not copied in the shadow memory. Since the DALLASTAT contains a 64 to 1 multiplexer, a change in the 3 LSB's is not copied into the shadow RAM except for change after power up. Changes greater than 12.5% or changes large enough to affect the 4 LSB or greater are always copied into the shadow memory. As on power up, the copy from the multiplexer to shadow memory allows for a 2 second delay to guarantee that the new setting changes are finalized, and all shadow updates are transparent to the user. On power down (loss of power) the shadow memory is not changed and retains the n-lost recent update resulting from a setting change. This value is used to set the DALLASTAT value on power up. The shadow memory is made with EEPROM type memory cells that will accept at least 80,000 value changes before wear out. If the EEPROM cells ever reach a wearout condition, the DALLASTAT will still continue to operate properly while power is applied, but will return to the last accepted value of the shadow memory on power up.

| Absolute Maximum Ratings | | | | | | |
|---|---|---|---|---|---|---|
| Voltage on any pin relative to −V: | | | −V−0.5 Volts to −V+8.0 Volts | | | |
| Operating Temperature Range: | | | −10° C. to 70° C. | | | |
| Storage Temperature Range | | ~ | −55° C. to 125° C. | | | |
| Soldering Temperature Range | | | 260° C. for 15 sec. | | | |
| Parameter | Symbol | Min | Typ | Max | Units | Notes |
| Recommended DC Operating Conditions (−10° to +70° C.) | | | | | | |
| +Supply Voltage | +V | −V+4.5 | | −V+8.0 | V | |
| −Supply Voltage | −V | +V−8.0 | | +V−4.5 | V | |
| Rheostat Inputs | $R_H, R_W, R_L$ | −V−0.5 | | +V+0.5 | V | |
| Logic Input 1 | $V_{IH}$ | +2.4 | | | V | 1,2 |
| Logic Input 0 | $V_{IL}$ | | | +8,0 | V | 1,2 |
| DC Electrical Characteristics (−10° to +70° C.; −V to +V = 4.5 V to 7.0 V) | | | | | | |
| +, − Supply Current | $Icc_1$ | | 1 | 2 | mA | 3 |
| Supply Current, idle | $Icc_2$ | | | 100 | nA | 9 |
| Wiper Resistance | $R_W$ | | 500 | 1000 | Ω | |
| Wiper Current | $I_W$ | | | 2 | mA | 5 |
| Rheostat Current | $I_W, I_L$ | | | 2 | mA | 5 |

-continued

| AC Electrical Characteristics (−10° to +70° C.; −V to +V = 4.5 V to 7.0 V) | | | | | | |
|---|---|---|---|---|---|---|
| Input Pulse Width | $t_{pw}$ | 1 | | DC | μS | 1,7,8 |
| Contact Pulse Width | $t_{cpw}$ | 1 | | DC | mS | 1,7,8 |
| Capacitance | $C_{in}$ | | 5 | 10 | pF | 6 |

Notes to Electrical Specification Tables

1) All inputs; UV, DC, and D are internally pulled up with a resistance of 100 Kohms
2) Input logic levels are referenced to −V
3) Icc is the internal current that flows between −V and +V.
4) Input leakage applies to contact inputs UC and DC and digital input (D).
5) Wiper current and rheostat currents are the maximum current which can flow in the resistive elements.
6) Capacitance values apply at 25° C.
7) Input pulse width is the minimum time required for an input to cause an increment or decrement. If the UC, DC, or D input is held active for longer than 1 second, subsequent increments or decrements will occur on 100 mS intervals until the inputs UC, DC, and/or D is released to $V_{IH}$.
8) Repetitive pulsed inputs on UC, DC, or D will be recognized as long as the pulse repetition occurs within 1 second of each other. Pulses occurring faster than 1 mS apart may not be recognized as individual inputs but can be interpreted as a constant input.
9) Idle state supply current is measured with no pushbutton depressed and with the wiper $R_W$ tied to a CMOS load.

Process Specification

Device Parameters

| Process Parameter | Nchannel related | Pchannel related |
|---|---|---|
| Low Voltage Device Parameters: | | |
| Well rho, ohm/sq | 1300 +/− 150 | 340 +/− 50 |
| Delta Width from drawn, um | 2.7 +/− 0.3 | 1.5 +/− 0.3 |
| Well rho, Kohm/sq (w/o field implant) | 4.2 +/− 0.5 | No data |
| Saturated Vt, Volts | 0.80 +/− 0.25 | 0.80 +/− 0.25 |
| Gate oxide cap, 1e-4 pF/um**2 (225 +/− 25 Angstroms) | 13.8 to 17.3 | 13.8 to 17.3 |
| High Voltage Device Parameters: | | |
| Well rho, ohm/sq | 1650 +/− 200 | No data |
| Delta Width from drawn, um | 1 9 +/− 0.3 | No data |
| Well rho, Kohm/sq (w/o field implant) | 4.9 +/− 1.1 | No data |
| Saturated Vt, Volts | 1.10 +/− 0.25 | 1.10 +/− 0.25 |
| Gate oxide cap, 1e-4 pF/um**2 (1000 +/− 50 Angstroms) | 3.29 to 3.63 | 3.29 to 3.63 |
| Parameters Common to both Low and High Voltage Devices: | | |
| Tunnel Gate oxide Capacitance, 1e-4, pF/um**2 (100 +/− 15 Angstroms) | 30.0 to 40.6 | 30.0 to 40.6 |
| Poly rho, ohm/sq | 30 +/− 6 | <100 (usually <50) |
| Poly/Field cap, 1e-4 pF/um**2 (3750 +/− 250 Angstroms) | 0.863 to 0.987 | 0.863 to 0.987 |
| Active sheet rho, ohm/sq | 63 +/− 5 | 82 +/− 5 |
| Tempco, ppm | 1700 +/− 50 | 1450 +/− 50 |
| Active Contact resistance (1.2 × 1.2 um contact) | <75 ohm/ct | <50 ohm/ct |
| Poly Contact resistance (1.2 × 1.2 um contact) | <25 ohm/ct | Not allowed |
| Metal rho, milliohm/sq | <40 milliohm/sq | |
| Metal/Act cap, 1e-4 pF/um**2 (5500 +/− 500 Angstroms) | 0.576 to 0.691 | 0.576 to 0.691 |
| Metal/Poly cap, 1e-4 pF/um**2 (5500 +/− 500 Angstroms) | 0.576 to 0.691 | 0.576 to 0.691 |
| Metal/Field cap, 1e-4 pF/um**2 (9250 +/− 750 Angstroms) | 0.345 to 0.406 | 0.345 to 0.406 |

Design Rules (Units in Microns)

PWELL (inside feature is Pwell; outside feature is N-substrate) or
NWELL (inside feature is Nwell; outside feature is P-substrate)
3.00μ LV width
10.00μ HV width
4.50μ LV width when used as a resistor without field implant
15.00μ HV width when used as a resistor without field implant
6.00μ LV space when wells are at different potentials
10.00μ HV space when wells are at different potentials 3.00μ space when wells are at same potential
ACTIVE (inside feature is N+, P+, or transistor; outside has field oxide)
1.20μ width
50.00μ maximum width simultaneously in two directions
2.00μ minimum transistor width
1.50μ minimum source/drain width (from poly to active edge)
3.20μ minimum width for combined low voltage N+ source/drain and P+ well/sub strap (from poly edge to active edge; this is allowed only if the N+ and P+ regions are shorted out by metal).
5.00μ minimum width for combined high voltage N+ source/drain and P+ well/sub strap (from poly edge to active edge; this is allowed only if the N+ and P+ regions are shorted out by metal).
3.20μ minimum width for combined low voltage P+ source/drain and N+ well/sub strap (from poly edge to active edge; this is allowed only if the N+ and P+ regions are shorted out by metal).
5.00μ minimum width for combined high voltage P+ source/drain and N+ well/sub strap (from poly edge to active edge; this is allowed only if the N+ and P+ regions are shorted out by metal).
2.00μ space (same doping type; low voltage active)
10.00μ space (same doping type; high voltage active)
20.00μ space (same doping type; low voltage active to high voltage active)
1.80μ N+ active space to P+ active, both low voltage active
5.00μ N+ active space to P+ active, both high voltage active
20.00μ N+ active space to P+ active, one low voltage active and one high voltage)
1.80μ N+ active space to P+ active if both are at same potential 0 or and both are low voltage active
5.00μ N+ active space to P+ active if both are at same potential 0 or and both are high voltage active
20.00μ N+ active space to P+ active if both are at same potential and are of different voltage types (low/high)
0.80μ LV: P+ active well strap enclosure by Pwell
2.50μ HV: P+ active well strap enclosure by Pwell
0.80μ LV: P+ active substrate strap space to Nwell
2.50μ HV: P+ active substrate strap space to Nwell
3.20μ LV: N+ active enclosure by Pwell
10.00μ HV: N+ active enclosure by Pwell
3.20μ LV: N+ active space to Nwell
10.00μ HV: N+ active space to Nwell
3.20μ LV: P+ active space to Pwell
10.00μ HV: P+ active space to Pwell
3.20μ LV: P+ active enclosure by Nwell
10.00μ HV: P+ active enclosure by Nwell
1.20μ LV: N+ active substrate strap space to Pwell
2.50μ HV: N+ active substrate strap space to Pwell
1.20μ LV: N+ active well strap enclosure by Nwell
2.50μ HV: N+ active well strap enclosure by Nwell
NB: active may NOT be split by the Thick GOX mask
NFNOT (inside feature does not receive the P-type implant to raise the N-channel thick field threshold voltage. This level should be drawn to insure that HV N+ active does not receive this implant. For drawn Pwells, mask 3 is created by the logical: Pwell ANDNOT Nfnot, before sizing and fracturing. For drawn Nwells, mask 3 is created by the logical: Nwell OR Nfnot, before sizing and fracturing.)
3.00μ width
3.00μ space
3.00μ enclosure of Pwell resistor (when a Pwell resistor is formed by removing the NF implant)
2.50μ enclosure of HV N+ active (HV N+ active MUST be enclosed by nfnot)
NB: the field region between HV N+ active geometries may NOT be enclosed by the nfnot mask; the implant mask geometry must be broken up and rules 3.2 and 3.5 must be obeyed.
PFNOT (inside feature does not receive the N-type implant to raise the P-channel thick field threshold voltage. This level should be drawn to insure that HV P+ active does not receive this implant. For drawn Pwells, mask 4 is created by the logical: Pwell OR Pfnot, before sizing and fracturing. For drawn Nwells, mask 4 is created by the logical: Nwell ANDNOT Pfnot, before sizing and fracturing.)
3.00μ width
3.00μ space
3.00μ enclosure of Nwell resistor (when a Nwell resistor is formed by removing the PF implant)
2.50μ enclosure of HV P+ active (HV P+ active MUST be enclosed by pfnot)
NB: the field region between HV P+ active geometries may NOT be enclosed by the pfnot mask.
NDEPLETION (inside feature receives an N-type implant to form an N-channel depletion transistor or a PNP bipolar transistor)
2.00μ width
2.00μ space Where Ndepletion is Used for MOS Transistors and Capacitors 1.00μ enclosure of transistor (the area defined by the intersection of poly and active: poly AND active)
1.80μ space to transistor (poly AND active) of different threshold type IN THE DIRECTION OF ACTIVE
2.70μ space to transistor (poly AND active) of different threshold type IN THE DIRECTION OF POLY
2.70μ space to unrelated active
NB: the field region between active geometries at different potentials may NOT be enclosed by the ndepletion mask.

Where Ndepletion is Used for PN Diodes and PNP Transistors 1.10μ ndepletion enclosure of n+ not mask
3.00μ n+ not enclosure of p+ (n+ not and p+ masks are not coincident in the base-emitter region of the bipolar structure; the space between them defines the "base" region of the bipolar transistor.)
PDEPLETION (inside feature receives a P-type implant to form an P-channel depletion transistor or an NPN bipolar transistor)
2.00μ width
2.00μ space Pdepletion Used for MOS Transistors and Capacitors 1.00μ enclosure of transistor (the area defined by the intersection of poly and active: poly AND active)
1.80μ space to transistor (poly AND active) of different threshold type IN THE DIRECTION OF ACTIVE
2.70μ space to transistor (poly AND active) of different threshold type IN THE DIRECTION OF POLY
2.70μ space to unrelated active
NB: The field region between active geometries at different potentials may NOT be enclosed by the pdepletion mask.

Pdepletion Used for PN Diodes and NPN Transistors 1.10μ pdepletion enclosure of the base region of the transistor 3.00μ n+ not separation from p+ (n+ not and p+ masks are not coincident in the base-emitter region of the bipolar structure; the space between them defines the "base" region of the bipolar transistor.)

NB: The n+ not and p+ geometries should be drawn as two "donuts". The outer edge of both donuts should coincide, and should enclose the active region (in which the n+/pdepletion diode resides). The inner hole of the n+ not donut defines the n+ emitter region. The innner hole of the p+ donut should enclose the inner hole of the n+_not donut, to form the base region. The pdepletion mask (which is NOT drawn as a donut) should then enclose the inner hole of the p+ donut.

HV PCH VT (inside feature receives a P-type implant to adjust the threshold voltage of the HV Pch transistor)

2.00μ width
2.00μ space
1.00μ enclosure of transistor (the area defined by the intersection of poly AND active. A HV Pch transistor must be enclosed by this mask in order to have a threshold voltage in the ~1 Volt range. Without this mask, the threshold voltage will be in the ~2 Volt range.)
1.40μ space to transistor (poly AND active) of different threshold type Thick GOX (inside feature has thicker gate oxide under poly-AND-active than the normal thin oxide transistors for high voltage use; this mask also turns normal low voltage well into high voltage well.)

2.00μ width
2.00μ space
10.00μ enclosure of high voltage active (high voltage active MUST be enclosed by the Thick GOX mask)
10.00μ space to low voltage active (low voltage active AND Thick Gox NOT allowed)
NB: active may NOT be split by Thick Gox
3.00μ enclosure by well
3.00μ space to well
10.00μ enclosure of well
NB: well may NOT be split by Thick Gox (ie., Thick Gox may NOT cross a well boundary)

Tunnel GOX (inside feature has tunnel gate oxide under poly-AND-active EEPROM programming use)

2.00μ width
2.00μ space
1.00μ enclosure of poly AND active
2.4μ² minimum intersection with poly AND active
1.80μ space to transistor (poly AND active) with different gate oxide thickness POLY (transistors, interconnect, and laser links; inside feature leaves polysilicon)

Gate and Interconnect Poly 1.20μ width (low voltage transistors)
10.00μ width (high voltage nch transistors)
5.00μ width (high voltage pch transistors)
50.00μ maximum width simultaneously in two directions
1.80μ space
1.20μ extension beyond active for LV active (overlap of field)
1.20μ extension beyond nfnot for HV active
1.20μ extension beyond pfnot for HV active
0.90μ space to unrelated LV active (preferred)
1.20μ space to unrelated nfnot for HV active (manditory)
1.20μ space to unrelated pfnot for HV active (manditory)
1.20μ space to related HV active (manditory)

Laser Link Poly 3.00μ width (min and max)
0.90μ tent beyond laserglass in the direction of poly
3.40μ space
8.50μ space between blast coordinates NMINUSNOT (inside feature does not receive the n-type implant that forms N− LDD areas for an n-channel transistor. This mask is not normally drawn; it is a copy of the PPLUS layer.)

1.70μ width
2.00μ space
0.80μ enclosure of P+ active
0.80μ space to N+ active
1.70μ enclosure of p-channel transistor (poly AND active) in the direction of active
1.70μ space to n-channel transistor (poly AND active) in the direction of active
1.50μ minimum P+ well/sub strap width defined by N− not mask and active edge
1.50μ minimum N+ well/sub strap width defined by N− not mask and active edge HV NPLUSNOT (inside feature does not receive the high dose n-type implant that forms N+ source/drains. This level defines an extended LDD region, ie., a region receiving the N− implant but not the N+ implant, on every HV Nch transistor. This level MUST be drawn; it is used in creating mask 9 [NPLUSNOT] with the logical: PPLUS OR HVNPLUSNOT. This level will not be used to create a 'standalone" mask.)

1.70μ width
2.00μ space
3.00μ enclosure of HV Nch transistor (poly AND active) IN THE DIRECTION OF ACTIVE (this defines the HV Nch LDD length)
1.00μ enclosure of HV Nch transistor (poly AND active) IN THE DIRECTION OF POLY
1.00μ space to LV N+ active
2.00μ space to P+/N+ not masks
1.70μ minimum N+ source/drain width defined by HV N+ not mask and active edge
2.00μ minimum N+ source/drain width defined by HV N+ not mask and the P+/N+ not masks NPLUSNOT (inside feature does not receive the n-type implant that forms N+ active areas and n-channel transistor source/drains. This mask is not normally drawn, but is created by the logical: PPLUS OR HVNPLUSNOT, before sizing and fracturing take place)

1.70μ width
2.00μ space
0.80μ enclosure of P+ active
0.80μ space to N+ active
1.70μ enclosure of p-channel transistor (poly AND active) in the direction of active
1.70μ space to LV n-channel transistor (poly AND active) in the direction of active
3.50μ space to HV n-channel transistor (poly AND active) in the direction of active
1.50μ minimum P+ well/sub strap width defined by N+ not mask and active edge
1.50μ minimum N+ well/sub strap width defined by N+ not mask and active edge PPLUS (inside feature receives the p-type implant that forms P+ active areas and p-channel transistor source/drains)

1.70μ width
2.00μ space
0.80μ enclosure of P+ active
0.80μ space to N+ active
1.70μ enclosure of p-channel transistor (poly AND active) in the direction of active 1.70μ space to LV n-channel transistor (poly AND active) in the direction of active
3.50μ space to HV n-channel transistor (poly AND active) in the direction of active
1.50μ minimum P+ well/sub strap width defined by P+ mask and active edge
1.50μ minimum N+ well/sub strap width defined by P+ mask and active edge
CONTACT (inside feature removes oxide down to active or poly)
1.20μ width (rain and max, except for split contact)
1.80μ space
NB: a single contact may not be used to strap poly and N+/P+ activeμ

Active Contacts 1.00μ enclosure by active
1.20μ space to LV poly for LV gates
1.20μ space to HV N+ not for HV gates
NB: contacts to active enclosed by HV N+ not NOT allowed
1.20μ P+ contact enclosure by P+ mask
1.20μ P+ contact enclosure by N+ not mask
1.20μ N+ contact space to P+ mask
1.20μ N+ contact space to N+ not mask Split Active Contacts (Active Contacts Split by the P+/N+ Not Masks)

1.20μ split contact width (min and max)
4.00μ split contact length (min and max)
2.00μ split contact length on either side of the P+/N+ not masks Poly Contacts 0.70μ enclosure by poly
1.00μ space to active
0.70μ space to P+/N+ not masks
masks)μ contacts to comp poly (poly enclosed by the P+/N+ not not allowed
NB: contacts to poly over active (gate oxide) not allowed
METAL (inside feature leaves metal)

Interconnect Metal 1.20μ width
25.00μ maximum width simultaneously in two directions
1.80μ space
0.70μ enclosure of contact Bond Pad Metal 110.00μ bond pad width
100.00μ bond pad space
40.00μ bond pad space to active
40.00μ bond pad space to poly
40.00μ bond pad space to unrelated metal
5.00μ bond pad enclosure by pwell, nf, and pfnot for laser fusable circuits (laser fusable circuits on an n-type substrate MUST have all bond pad metal enclosed by pwell, nf, and pfnot)
5.00μ bond pad enclosure by nwell, nfnot, and pf for laser fusable circuits (laser fusable circuits on a p-type substrate MUST have all bond pad metal enclosed by nwell, nfnot, and pf)
3.00μ bond pad enclosure by poly for laser fusable circuits (laser fusable circuits MUST have all bond pad metal enclosed by poly)
LASERGLASS (inside feature removes oxide over poly)
6.00μ width
3.50μ space
3.00μ enclosure of poly
9.00μ length in the direction of poly
4.50μ enclosure of blast coordinate in the direction of poly
2.40μ space to well (intersection of well and laser opening NOT ALLOWED)
2.20μ space to active (intersection of active and laser opening NOT ALLOWED)
2.00μ space to unrelated poly
2.40μ space to metal (intersection of metal and laser opening NOT ALLOWED, except metal bond pad)
5.00μ enclosure by metal bond pad
PASSIVATION (inside feature removes oxide down to metal)
10.00μ width
10.00μ space
5.00μ enclosure by metal bond pad Further Modifications and Variations It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Alternatively, to provide user feedback regarding the direction of change, the module can be provided with leads to which a system integrator can connect a small beepers. If this connection is selected, the potentiometer unit will drive these leads to produce two beeps when the direction of change is "up" and one beep when it is "down." With this connection, it is also possible to use a pattern of beeps to identify which control is under the user's finger.

Note that nearly all of the advantages of the presently preferred embodiment could be achieved by using a component with an integral lithium cell for battery operation. However, this would substantially increase the cost, and a driving parameter of many contemplated applications is the need for very low cost. This will permit large-volume use in consumer electronics markets, which are very cost sensitive. Moreover, the elimination of lithium batteries provides higher lifetime for the part, and may provide greater ruggedness.

In general, mechanical ruggedness is an advantage resulting from the disclosed innovations. A knob or dial normally requires a protrusion, which can be bumped into (and possibly damaged). Moreover, even a small rotary element requires a mechanical bearing of some sort, which may be vulnerable to impact.

An alternate embodiment uses a combination of manual increment/decrement setting as described with a direct write capability from a data bus. The bus is preferably a one-wire bus (see U.S. Pat. No. 4,982,371, which is hereby incorporated by reference), but may be provided over a conventional three-wire serial data bus instead. This imposes some additional cost, but provides the advantage that, in crowded situations such as a car or airplane cockpit, all available surfaces can be used for control functions. It is just as convenient for a driver to tap a certain spot on the steering column as to reach over and feel for the radio. The reason that radio controls are all located in a small area is for the convenience of the designers in routing them, and not for any other reason.

It should also be noted that the parameter controlled does not have to be "inherently" analog. An analog variable resistance is a convenient way of defining and sensing a control parameter. Many control operations can simply be implemented in analog domain. However, it should also be noted that at least some of the innovative ideas disclosed herein can also be adapted to digital control inputs. For example, if the switched digital resistor ladder is removed and replaced by a simple up/down counter, which can be read out over a one-wire digital bus, the user interface of the disclosed embodiments could still be retained. The difference would simply be in the convenience for the systems designer.

In the presently preferred embodiment, the pattern which signals a reversal of the incrementing direction is a single touch followed by a certain minimum duration. However, aleratively and less preferably, the innovative teachings set forth herein could be adapted to other signalling patterns (e.g. three equally spaced touches followed by a minimum silence period).

In one alternative embodiment, the first touch does not immediately cause the counter to increment or decrement: instead, the control logic waits to see whether further touches follow.

In some contexts it may be desirable to provide some user feedback to indicate the direction of change. Thus, some system embodiments may use two different LEDs to indicate the two directions of change; and some may use patterns of blinking a single LED; and some may use beeps of an audio output; but many systems will use none of these.

In the presently preferred embodiment, the direction of change, once reversed, remains the same until it is reversed again. However, an alternative embodiment, which may be preferable for some applications, defines a default direction of change, which the control will revert to after a long idle period.

In some systems it may be desirable to attach a discrete capacitor to the input of the potentiometer, to absorb voltage transients.

Some features of the disclosed component architecture could also, in principle, be adapted to a digital capacitor unit. However, the capacitor magnitudes available on chip are far too small for audio filtering, and this embodiment is far less useful than a potentiometer or variable resistor unit.

In the presently preferred embodiment, the direction of change is reversed when the adjusted value reaches one of the extrema of the range (preferably after a defined holding period at the extremum). However, the details of this feature can be modified if desired, e.g. by not reversing the increment/decrement direction as long as the user keeps his fingertip continuously on the button. Moreover, while this feature is believed to be advantageous in combination with the one-touch up/down control and the other disclosed features, this feature is not necessary to practice of the claimed invention.

Note that the disclosed architecture is also suitable for making an integrated audio amplifier. Low-end audio components commonly use an integrated circuit amplifier, and such an amplifier can be combined with the disclosed control architecture to produce a very compact amplifier.

Similarly, a complete tuner can be built in a single module, by combining an RF tuner chip with the disclosed control module architecture.

In fact, by combining three one-touch control modules (source-select, tuning, and volume), a complete low-end stereo receiver can be built very compactly.

In a further alternative (but less preferable) embodiment, it is also possible to combine control of more than one parameter in a single one-touch module as described. In this case, differently timed patterns of touches would be used to command transition to different control options.

The default setting, in applications such as chroma adjustment, is preferably half way between the two extrema. (Of course, other customized versions of this may be listed, with default settings which are, e.g., equal to the root mean square of the two extrema). In other embodiments, the default setting may be hard wired to be equal to one of the extrema.

In a further alternative version of the disclosed innovation, an audible beep may be provided (by driving an assigned pair of leads, which the system integrator can connect to drive a small speaker).

In a further alternative version of the disclosed innovation, the disclosed architecture is also applicable to a multiplexer switch which selects one of multiple inputs.

In a further alternative version of the disclosed innovation, the disclosed architecture is also applicable to a "smart" switch, which has added functionality such as timeouts.

Note that the disclosed innovations are believed to be particularly advantageous for volume adjustment in hearing aids, where space is at a premium.

The presently preferred embodiment described above uses EEPROM memory (using Fowler-Nordheim injection) as the nonvolatile shadow RAM. However, other memory technologies could be used for this, including FAMOS EEPROM, or memories using the hysteresis of ferroelectric or ferromagnetic materials.

In a further alternative, note that it may be advantageous to use use an all-NMOS configuration of switching transistors, to allow for voltage excursions above the digital power supply voltage. This is not done in the presently preferred embodiment, but may be advantageous in some applications.

Integrated Circuit Including Multilinear Resistor

One contemplated class of alternative embodiments uses a resistor string which is not strictly linear. Such an integrated circuit resistor string is not included in the presently preferred embodiment described above, but has been implemented as a simple programmable resistor integrated circuit.

It has long been well known that, due to the nonlinear response of the human ear to sound pressure levels, a linear potentiometer used as a volume control will appear very insensitive at one end of its range. The conventional approach to this has been to use "taper-wound" controls, where a change of (for example) 1 degree in the knob position will not produce the same linear increment in the resistance value near the low and high extremes. (In some cases, the design goal has been to produce roughly the same percentage change anywhere in the range for a given angular change.)

Thus, one might consider emulating a taper-wound pot, in a digital pot, by providing graded values for the resistors which are switched into a circuit. However, this approach is inherently not very compatible with digital integrated circuit layout techniques. It is easy to produce large numbers of essentially identical structures by a step and repeat technique at the design phase, but producing smoothly graded structures (especially serpentine structures, such as those used in the integrated circuit resistor strain of the presently preferred embodiment) is a more difficult design task.

Thus, this embodiment of the invention provides a multilinear resistor string in an integrated circuit potentiometer. This multilinear configuration provides some, but not all, of the advantages of a taper-wound pot. However, the advantage of this multilinear configuration is that it is compatible with the constraints of integrated circuit layout. Several tradeoffs can be made to implement this idea: First, in the presently preferred embodiment, a selection of 1 of 256 on a linear scale is converted to a selection of 1 of 100 on a bilinear scale, by changing the metal mask only, so that the higher increments in the 100-step scale select multiple ones of the as-laid-out resistors.

In a further alternative embodiment, different polysilicon shapes used to provide different incremental resistance values in the meander line can be mixed.

Where only a single resistor ladder is present on-chip, that ladder can be made relatively wide. Thus, the incremental resistance per stage can be changed over a wide range.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A digital controller, comprising:
   (a) memory control circuitry and at least one memory register, said memory control circuitry electrically coupled to said at least one memory register, said memory control circuitry controlling contents of said at least one memory register, said at least one memory register storing at least one control bit, said at least one memory register having at least one memory register input; and
   (b) an input node electrically coupled to said memory control circuitry and to said at least one memory register input of said at least one memory register, wherein said memory control circuitry in response to a first contact closure signal at said input node replaces a first pattern of said at least one control bit with
      (i) a second pattern of said at least one control bit provided by said at least one control bit when a time interval between said first contact closure signal and a second contact closure signal is greater than a first time interval, said second contact closure signal preceding said first contact closure signal; or
      (ii) a third pattern of said at least one control bit, said third pattern of said at least one control bit differing from said second pattern of said at least one control bit when said time interval between said first contact closure signal and said second contact closure signal is less than a second time interval, said second time interval is less than said first time interval.

2. The digital controller of claim 1, wherein said at least one memory register has at least one memory register output that is electrically coupled to a counter input of a counter, said counter counts at a variable rate, said at least one control bit controlling said variable rate at which said counter counts.

3. The digital controller of claim 2, wherein said third pattern of said at least one control bit causes said counter to increment once and said second pattern of said at least one control bit causes said counter to increment at least twice at a regular interval.

4. The digital controller of claim 1, wherein said first contact closure signal is a rising edge of a pulse created by a push-button input generated by a push-button device at said input node and said second contact closure signal corresponds to a falling edge of said pulse created by said push-button input generated by said push-button device at said input node, said push-button device having a push-button output node, said push-button output node is electrically coupled to said input node.

5. The digital controller of claim 1, wherein said first time interval is equal to a first time period plus 100 milliseconds and said second time interval is less than said first time period.

6. The digital controller of claim 5, wherein said first time period is approximately equal to one second.

7. The digital controller of claim 1, wherein said first contact closure signal is a first width of a pulse at said input node, said pulse generated by a push-button device, and said second contact closure signal is a second width of said pulse at said input node, said second width not equal to said first width, said push-button device having a first push-button output node, said first push-button output node is electrically coupled to said input node.

8. The digital controller of claim 1, further comprising a push-button device to generate said first contact closure signal and said second contact closure signal, said push-button device having a push-button output node, said push-button output node is electrically coupled to said input node, wherein said push-button device has a button and releasing said button causes a counter controlled by said at least one control bit to stop counting, and further wherein said at least one memory register has at least one memory register output, said counter having a counter input electrically coupled to said at least one memory register output.

9. The digital controller of claim 1, wherein
   said first contact closure signal and said second contact closure signal are generated by a first push-button device, said first push-button device having a first push-button output node, said first push-button output node is electrically coupled to said input node; and
   a third contact closure signal generated by a second push-button device having a second push-button output node, said second push-button output node is electrically coupled at a second input node, said second input node electrically coupled to said at least one memory register input of said at least one memory register and to said memory control circuitry, said memory control circuitry in response to said third contact closure signal at said second input node selectably replaces said first pattern of said at least one control bit with a fourth pattern of said at least one control bit when a third time interval between said third contact closure signal and a fourth contact closure signal is greater than a fourth time interval or replaces said first pattern of said at least one control bit with a fifth pattern of said at least one control bit when said third time interval between said third contact closure signal and said fourth contact closure signal is less than said fourth time interval, said fourth contact closure signal generated by said second push-button device, said fourth contact closure signal preceding said third contact closure signal.

10. The digital controller of claim 9, wherein said at least one memory register has at least one memory register output, said at least one memory register output of said at least one memory register is electrically coupled to a counter input of a counter, said counter counts at a variable rate, said at least one control bit controlling said variable rate at which said counter counts.

11. The digital controller of claim 10, wherein said counter increments or said counter decrements, said second pattern of said at least one control bit causes said counter to increment, said third pattern of said at least one control bit causes said counter to increment, said fourth pattern of said at least one control bit causes said counter to decrement, said fifth pattern of said at least one control bit causes said counter to decrement.

12. The digital controller of claim 9, wherein said at least one memory register has at least one memory register output, said at least one memory register output of said at least one memory register is electrically coupled to a counter input of a counter, said counter counts at a variable rate and in an alterable direction, said alterable direction selected from the group consisting of incrementing said counter or decrementing said counter, and said at least one control bit controlling said variable rate at which said counter counts and in said alterable direction.

13. The digital controller of claim 12, wherein said second pattern of said at least one control bit causes said counter to increment at a first rate;

said third pattern of said at least one control bit causes said counter to increment at a second rate;

said fourth pattern of said at least one control bit corresponds causes said counter to decrement at said first rate; and said fifth pattern of said at least one control bit causes said counter to decrement at said second rate.

14. The digital controller of claim 9, wherein said third time interval is equal to said first time interval and said fourth time interval is equal to said second time interval.

15. The digital controller of claim 9, wherein said third time interval is approximately 1 second and said fourth time interval is also approximately equal to one second, said third time interval and said fourth time interval are measured at different times.

16. The digital controller of claim 1, further comprising a counter having a counter output;

a power source having a power node;

an audio system having a audio input node and an audio output;

a variable resistor having a resistance, said variable resistor having a node electrically coupled to said counter output, said variable resistor electrically coupled between said power node of said power source and said audio input node of said audio system;

and wherein said at least one control bit controls said counter that varies said resistance of said variable resistor electrically coupled between said power source and said audio system to control audio of said audio output of said audio system.

17. The digital controller of claim 1, further comprising a counter having a counter output;

a power source having a power node;

a light source having an adjust input node, said light source emits light;

a variable resistor having a resistance, said variable resistor having a node electrically coupled to said counter output, said variable resistor electrically coupled between said power node of said power source and said adjust input node of said light source;

and wherein said at least one control bit controls said counter that varies said resistance of said variable resistor electrically coupled between said power source and said adjust input node to control brightness of said light emitted from said light source.

18. The digital controller of claim 1, wherein said at least one memory register has at least one memory register output, said at least one memory register output of said at least one memory register is electrically coupled to a counter input of a counter, said counter counts at a variable rate, said at least one control bit controlling said variable rate at which said counter counts, further wherein said first pattern of said at least one control bit corresponds to an idle state of said counter.

19. The digital controller of claim 1, wherein said at least one memory register has at least one memory register output, said at least one memory register output of said at least one memory register is electrically coupled to a counter input of a counter, said counter counts at a variable rate and in an alterable direction, said alterable direction selected from the group consisting of incrementing said counter or decrementing said counter, and said at least one control bit controlling said variable rate at which said counter counts and in said alterable direction.

20. The digital controller of claim 19, wherein said second pattern of said at least one control bit causes said counter to increment at a first rate, and said third pattern of said at least one control bit causes said counter to increment at a second rate.

21. The digital controller of claim 1, wherein said memory control circuitry in response to a third contact closure signal at said input node selectably replaces said first pattern of said at least one control bit with a fourth pattern of said at least one control bit when a third time interval between said third contact closure signal and a fourth contact closure signal is greater than a fourth time interval and when said fourth contact closure signal follows said first contact closure signal by a time greater than a fifth time interval; and said memory control circuitry in response to a third contact closure signal at said input node selectably replaces said first pattern of said at least one control bit with a fifth pattern of said at least one control bit when said third time interval between said third contact closure signal and said fourth contact closure signal is less than said fourth time interval and when said fourth contact closure signal follows said first contact closure signal by said time greater than said fifth time interval.

22. The digital controller of claim 1, wherein said first contact closure signal and said second contact closure signal are generated by a push-button device, said push-button device having a push-button output node, said push-button output node is electrically coupled to said input node.

23. The digital controller of claim 1, wherein said memory register has at least one memory register output that is electrically coupled to a counter input of a counter, said at least one control bit controlling an operation of said counter.

24. The digital controller of claim 23, wherein said operation is selected from the group consisting of a rate and a direction.

25. The digital controller of claim 1, wherein (a) and (b) are integrated on a single semiconductor substrate.

* * * * *